(12) United States Patent
Kim et al.

(10) Patent No.: US 11,912,916 B2
(45) Date of Patent: Feb. 27, 2024

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hyun Kim, Gyeonggi-do (KR); Ji-Song Jun, Gyeonggi-do (KR); Jeong-Hwan Jeon, Gyeonggi-do (KR); Yeon-Gun Lee, Gyeonggi-do (KR); Seon-Jin Hwang, Gyeonggi-do (KR); Young-Jun Cho, Gyeonggi-do (KR)

(73) Assignee: Rohm and Haas Electronic Materials Korea Ltd. (KR)

( * ) Notice: Subject to any disclaimer, the term of this patent is extended or adjusted under 35 U.S.C. 154(b) by 660 days.

(21) Appl. No.: 17/251,737

(22) PCT Filed: Jul. 1, 2019

(86) PCT No.: PCT/KR2019/007960
§ 371 (c)(1),
(2) Date: Dec. 11, 2020

(87) PCT Pub. No.: WO2020/009392
PCT Pub. Date: Jan. 9, 2020

(65) Prior Publication Data
US 2021/0363419 A1 Nov. 25, 2021

(30) Foreign Application Priority Data
Jul. 2, 2018 (KR) ........................ 10-2018-0076640

(51) Int. Cl.
*H10K 85/30* (2023.01)
*C09K 11/06* (2006.01)
*H10K 50/00* (2023.01)

(52) U.S. Cl.
CPC ............ *C09K 11/06* (2013.01); *H10K 85/342* (2023.02); *C09K 2211/185* (2013.01); *H10K 50/00* (2023.02)

(58) Field of Classification Search
CPC . C09K 11/06; C09K 2211/185; H10K 85/342
See application file for complete search history.

(56) References Cited

U.S. PATENT DOCUMENTS 10,381,578 B2   8/2019   Rai et al.
10,622,571 B2   4/2020   Li et al.
(Continued)

FOREIGN PATENT DOCUMENTS

| CN | 105541921 A | 5/2016 |
| CN | 107501333 A | 12/2017 |
| KR | 20020042763 A | 6/2002 |

OTHER PUBLICATIONS

PCT International Search Report for Application No. PCT/KR2019/007960; Han, Inho, Authorized Officer; ISA/KR; dated Sep. 23, 2019.

*Primary Examiner* — Sean M DeGuire
(74) *Attorney, Agent, or Firm* — G. Creston Campbell

(57) ABSTRACT

The present disclosure relates to an organic electroluminescent compound represented by formula 1 and an organic electroluminescent device comprising the same. By comprising the organic electroluminescent compound of the present disclosure, it is possible to provide an organic electroluminescent device having lower operating voltage, (Continued)

higher luminous efficiency and/or longer lifespan properties as compared with a conventional organic electroluminescent device.

9 Claims, 1 Drawing Sheet

(56) References Cited

U.S. PATENT DOCUMENTS

2016/0308146 A1* 10/2016 Parham .................. C09K 11/06
2018/0053904 A1    2/2018 Li et al.

* cited by examiner

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound and an organic electroluminescent device comprising the same.

BACKGROUND ART

An electroluminescent (EL) device is a self-light-emitting device which has advantages in that it provides a wider viewing angle, a greater contrast ratio, and a faster response time. An organic EL device was first developed by Eastman Kodak in 1987, by using small aromatic diamine molecules and aluminum complexes as materials for forming a light-emitting layer [Appl. Phys. Lett. 51, 913, 1987].

An organic electroluminescent device (OLED) changes electric energy into light by applying electricity to an organic electroluminescent material, and commonly comprises an anode, a cathode, and an organic layer formed between the two electrodes. The organic layer of the OLED may comprise a hole injection layer, a hole transport layer, a hole auxiliary layer, a light-emitting auxiliary layer, an electron blocking layer, a light-emitting layer, an electron buffer layer, a hole blocking layer, an electron transport layer, an electron injection layer, etc., if necessary. The materials used in the organic layer can be classified into a hole injection material, a hole transport material, a hole auxiliary material, a light-emitting auxiliary material, an electron blocking material, a light-emitting material (containing host and dopant materials), an electron buffer material, a hole blocking material, an electron transport material, an electron injection material, etc., depending on their functions. In the OLED, holes from the anode and electrons from the cathode are injected into a light-emitting layer by the application of electric voltage, and excitons having high energy are produced by the recombination of the holes and electrons. The organic light-emitting compound moves into an excited state by the energy and emits light from an energy when the organic light-emitting compound returns to the ground state from the excited state.

The most important factor determining luminous efficiency in an OLED is light-emitting materials. The light-emitting materials are required to have the following features: high quantum efficiency, high mobility of an electron and a hole, and uniformity and stability of the formed light-emitting material layer. The light-emitting material is classified into blue, green, and red light-emitting materials according to the light-emitting color, and further includes yellow or orange light-emitting materials. Furthermore, the light-emitting material is classified into a host material and a dopant material in a functional aspect. A device having excellent EL characteristics generally has a structure including a light-emitting layer made by doping a host with a dopant.

Until now, Iridium(III) complexes have been widely known as dopants of phosphorescent light-emitting materials, including bis(2-(2'-benzothienyl)-pyridinato-N,C-3') iridium(acetylacetonate) [(acac)Ir(btp)$_2$], tris(2-phenylpyridine)iridium [Ir(ppy)$_3$] and bis(4,6-difluorophenylpyridinato-N,C2)picolinate iridium (Firpic), etc., as red-, green-, and blue-emitting materials, respectively. However, the development for improving the performance of OLED devices is still required.

DISCLOSURE OF INVENTION

Technical Problem

The objective of the present disclosure is to provide an organic electroluminescent compound effective for producing an organic electroluminescent device having low operating voltage, high luminous efficiency and/or long lifespan properties.

Solution to Problem

As a result of intensive studies to solve the technical problem above, the present inventors found that the above objective can be achieved by an organic electroluminescent compound represented by the following formula 1:

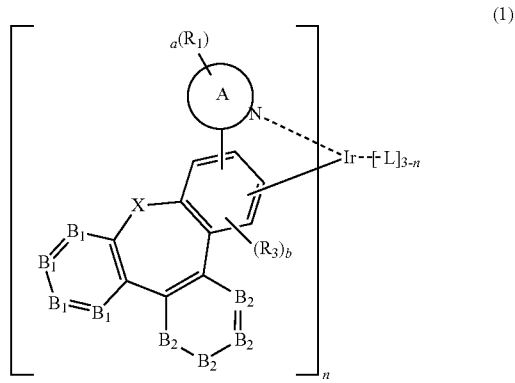

(1)

wherein
ring A represents a N-containing (3- to 10-membered) heteroaryl;
B$_1$ and B$_2$, each independently, represent CR$_2$ or N, where each of B$_1$ and each of B$_2$ may be the same or different;
X represents O or S;
L represents any one selected from the following formulas 2-1 and 2-2;

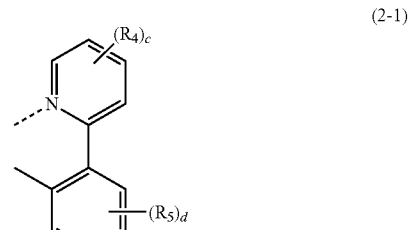

(2-1)

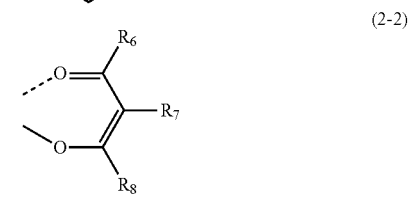

(2-2)

R$_1$ to R$_8$, each independently, represent hydrogen, deuterium, a substituted or unsubstituted (C1-C30)alkyl, a substituted or unsubstituted (C1-C30)alkoxy, a substituted or unsubstituted (C2-C30)alkenyl, a substituted or unsubstituted (C2-C30)alkynyl, a substituted or unsubstituted (C6-C30)aryl(C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

n represents an integer of 1 to 3;

a represents an integer of 1 to 6; b represents an integer of 1 or 2; and c and d, each independently, represent an integer of 1 to 4; where if a to d, each independently, are an integer of 2 or more, each of $R_1$, each of $R_3$, each of $R_4$, and each of $R_5$ may be the same or different.

Advantageous Effects of Invention

The organic electroluminescent compound according to the present disclosure can provide an organic electroluminescent device having low operating voltage, high luminous efficiency and/or long lifespan properties.

MODE FOR THE INVENTION

Figure 1:
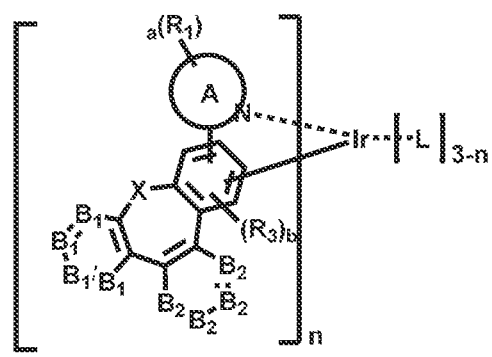
FIG. 1 illustrates a representative formula of the organic electroluminescent compound according to the present disclosure.

Hereinafter, the present disclosure will be described in detail. However, the following description is intended to explain the disclosure, and is not meant in any way to restrict the scope of the disclosure.

The term "organic electroluminescent compound" in the present disclosure means a compound that may be used in an organic electroluminescent device, and may be comprised in any layer constituting an organic electroluminescent device, as necessary.

The term "organic electroluminescent material" in the present disclosure means a material that may be used in an organic electroluminescent device, and may comprise at least one compound. The organic electroluminescent material may be comprised in any layer constituting an organic electroluminescent device, as necessary. For example, the organic electroluminescent material may be a hole injection material, a hole transport material, a hole auxiliary material, a light-emitting auxiliary material, an electron blocking material, a light-emitting material (containing host and dopant materials), an electron buffer material, a hole blocking material, an electron transport material, an electron injection material, etc.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, iso-propyl, n-butyl, isobutyl, sec-butyl, tert-butyl, n-pentyl, tert-pentyl, neopentyl, isopentyl, seo-pentyl, 3-pentyl, etc. The term "(C3-C30) cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30)aryl" is meant to be a monocyclic or fused ring radical derived from an aromatic hydrocarbon having 6 to 30 ring backbone carbon atoms, in which the number of the ring backbone carbon atoms is preferably 6 to 25, more preferably 6 to 18. The above aryl may be partially saturated, and may comprise a spiro structure. The above aryl may include phenyl, biphenyl, terphenyl, naphthyl, binaphthyl, phenyinaphthyl, naphthylphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, etc. The term "(3- to 30-membered)heteroaryl" is meant to be an aryl group having 3 to 30 ring backbone atoms, and including at least one, preferably 1 to 4 heteroatoms selected from the group consisting of B, N, O, S, Si, and P. The above heteroaryl may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, cinnolinyl, quinazolinyl, quinoxalinyl, naphthyridinyl, carbazolyl, benzocarbazolyl, dibenzocarbazolyl, phenoxazinyl, phenothiazinyl, phenanthridinyl, benzodioxolyl, dihydroacridinyl, etc. "Halogen" includes F, Cl, Br, and I.

Herein, "substituted" in the expression "substituted or unsubstituted" means that a hydrogen atom in a certain functional group is replaced with another atom or another functional group, i.e., a substituent. In the present disclosure, the substituents of the substituted alkyl, the substituted alkoxy, the substituted alkenyl, the substituted alkynyl, the substituted arylalkyl, the substituted aryl, the substituted heteroaryl, the substituted cycloalkyl, the substituted trialkylsilyl, the substituted dialkylarylsilyl, the substituted alkyldiarylsilyl, the substituted triarylsilyl, the substituted mono- or di-alkylamino, the substituted mono- or di-arylamino, and the substituted alkylarylamino, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino unsubstituted or substituted with a (C1-C30)alkyl(s); a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl. For example, the substituents may be at least one deuterium.

Herein, the heteroaryl, each independently, may contain at least one heteroatom selected from B, N, O, S, Si, and P. Also, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

Hereinafter, the compound represented by formula 1 will be described in more detail.

In formula 1, ring A represents a N-containing (3- to 10-membered)heteroaryl. According to one embodiment of the present disclosure, ring A represents a (5- to 10-membered)heteroaryl containing at least one nitrogen atom. According to another embodiment of the present disclosure, ring A represents a 6- or 10-membered heteroaryl containing one nitrogen atom. Specifically, ring A may be an imidazolyl, a thiadiazolyl, a triazolyl, a pyrazolyl, a pyridyl, a quinolyl, or an isoquinolyl. For example, ring A may be a pyridyl, a quinolyl or an isoquinolyl.

In formula 1, $B_1$ and $B_2$, each independently, represent $CR_2$ or N, where each of $B_1$ and each of $B_2$ may be the same or different. According to one embodiment of the present disclosure. $B_1$ and $B_2$, each independently, represent $CR_2$, where each of $B_1$ and each of $B_2$ may be the same or different.

In formula 1, X represents O or S; and n represents an integer of 1 to 3.

In formula 1, L represents any one selected from the following formulas 2-1 and 2-2. According to one embodiment of the present disclosure, where L represents the following formula 2-1, n may be an integer of 1, and where L represents the following formula 2-2, n may be an integer of 2.

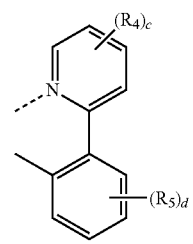

(2-1)

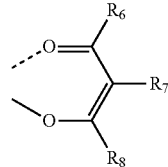

(2-2)

$R_1$ to $R_8$, each independently, represent hydrogen, deuterium, a substituted or unsubstituted (C1-C30)alkyl, a substituted or unsubstituted (C1-C30)alkoxy, a substituted or unsubstituted (C2-C30)alkenyl, a substituted or unsubstituted (C2-C30)alkynyl, a substituted or unsubstituted (C6-C30)aryl(C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino. According to one embodiment of the present disclosure. $R_1$ to $R_8$, each independently, represent hydrogen, deuterium, or a substituted or unsubstituted (C1-C20)alkyl. According to another embodiment of the present disclosure, $R_1$ to $R_8$, each independently, represent hydrogen, deuterium, or a (C1-C10)alkyl unsubstituted or substituted with at least one deuterium. $R_6$ and $R_8$ may be the same or different. According to one embodiment of the present disclosure, $R_6$ and $R_8$ may be the same. Specifically, $R_1$ to $R_8$, each independently, represent hydrogen; deuterium; a methyl unsubstituted or substituted with at least one deuterium; an ethyl unsubstituted or substituted with at least one deuterium; an isopropyl unsubstituted or substituted with at least one deuterium; an isobutyl unsubstituted or substituted with at least one deuterium; a tert-butyl unsubstituted or substituted with at least one deuterium; a neopentyl unsubstituted or substituted with at least one deuterium; a 3-pentyl unsubstituted or substituted with at least one deuterium, etc. For example, $R_1$ may represent hydrogen, a methyl unsubstituted or substituted with at least one deuterium, an ethyl unsubstituted or substituted with at least one deuterium, an isopropyl unsubstituted or substituted with at least one deuterium, an isobutyl unsubstituted or substituted with at least one deuterium, a tert-butyl unsubstituted or substituted with at least one deuterium, or a neopentyl unsubstituted or substituted with at least one deuterium; $R_2$ may represent hydrogen or a methyl; $R_3$ may represent hydrogen; $R_4$ may represent hydrogen, a methyl unsubstituted or substituted with at least one deuterium, an isopropyl, an isobutyl, a tert-butyl, or a neopentyl; $R_5$ may represent hydrogen, or a methyl unsubstituted or substituted with at least one deuterium; $R_6$ and $R_8$, each independently, may represent a methyl, an isobutyl, or a 3-pentyl, and may be the same as or different from each other; and $R_7$ may represent hydrogen.

The formula 2-1 may be any one selected from the group consisting of the following, but is not limited thereto.
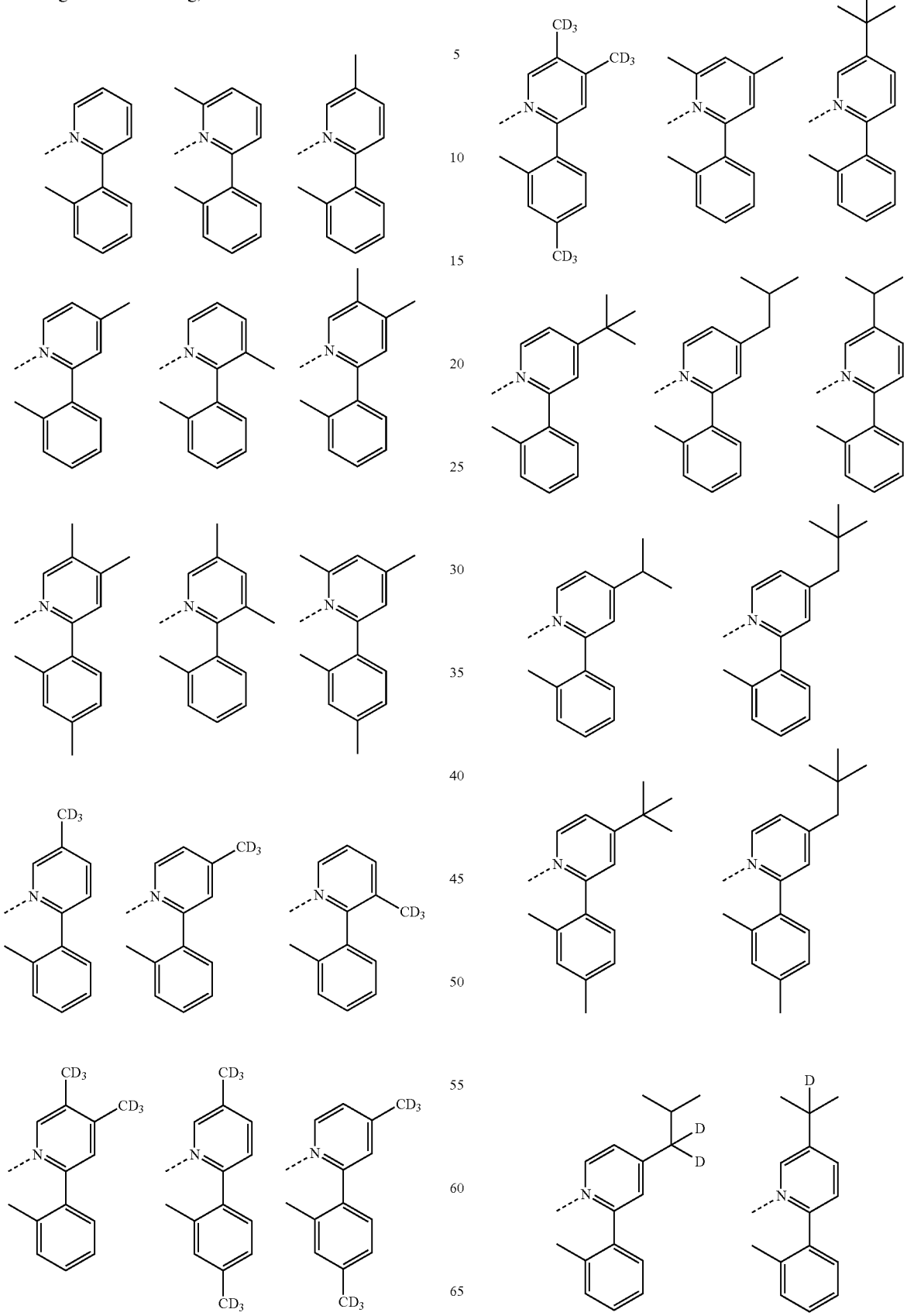

-continued

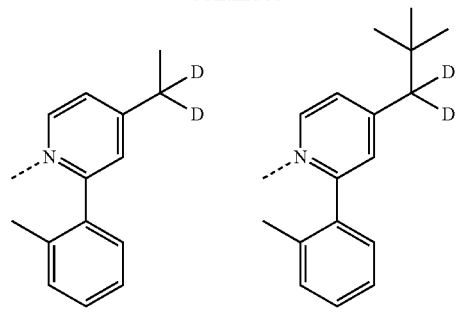

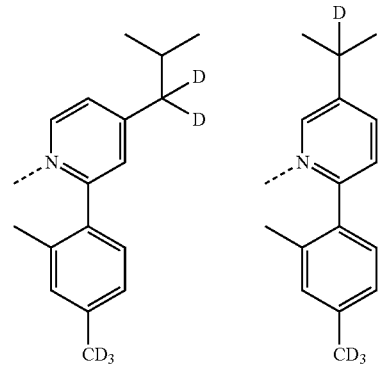

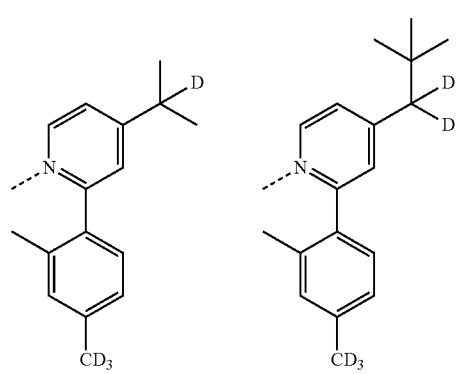

The formula 2-2 may be any one selected from the group consisting of the following, but is not limited thereto.

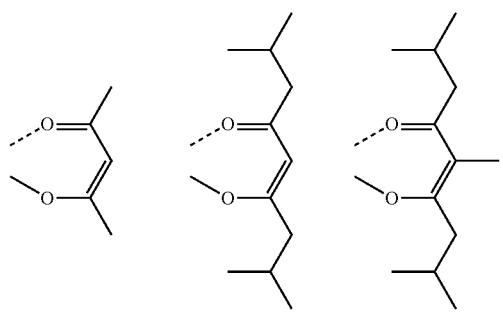

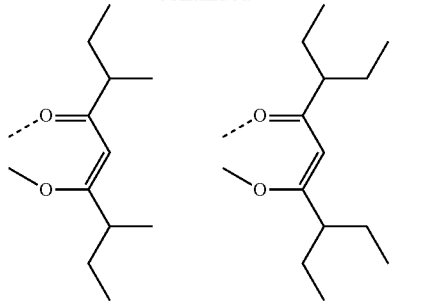

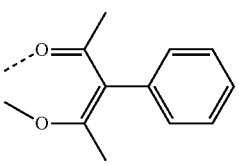

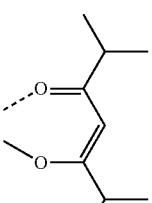

In the formulas above, a represents an integer of 1 to 6, b represents an integer of 1 or 2, c and d, each independently, represent an integer of 1 to 4; where if a to d, each independently, are an integer of 2 or more, each of $R_1$, each of $R_3$, each of $R_4$, and each of $R_5$ may be the same or different. According to one embodiment of the present disclosure, a represents an integer of 1 to 3; c represents an integer of 1 or 2; and b and d, each independently, represent an integer of 1.

According to one embodiment of the present disclosure, the formula 1 is represented by any one of the following formulas 3 and 4.

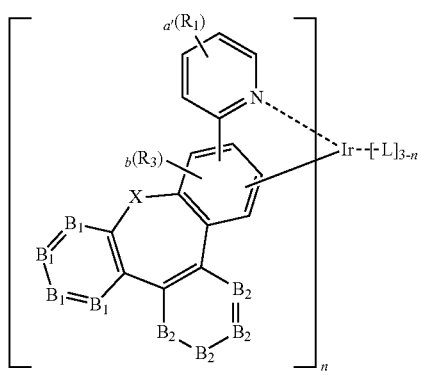

(3)

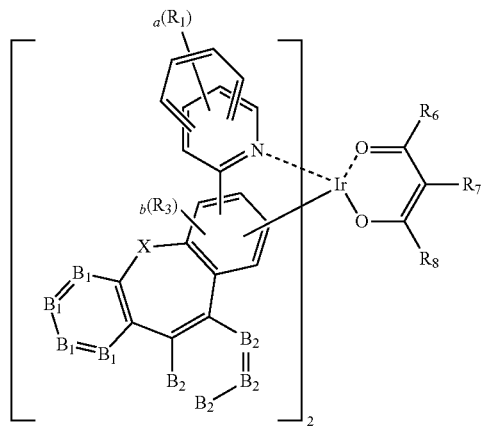

(6)

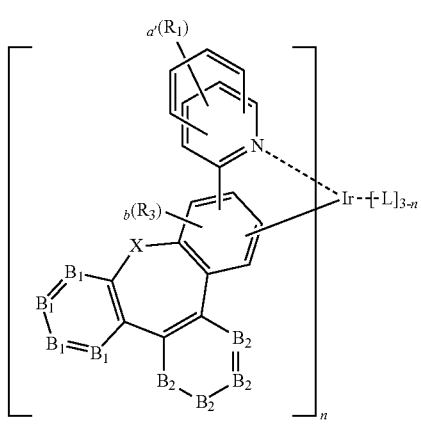

(4)

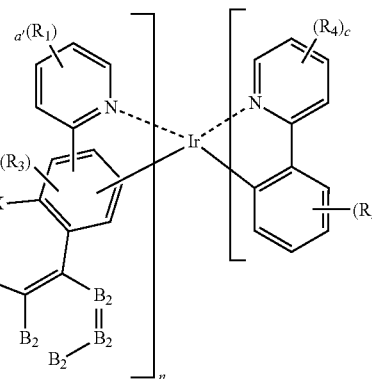

(7)

In formulas 3 and 4, $B_1$, $B_2$, X, L, $R_1$, $R_3$, n, a and b, each respectively, are as defined in formula 1; and a' represents an integer of 1 to 4; where if a' is an integer of 2 or more, each of $R_1$ may be the same or different.

According to another embodiment of the present disclosure, the formula 1 is represented by any one of the following formulas 5 to 8.

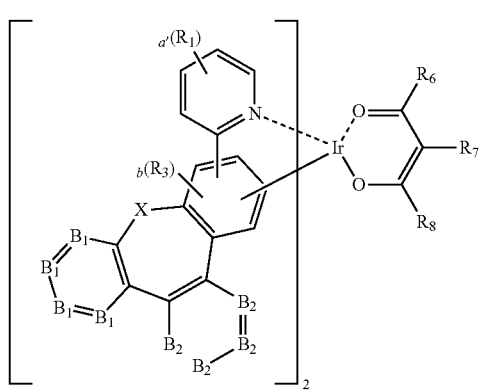

(5)

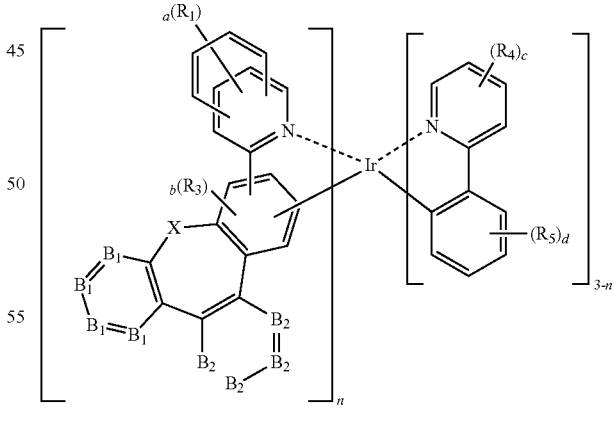

(8)

In formulas 5 to 8, n represents an integer of 1 or 3; $B_1$, $B_2$, X, $R_1$, $R_3$ to $R_8$, and a to d are each as defined in formula 1, formula 2-1 or formula 2-2; and a' represents an integer of 1 to 4; where if a' is an integer of 2 or more, each of $R_1$ may be the same or different.

The compound represented by formula 1 includes the following compounds, but is not limited thereto.

D-1
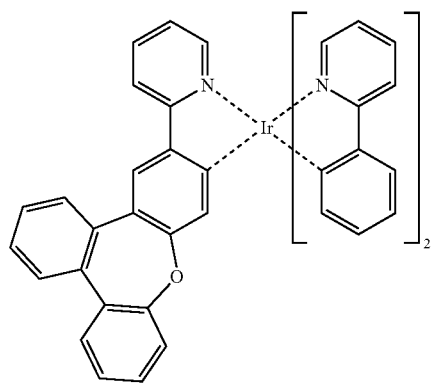
D-2
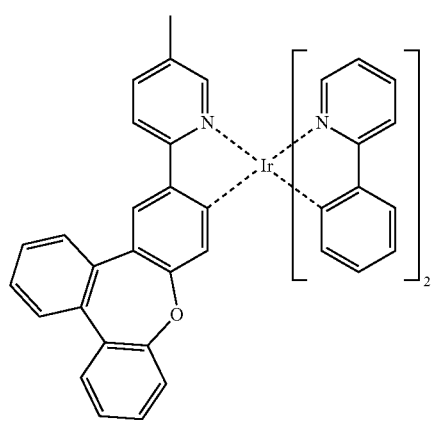
D-3
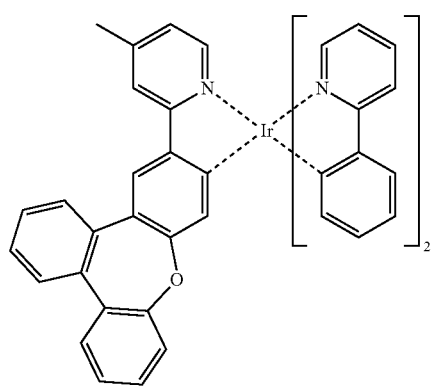
D-4
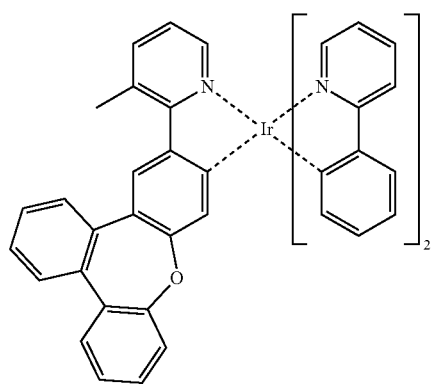
-continued
D-5
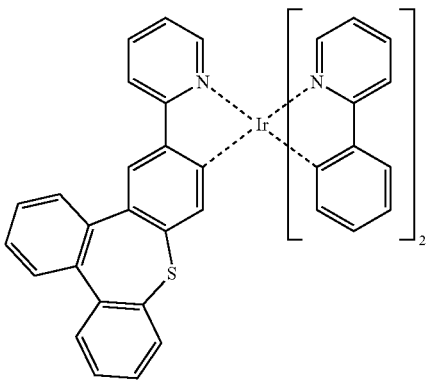
D-6
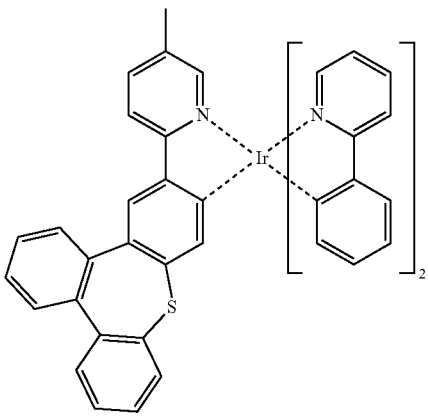
D-7
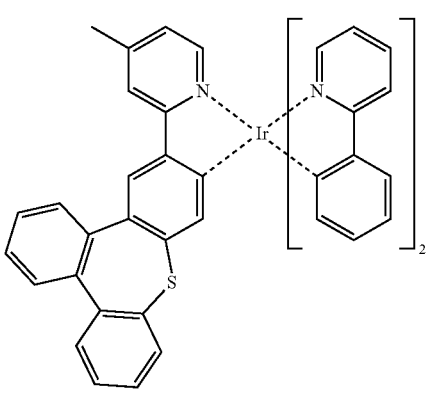
D-8
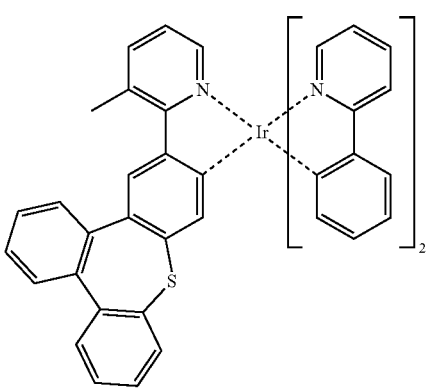

D-9
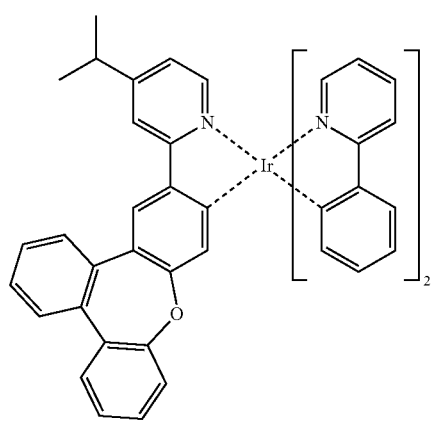
D-10
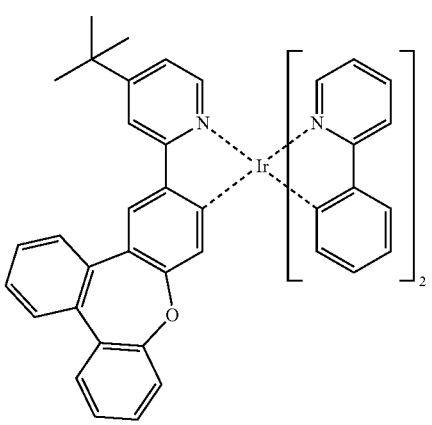
D-11
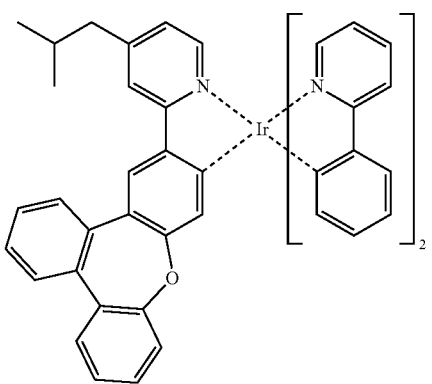
D-12
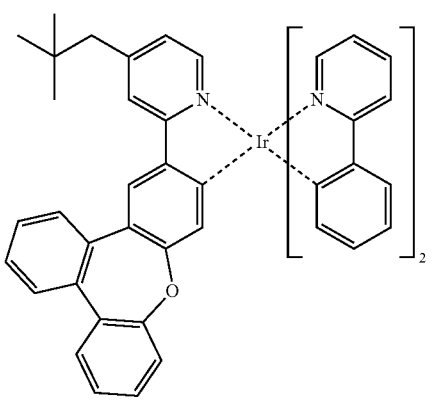
D-13
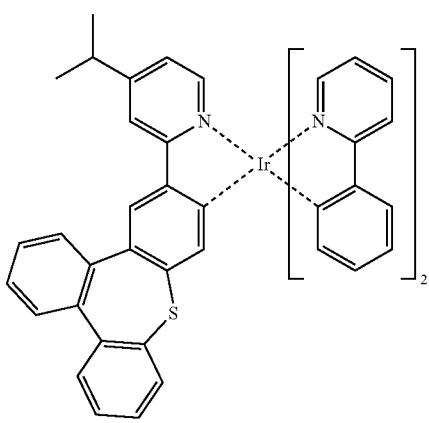
D-14
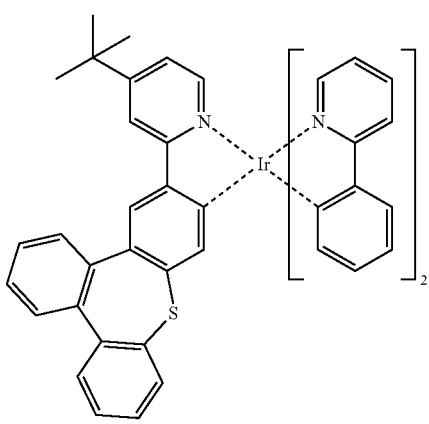
D-15
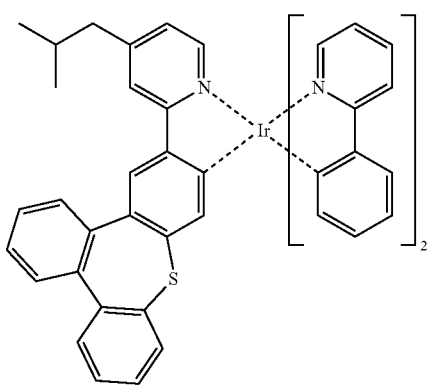
D-16
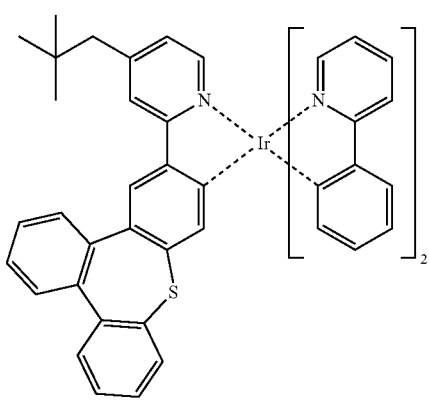

D-17
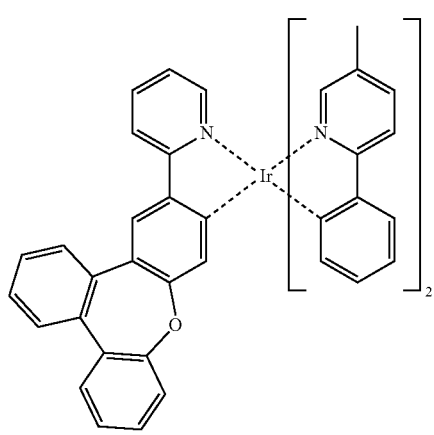
D-18
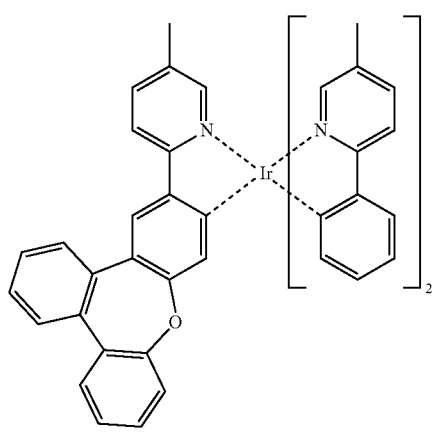
D-20
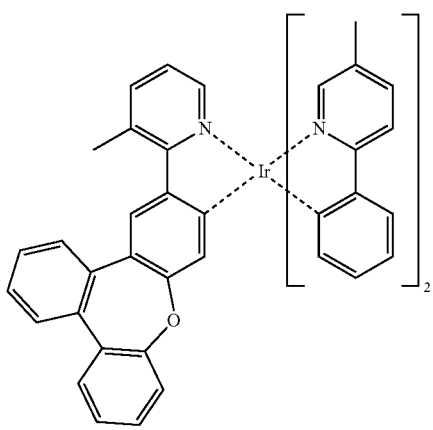
D-21
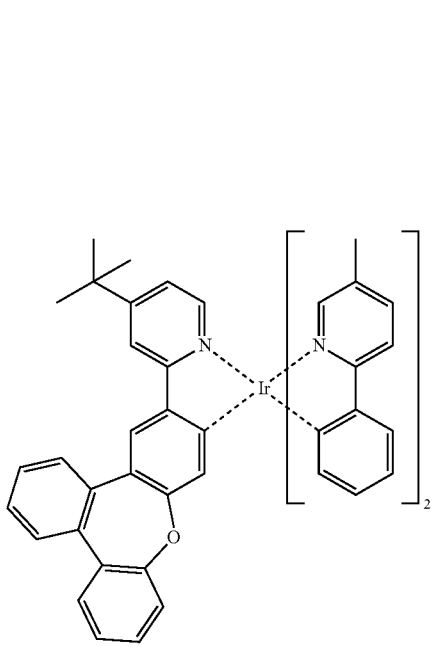
D-19
D-22
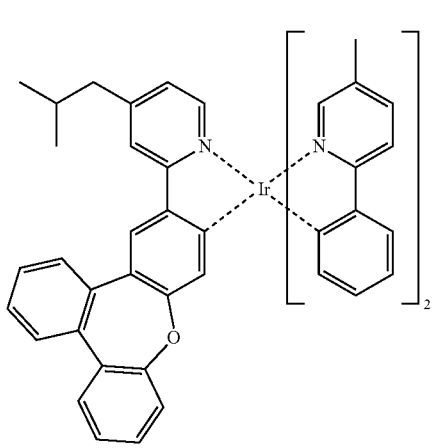

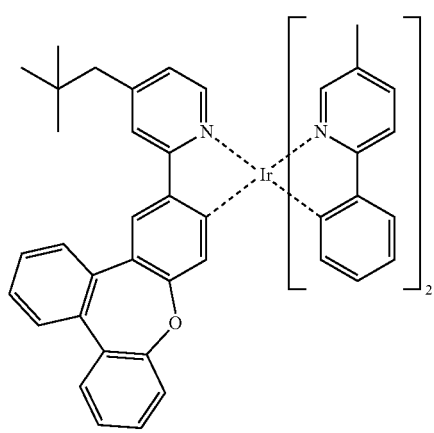
D-23
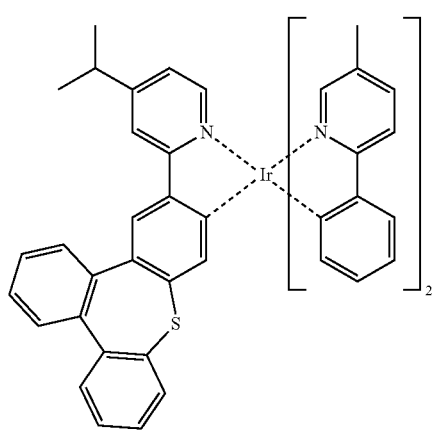
D-24
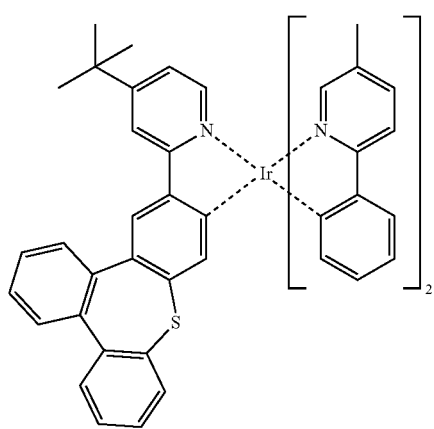
D-25
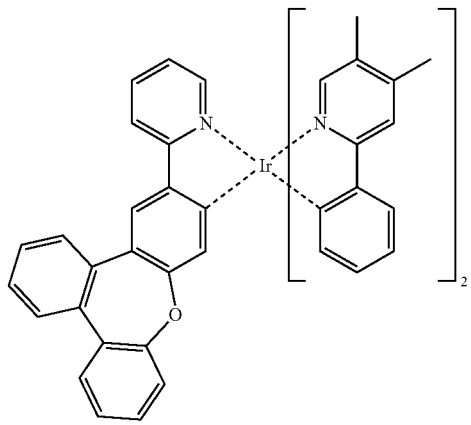
D-26
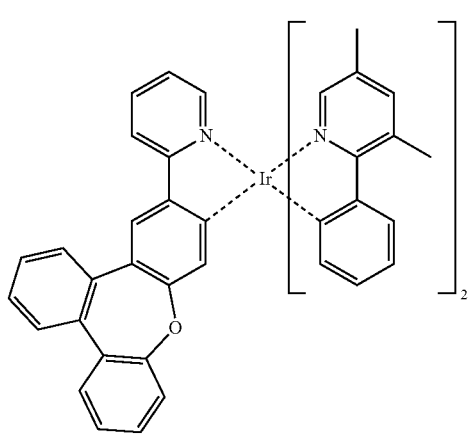
D-27
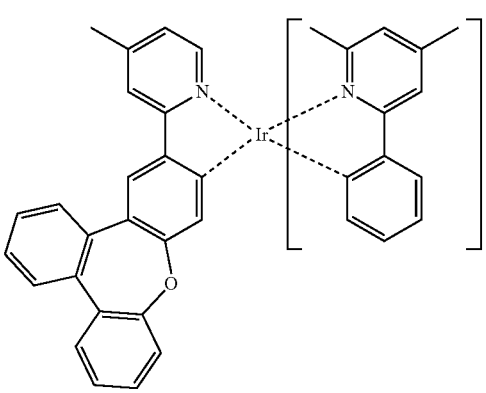
D-28
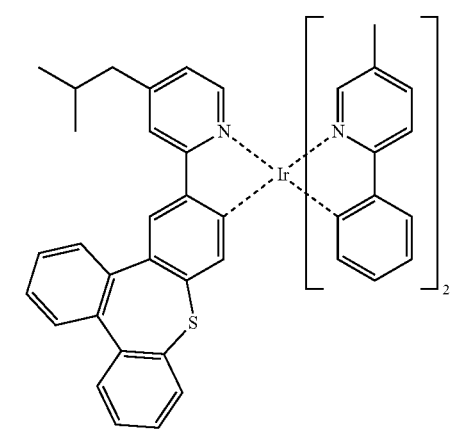
D-29

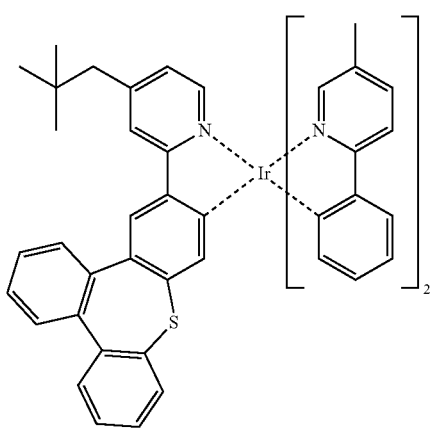
D-30
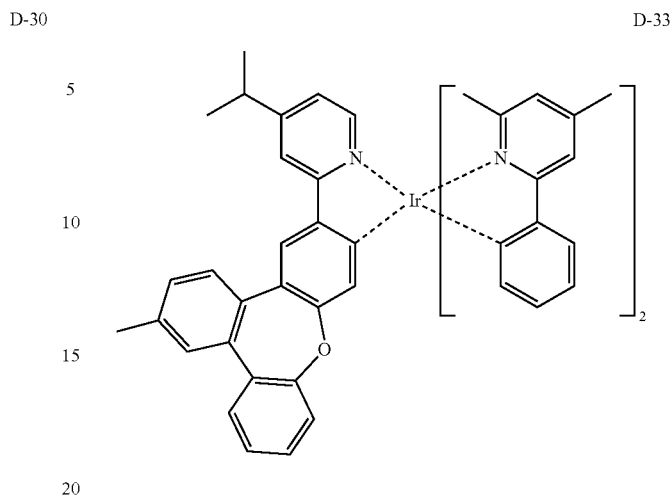
D-33
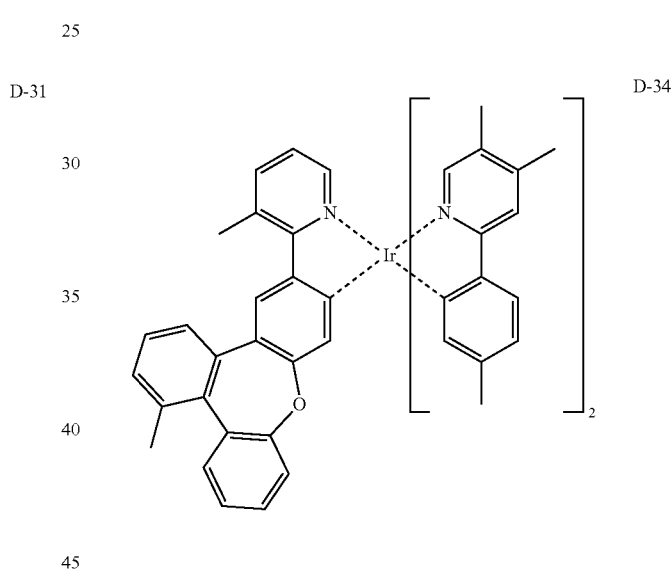
D-31
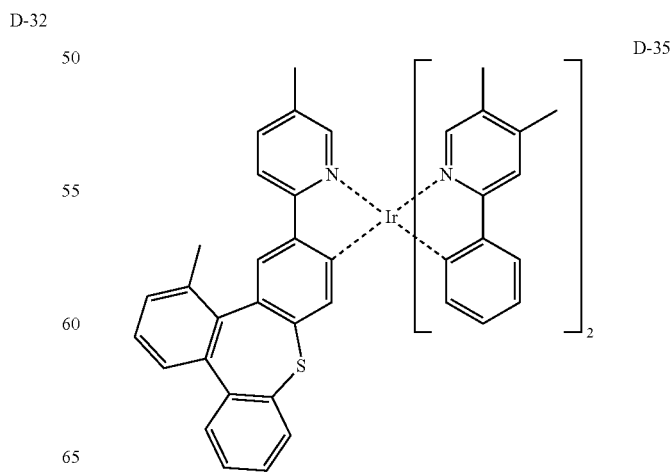
D-34
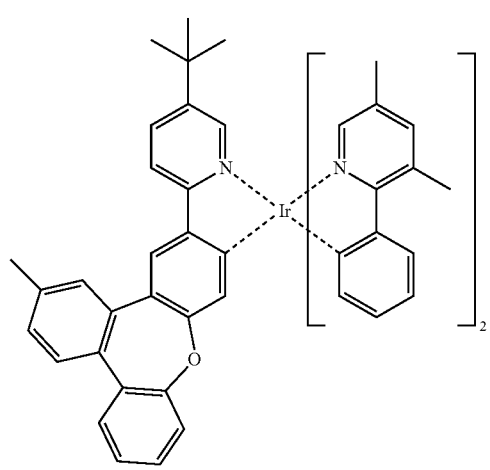
D-32
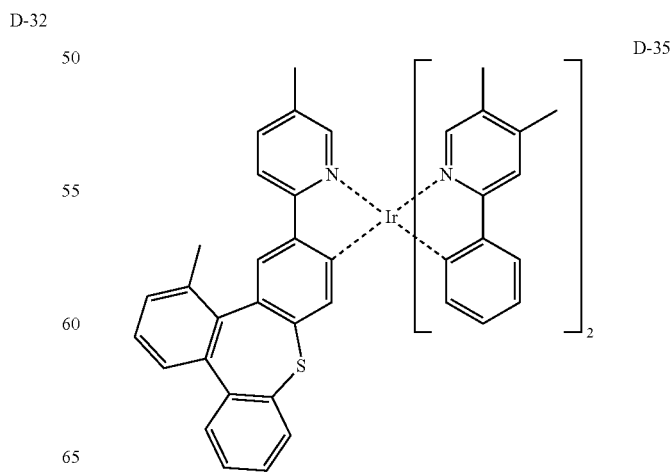
D-35

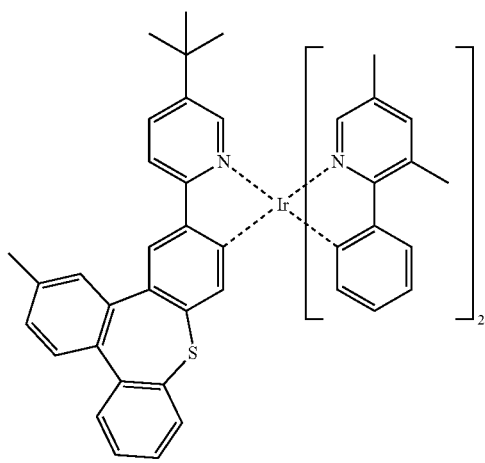
D-36
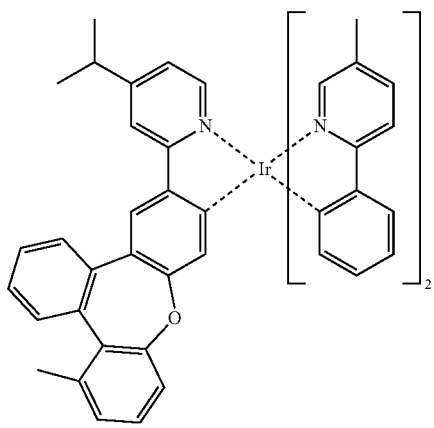
D-39
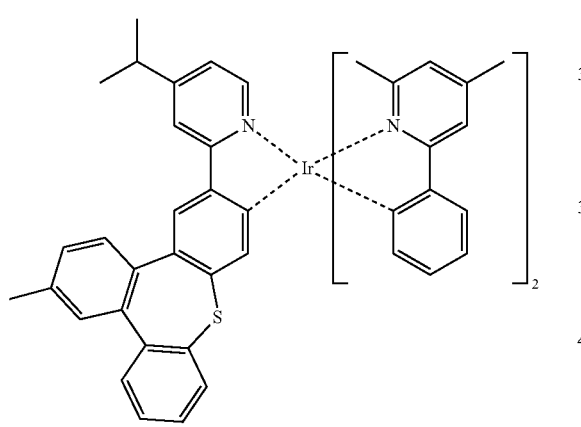
D-37
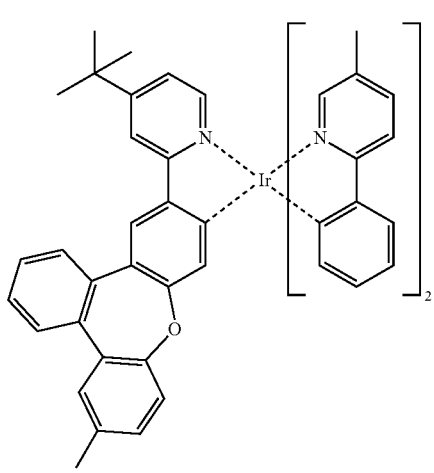
D-40
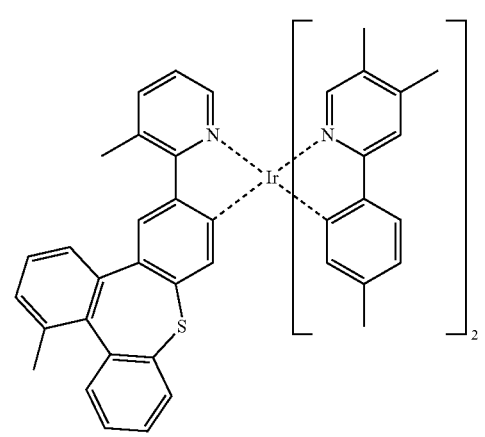
D-38
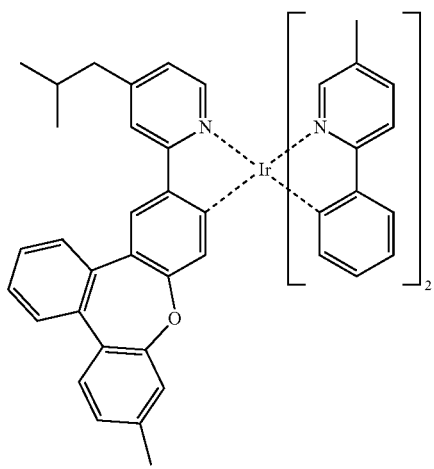
D-41

-continued
D-42
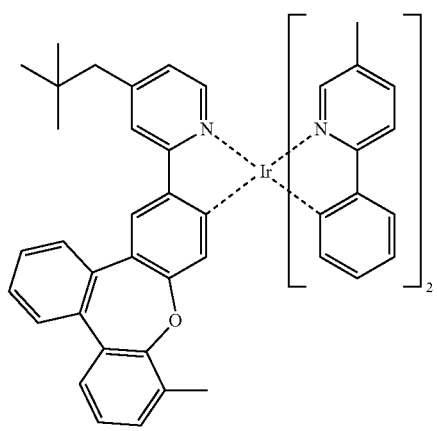
D-43
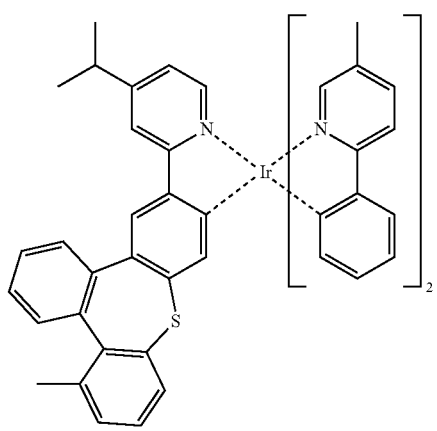
D-44
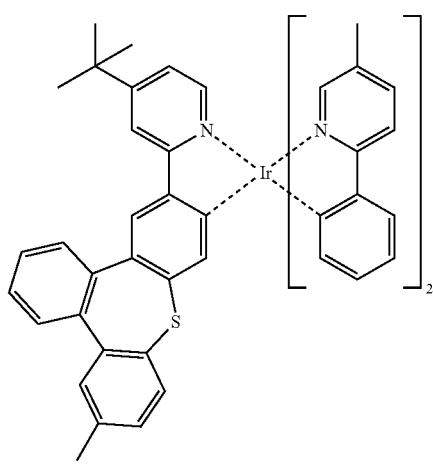
-continued
D-45
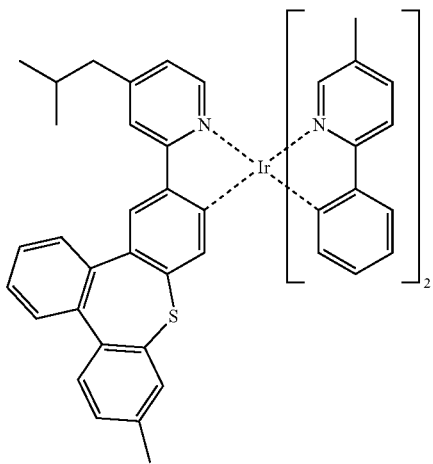
D-46
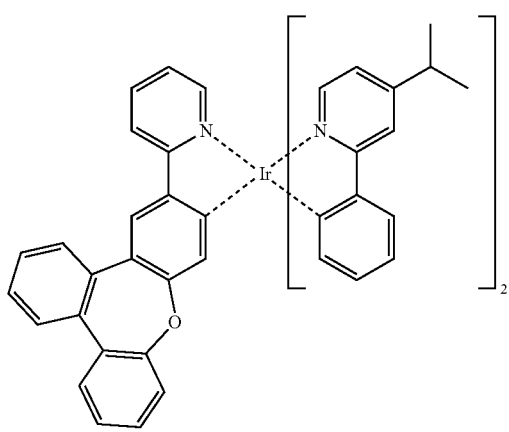
D-47
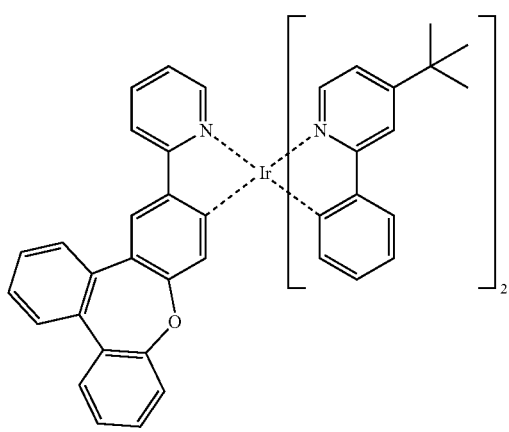

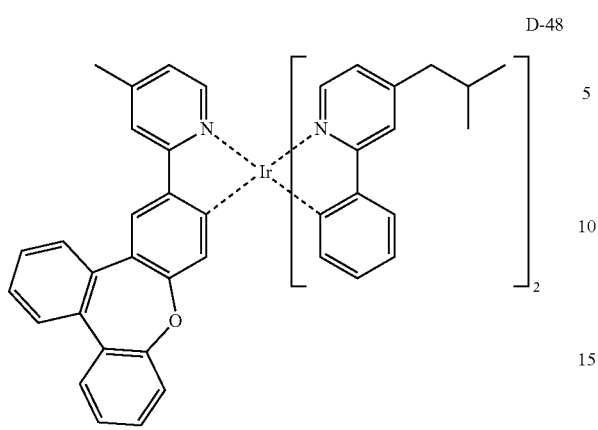
D-48
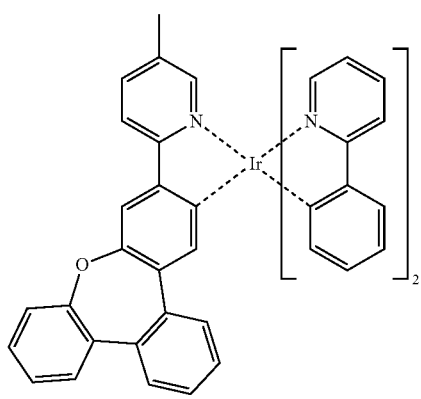
D-52
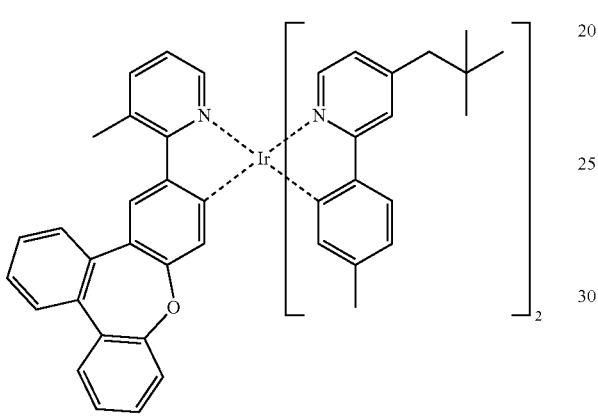
D-49
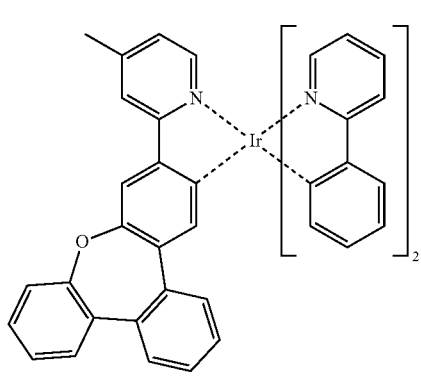
D-53
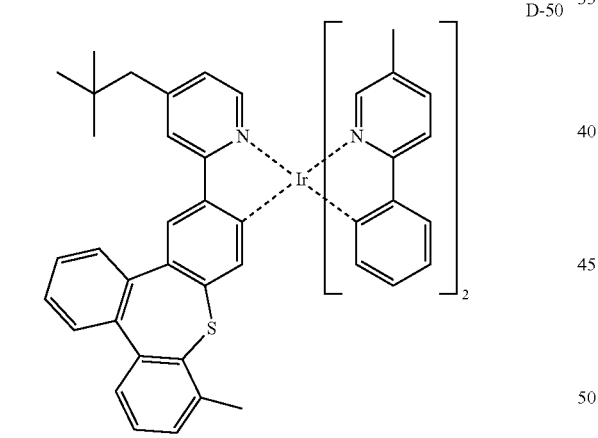
D-50
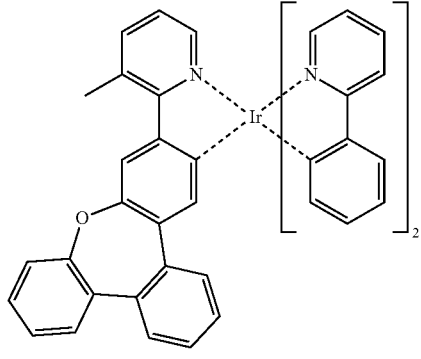
D-54
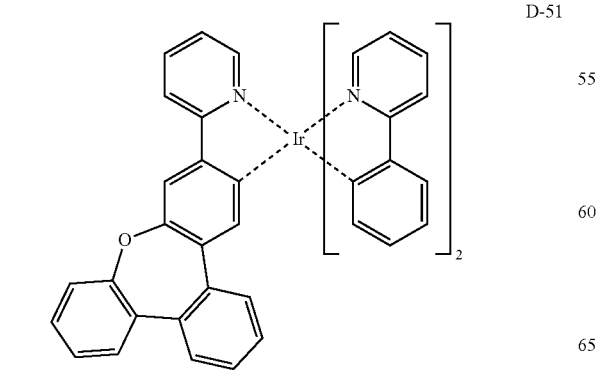
D-51
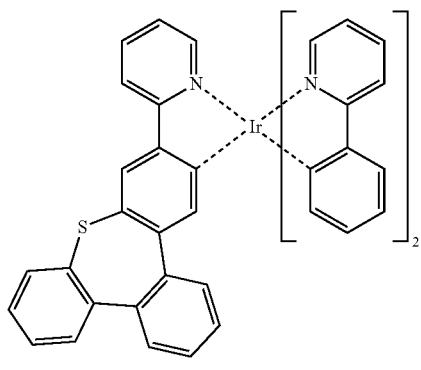
D-55

-continued
D-56
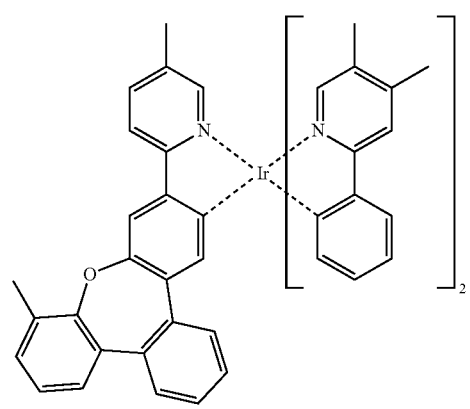
D-57
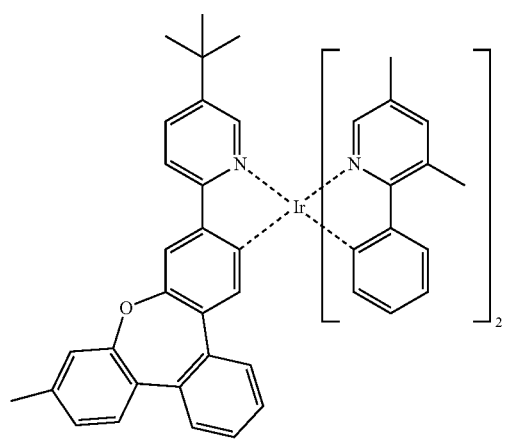
D-58
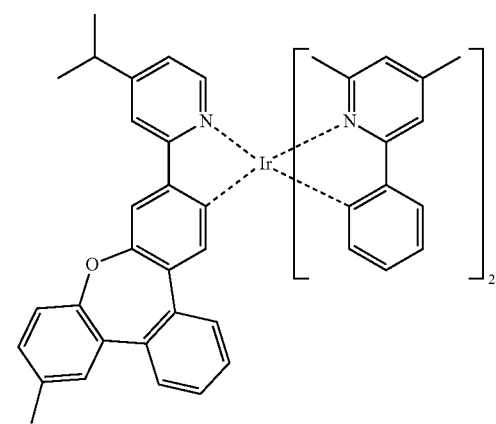
-continued
D-59
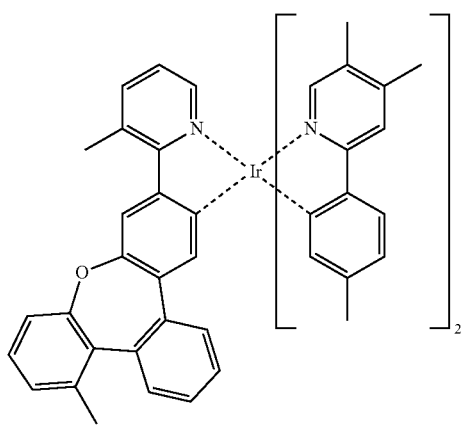
D-60
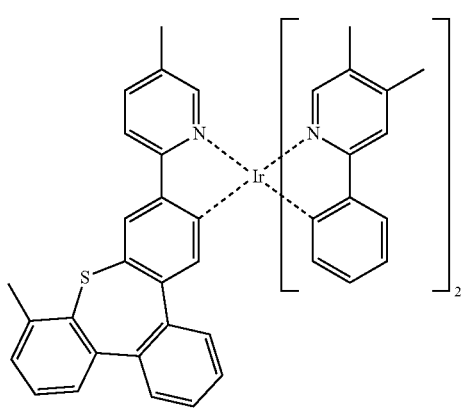
D-61
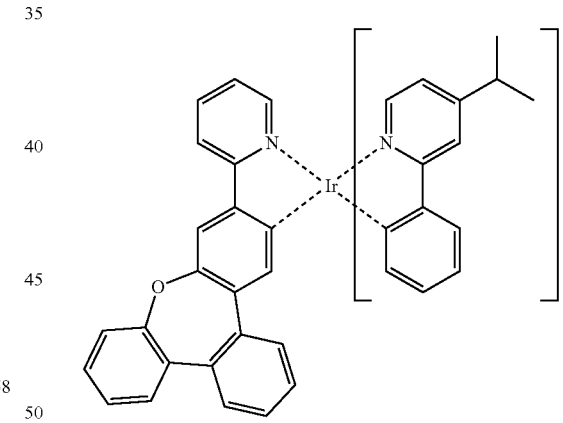
D-62
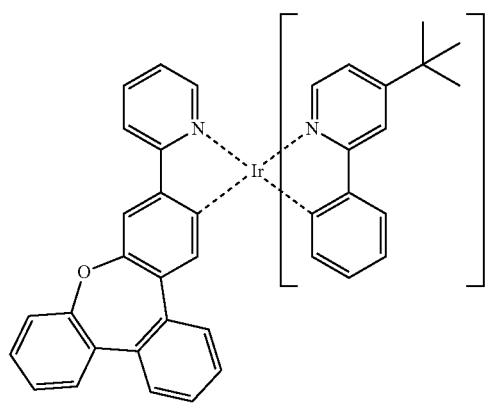

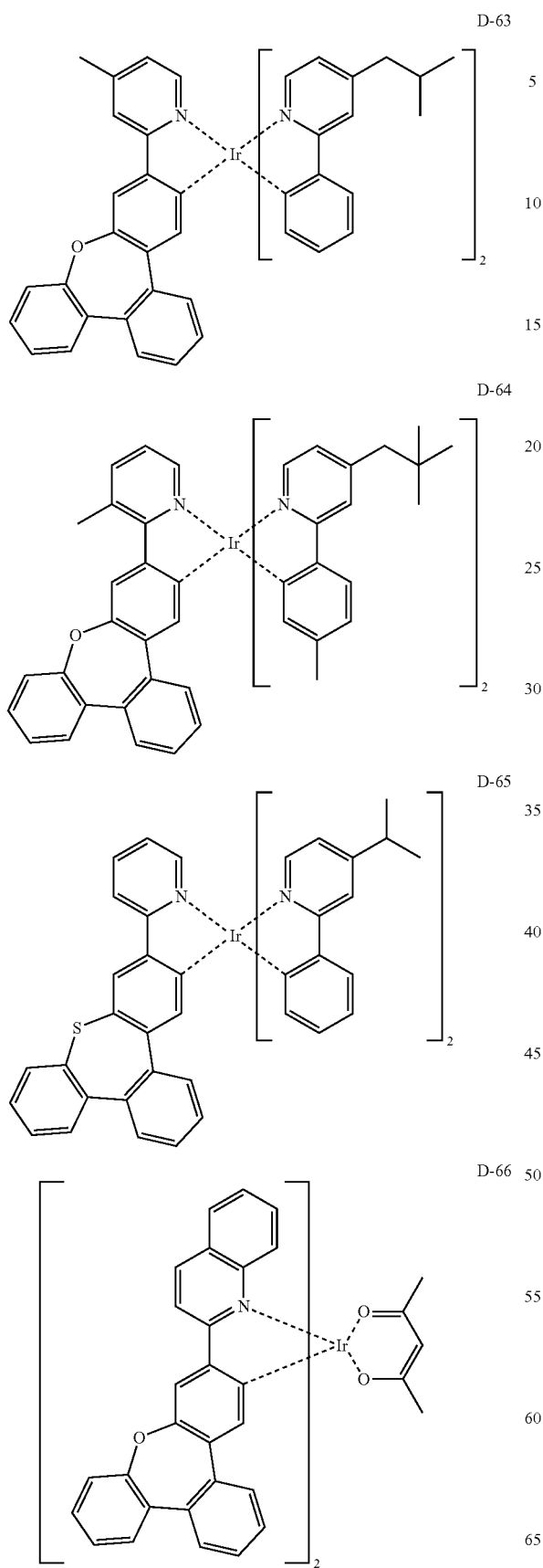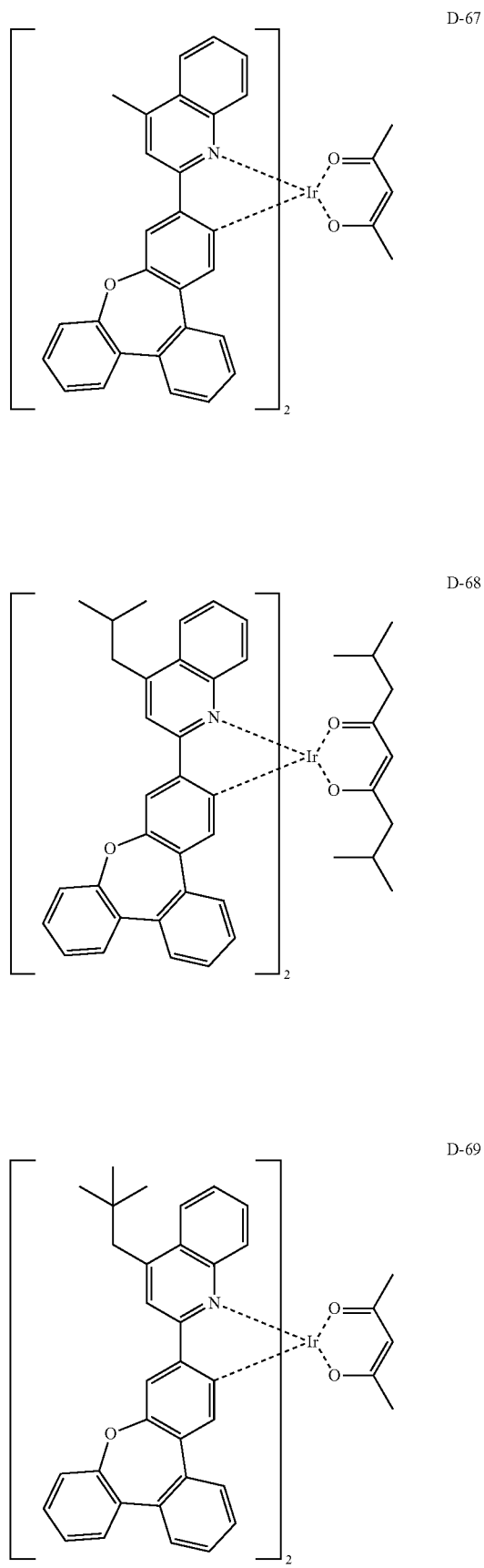

D-70
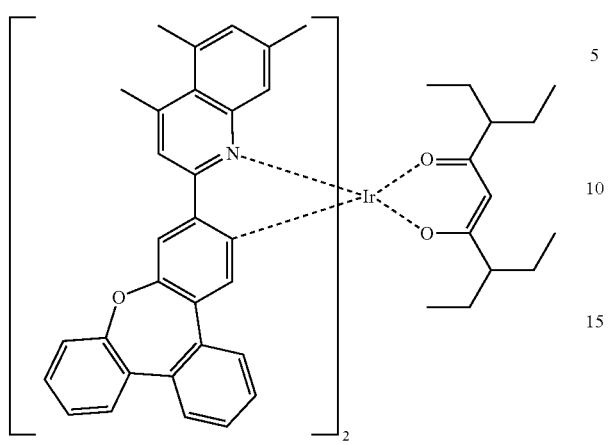
D-74
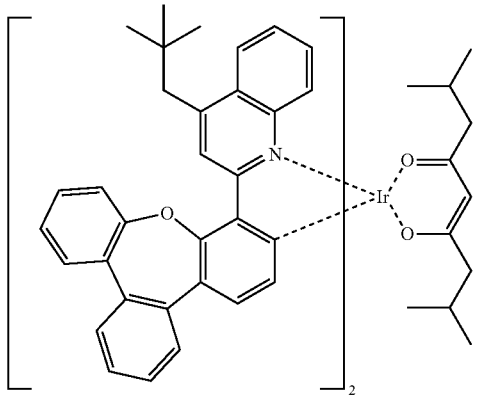
D-71
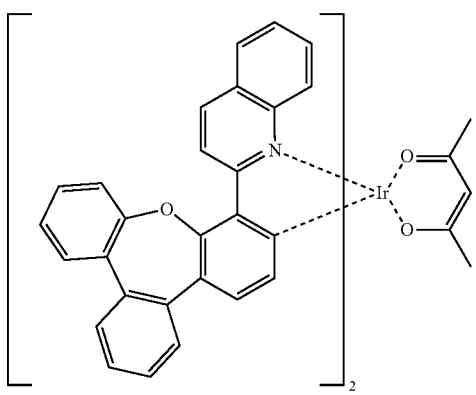
D-75
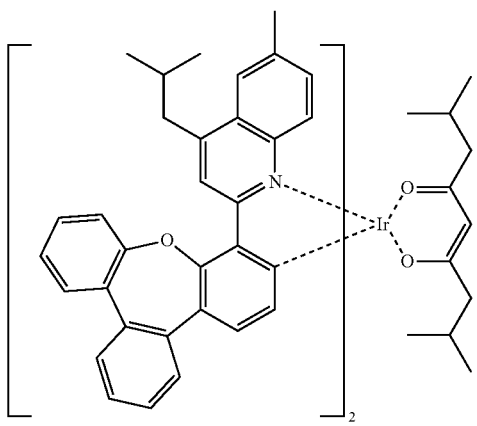
D-72
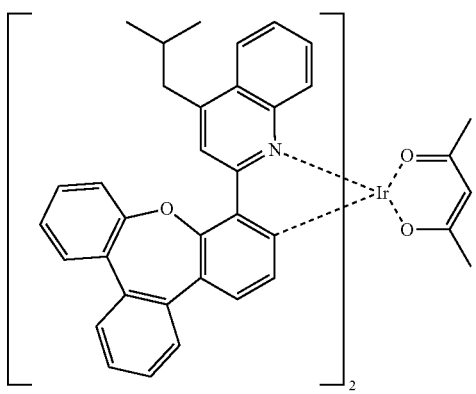
D-76
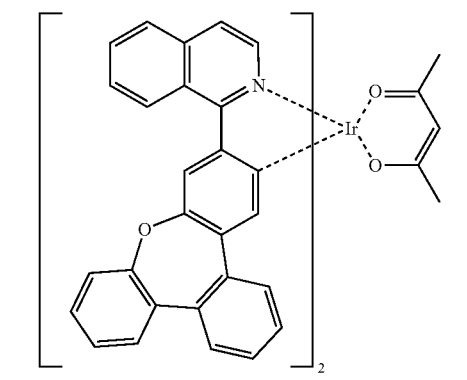
D-73
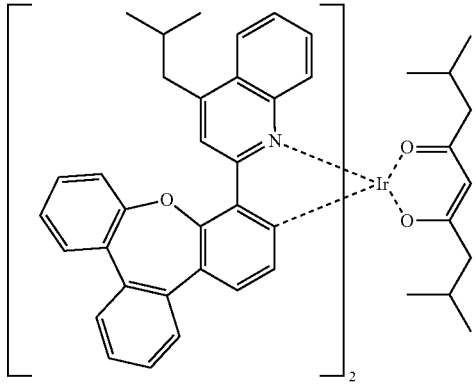
D-77
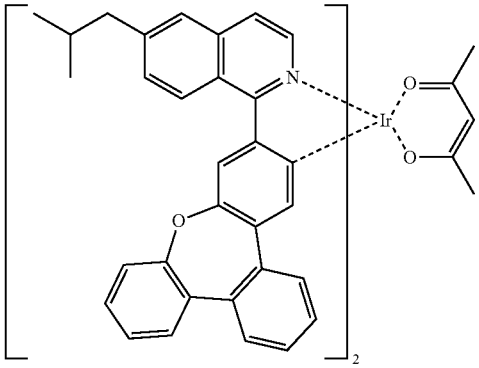

-continued
D-78
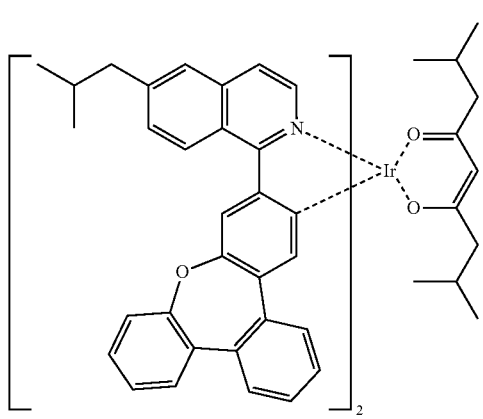
D-82
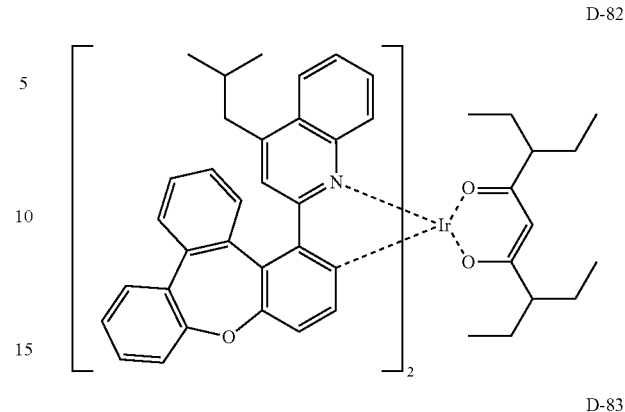
D-79
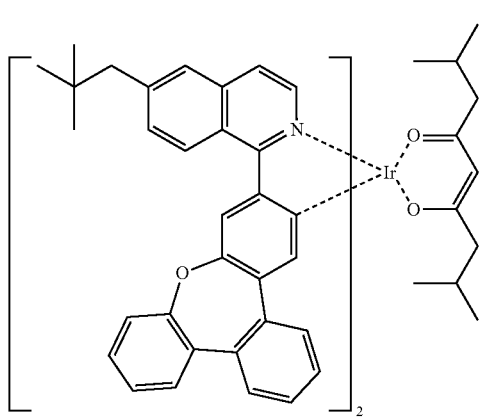
D-83
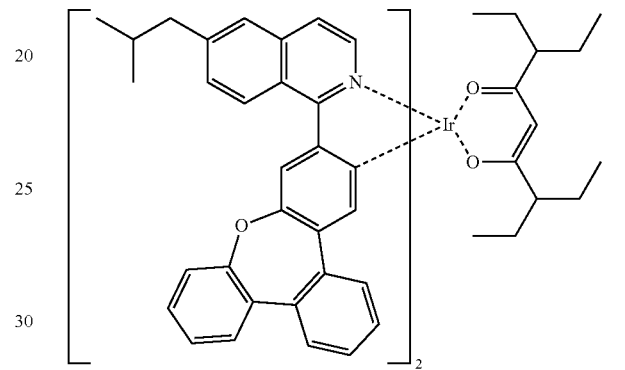
D-80
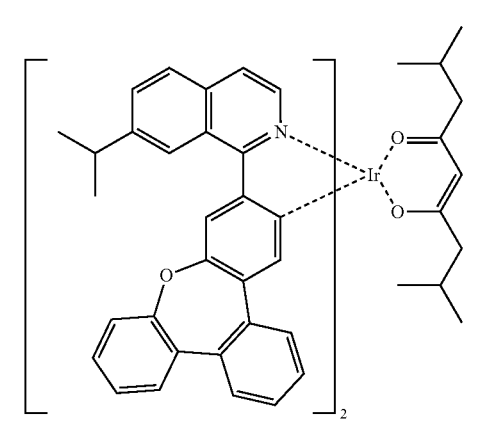
D-84
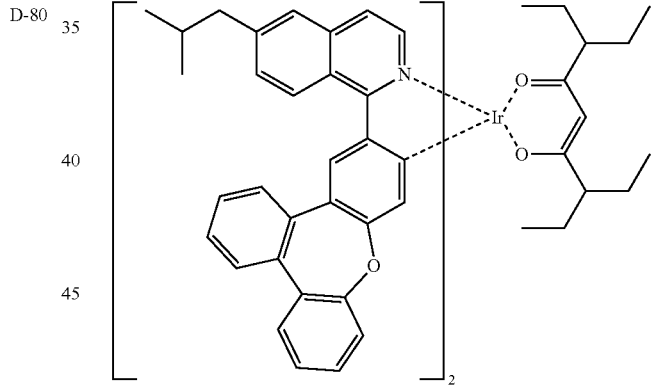
D-81
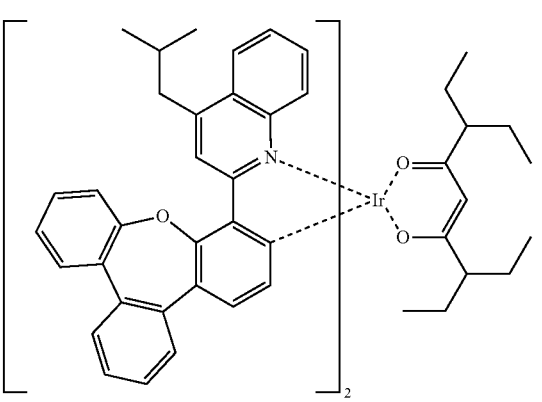
D-85
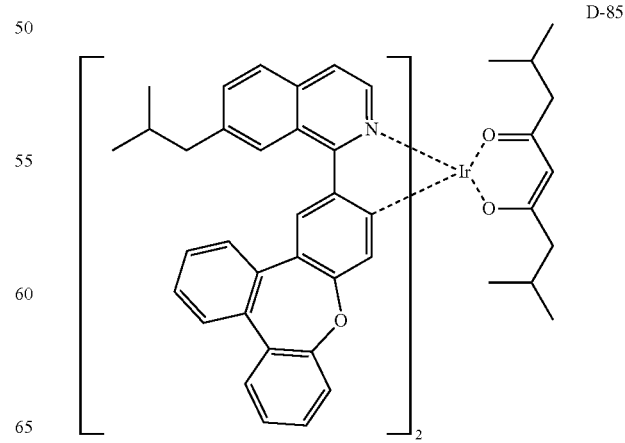

D-86
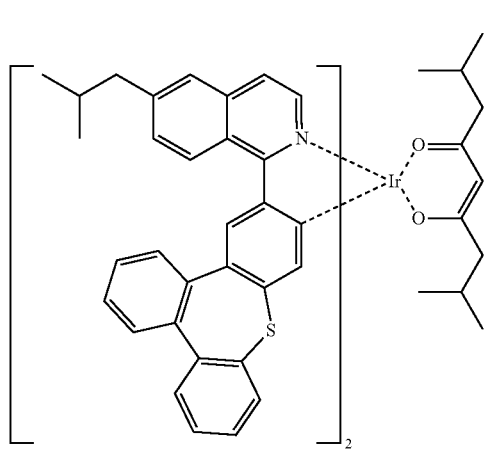
D-89
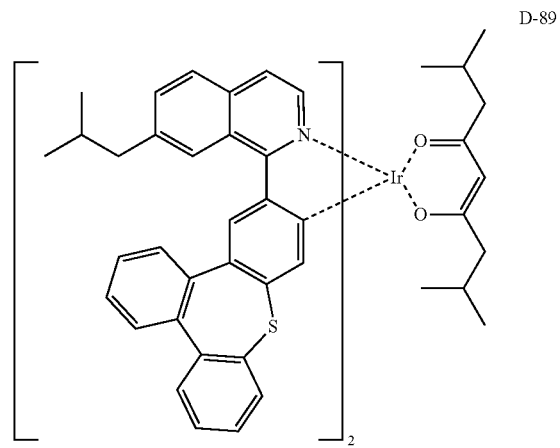
D-87
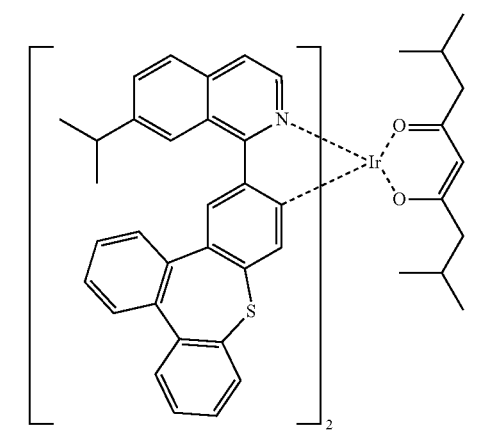
D-90
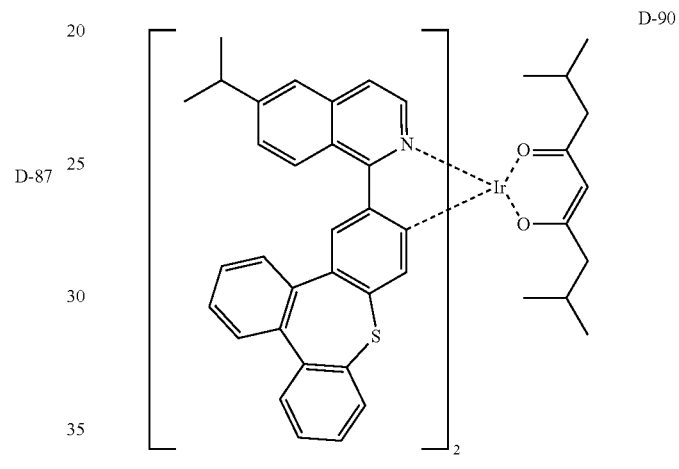
D-91
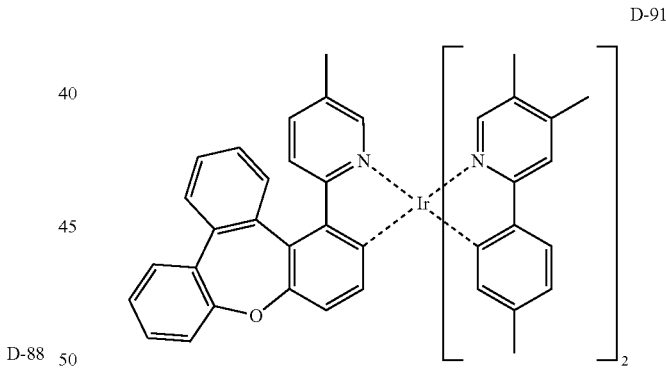
D-88
D-92
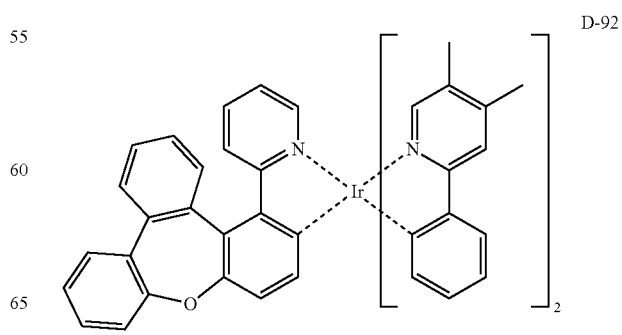

D-93
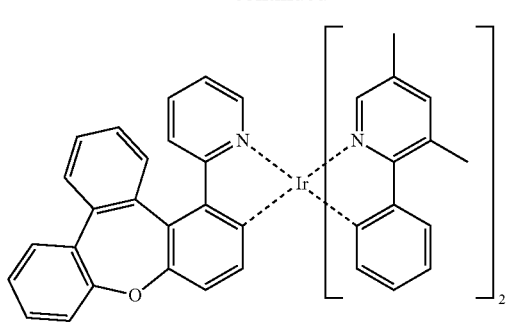
D-94
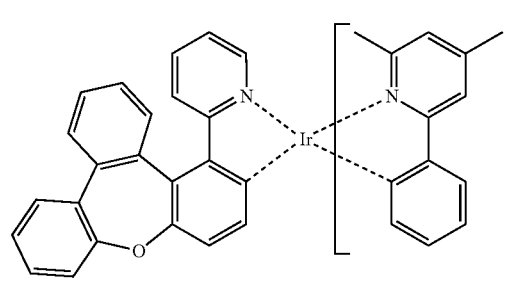
D-95
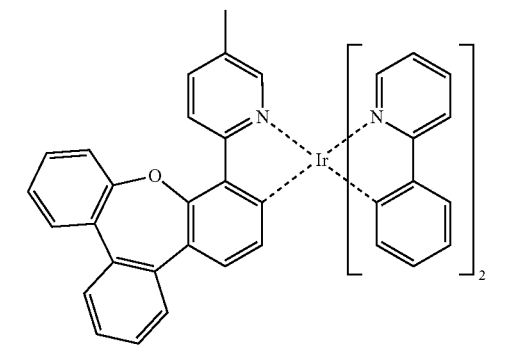
D-96
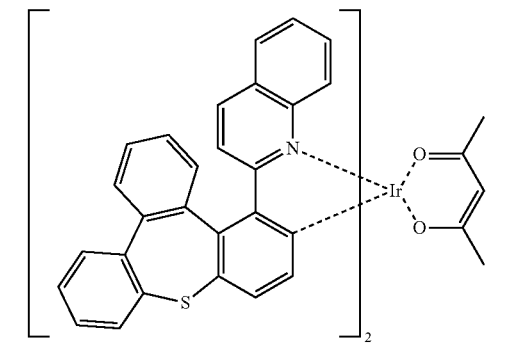
D-97
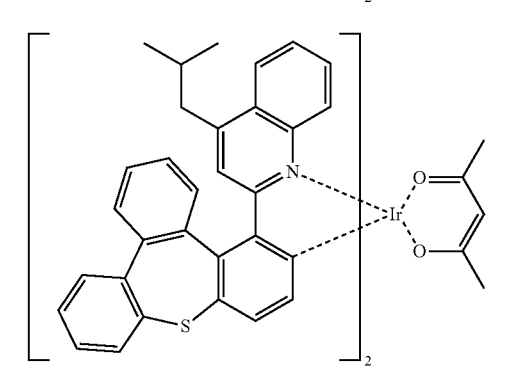
D-98
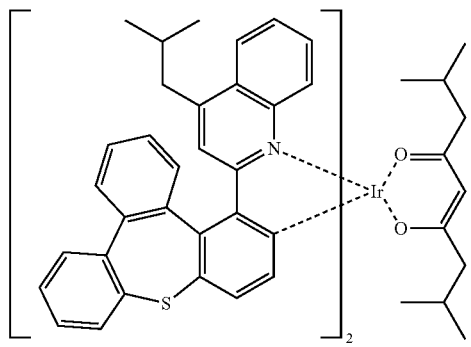
D-99
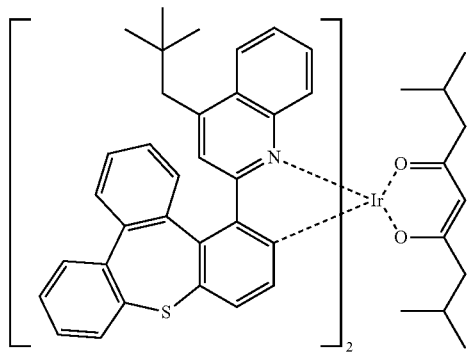
D-100
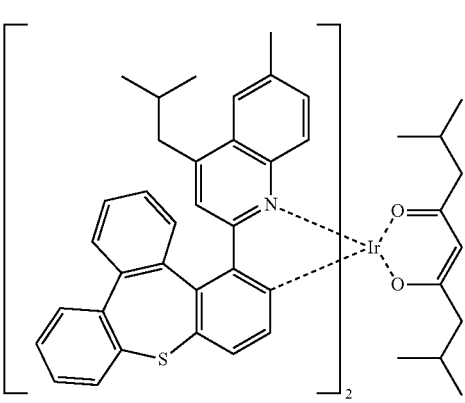
D-101
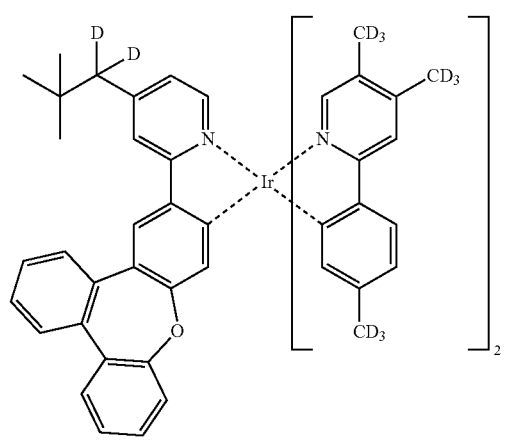

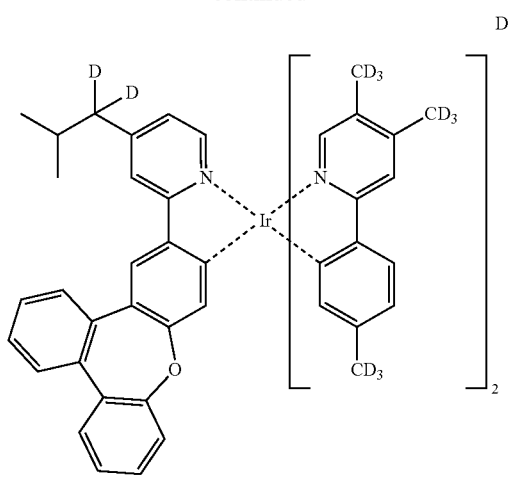
D-102
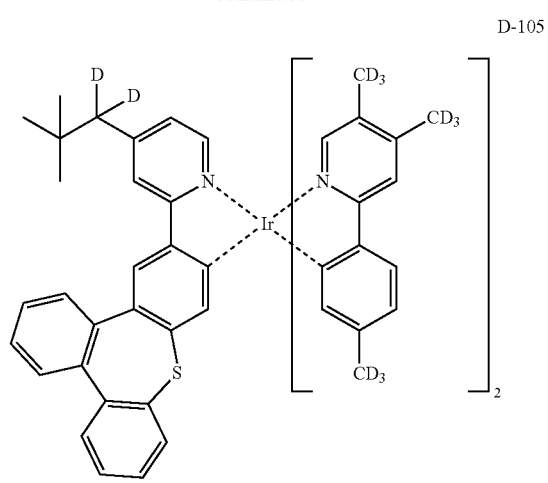
D-105
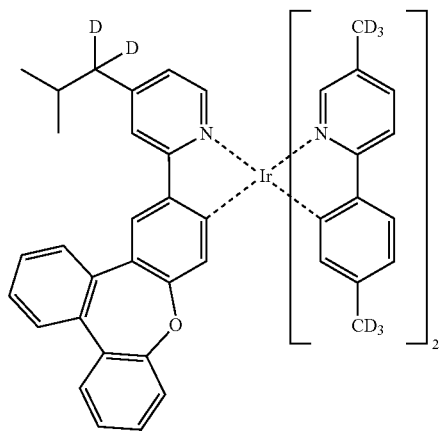
D-103
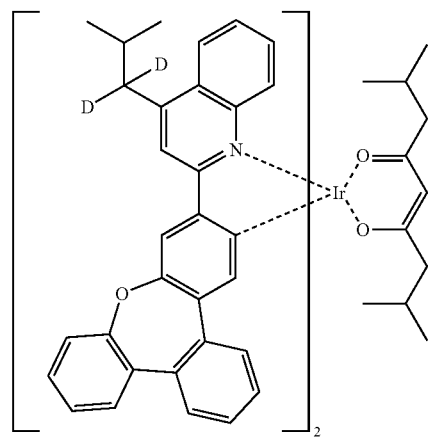
D-106
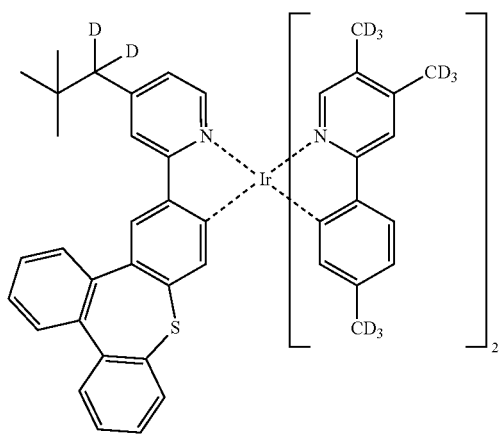
D-104
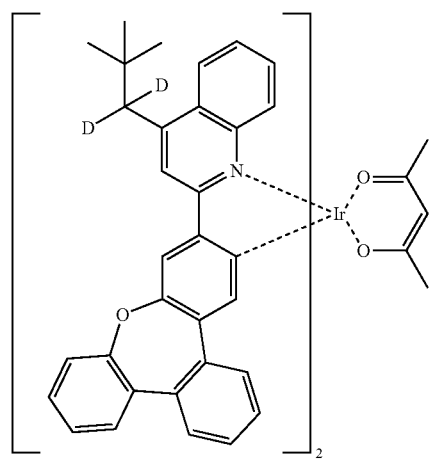
D-107

-continued
D-108
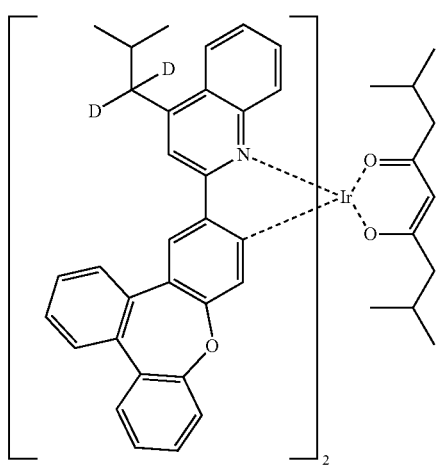
D-109
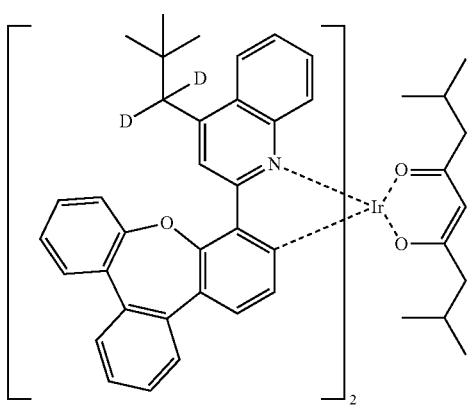
D-110
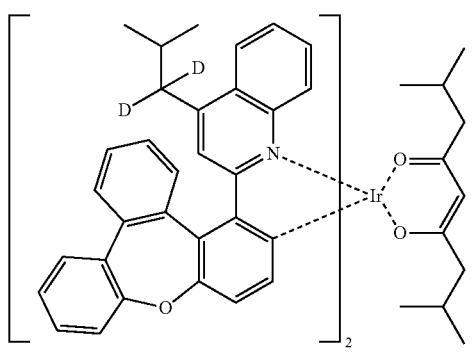
D-111
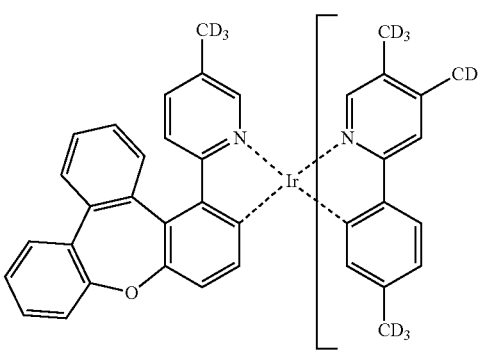
-continued
D-112
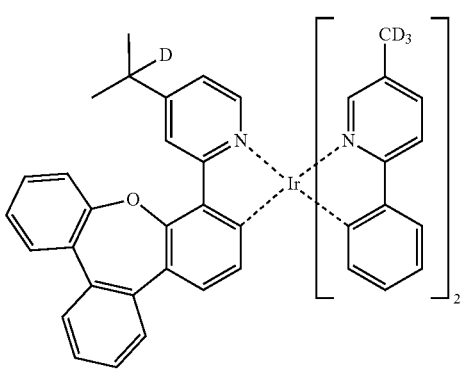
D-113
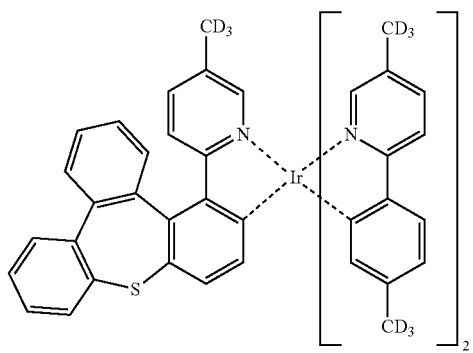
D-114
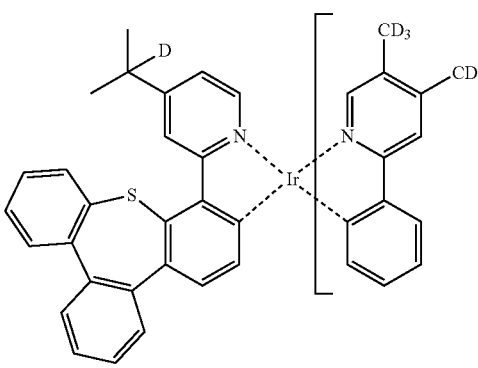
D-115
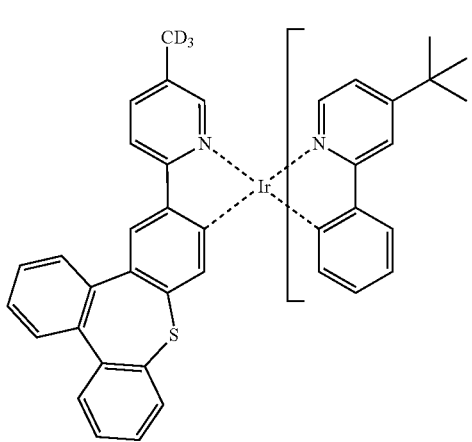

-continued
D-116
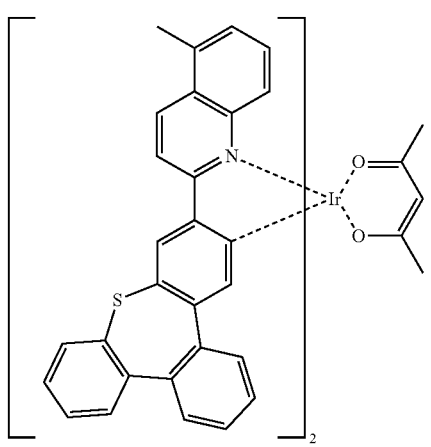
D-117
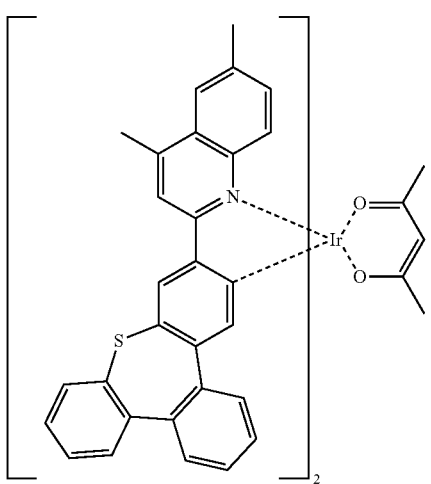
D-118
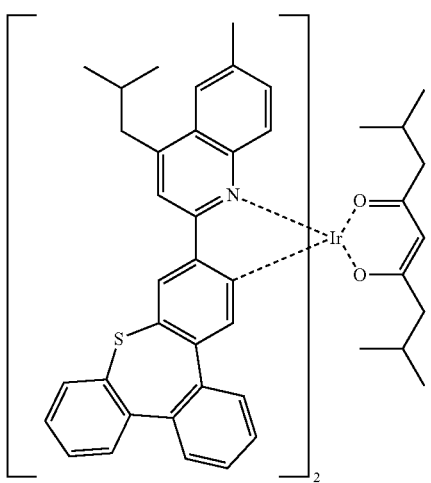
-continued
D-119
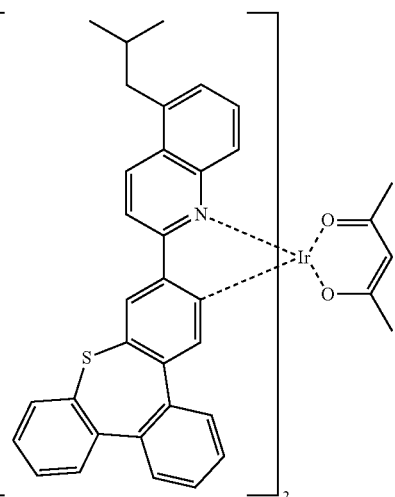
D-120
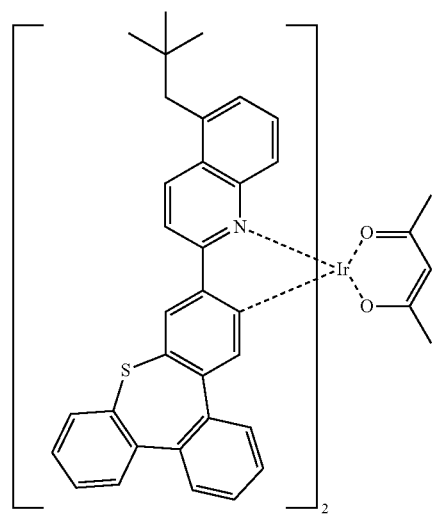
D-121
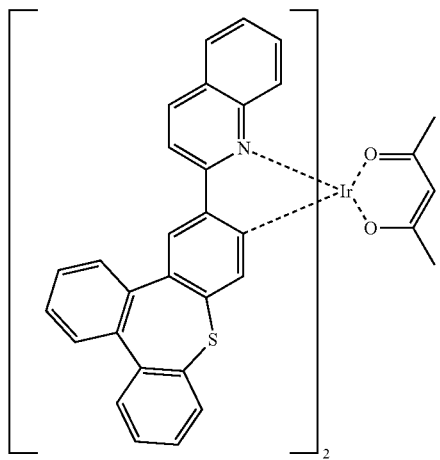

D-122
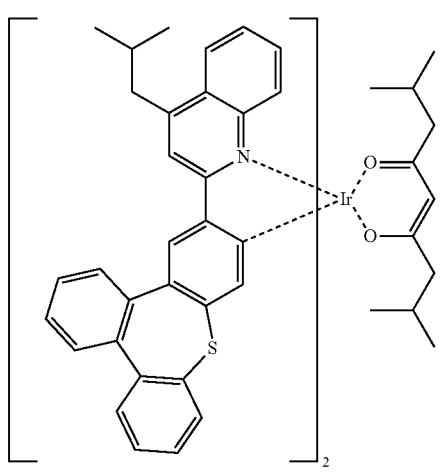
D-125
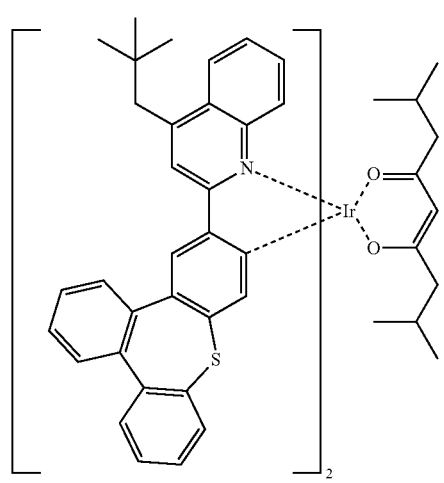
D-123
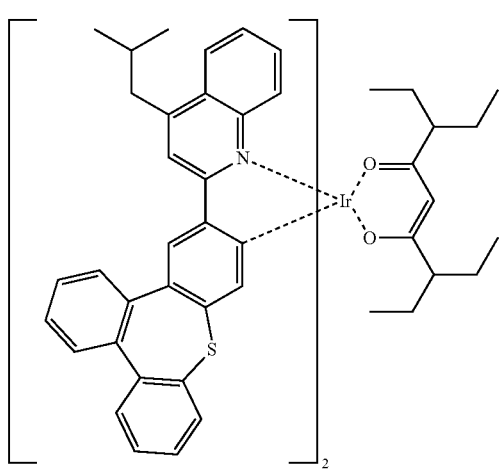
D-126
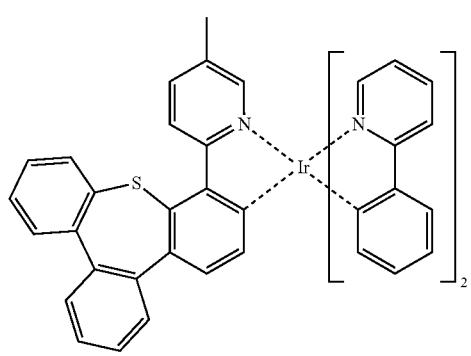
D-127
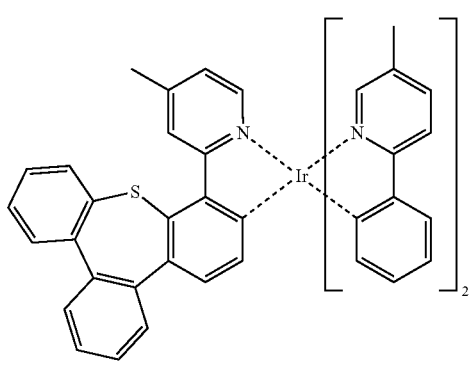
D-124
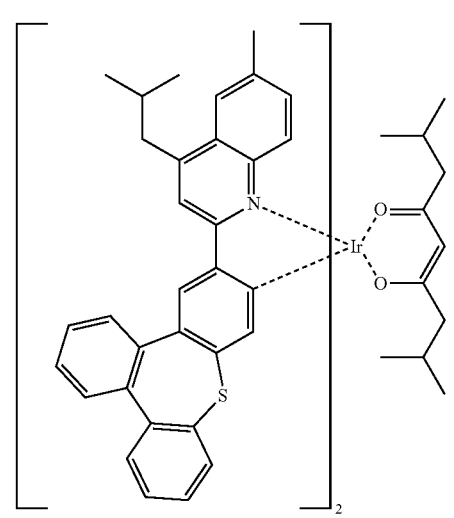
D-128
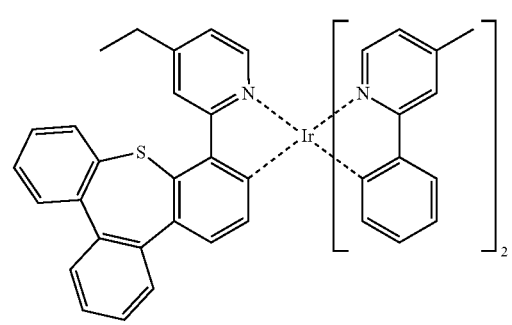

D-129
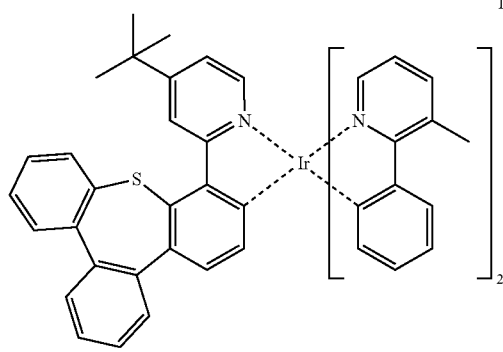
D-130
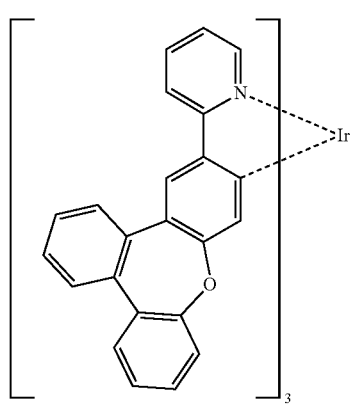
D-131
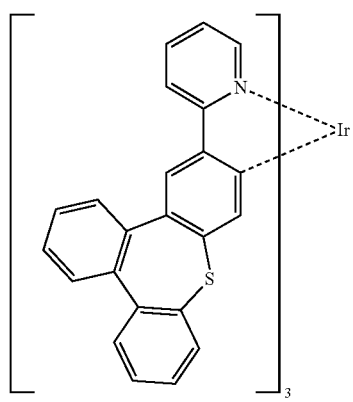
D-132
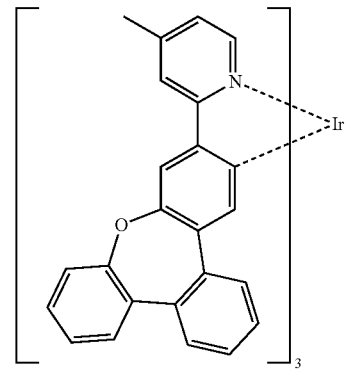
D-133
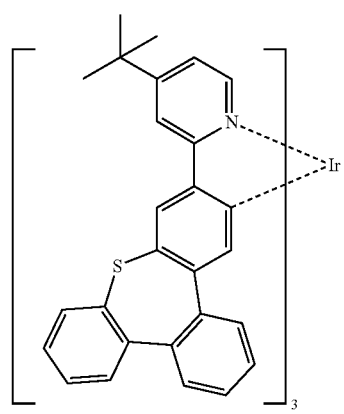
D-134
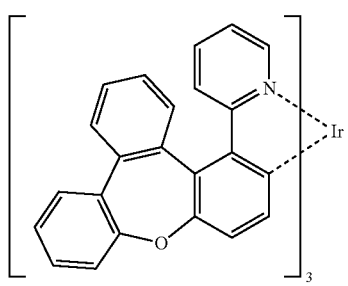
D-135
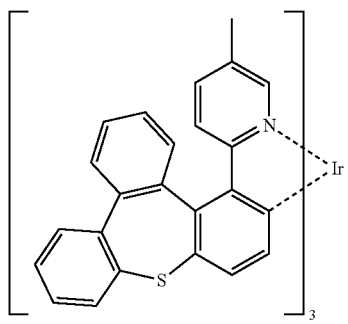
D-136
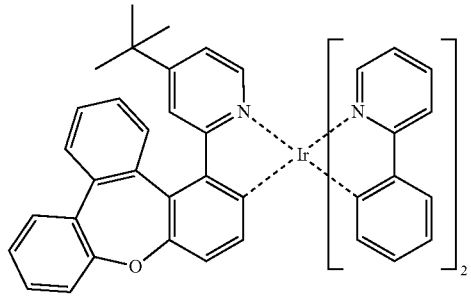
D-137
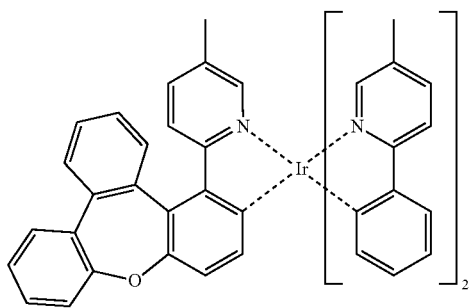

-continued
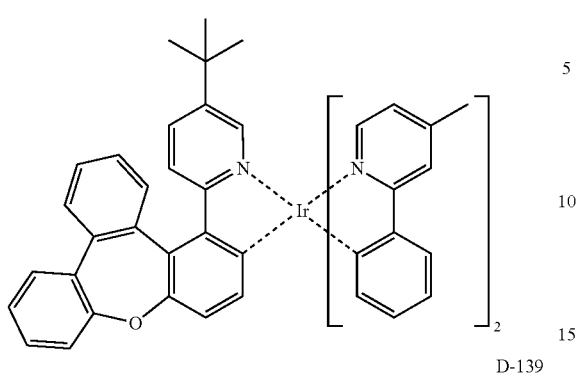
The compound represented by formula 1 may be prepared by a synthetic method known to one skilled in the art. For example, the compound represented by formula 1 can be prepared by referring to the following reaction schemes 1 and 2, but is not limited thereto.
[Reaction Scheme 1]
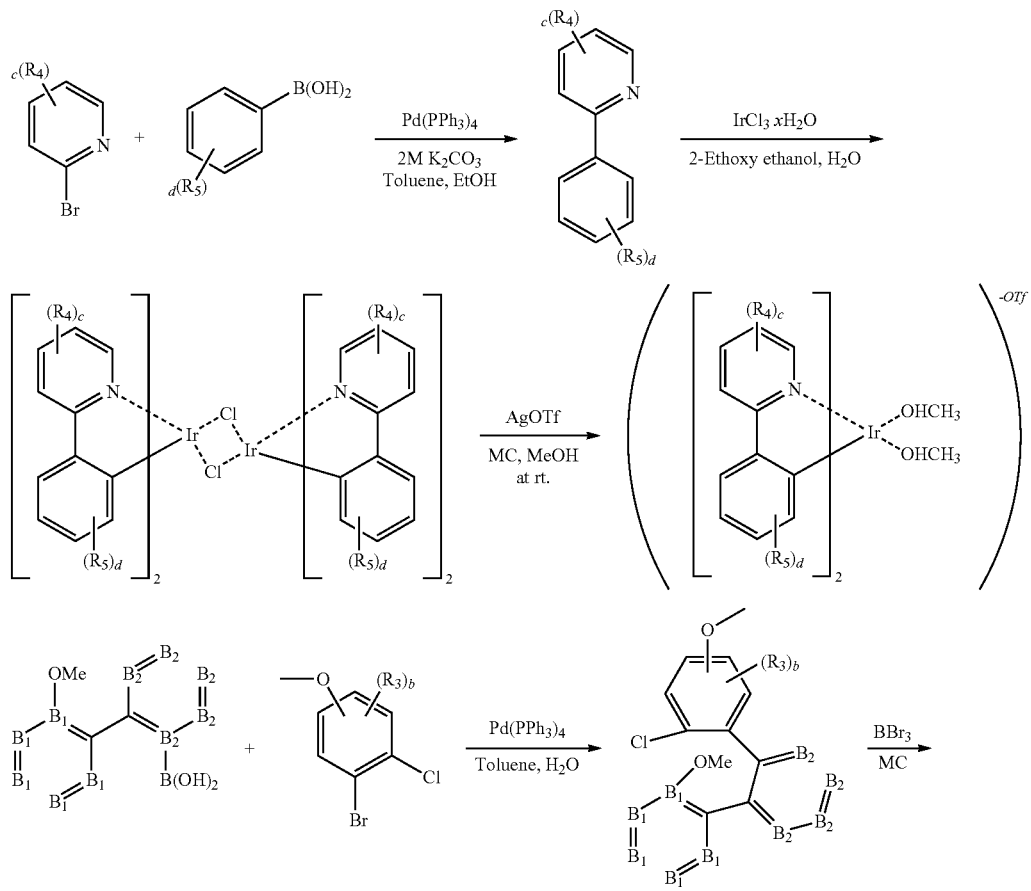

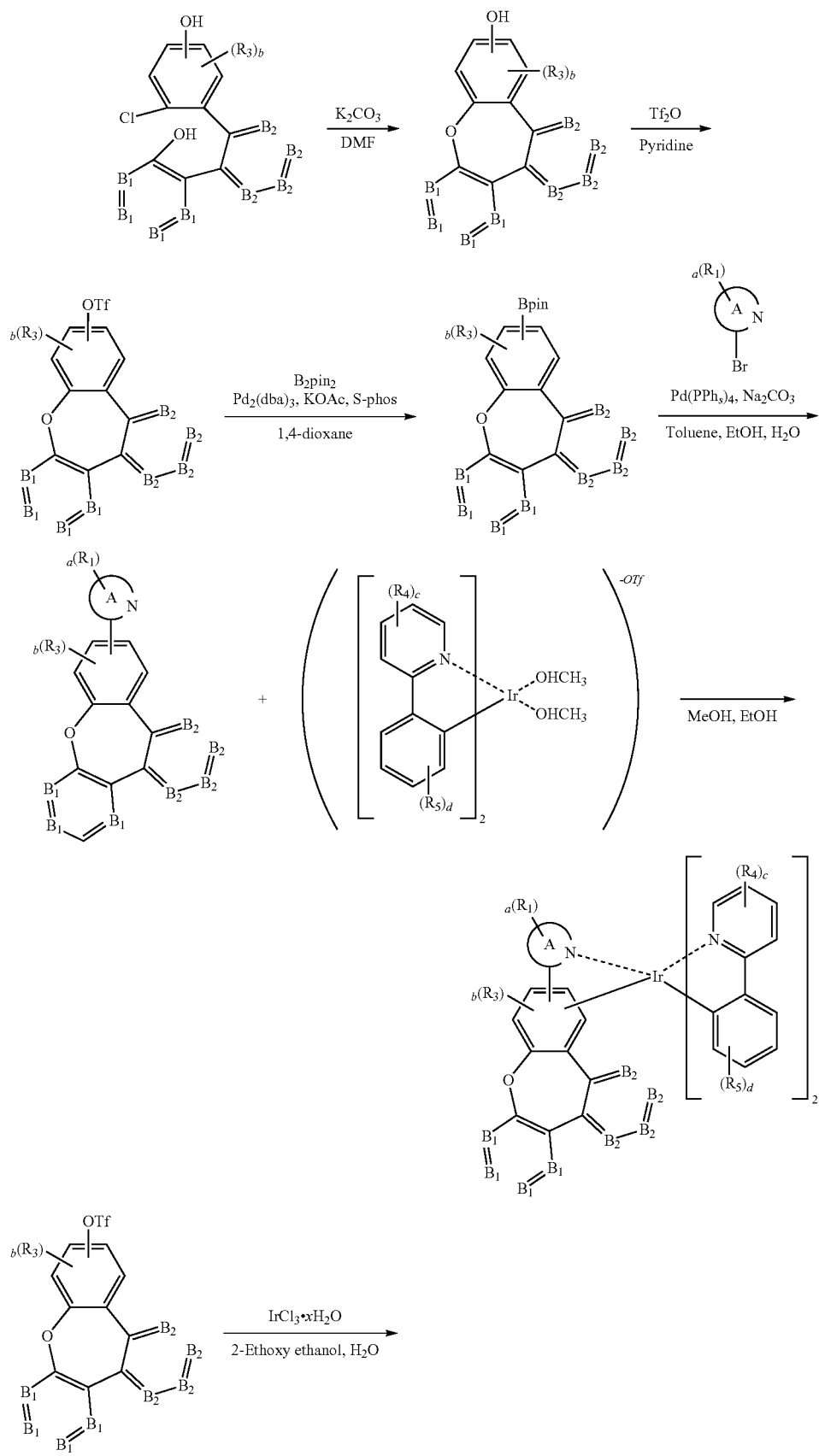

55 56
-continued
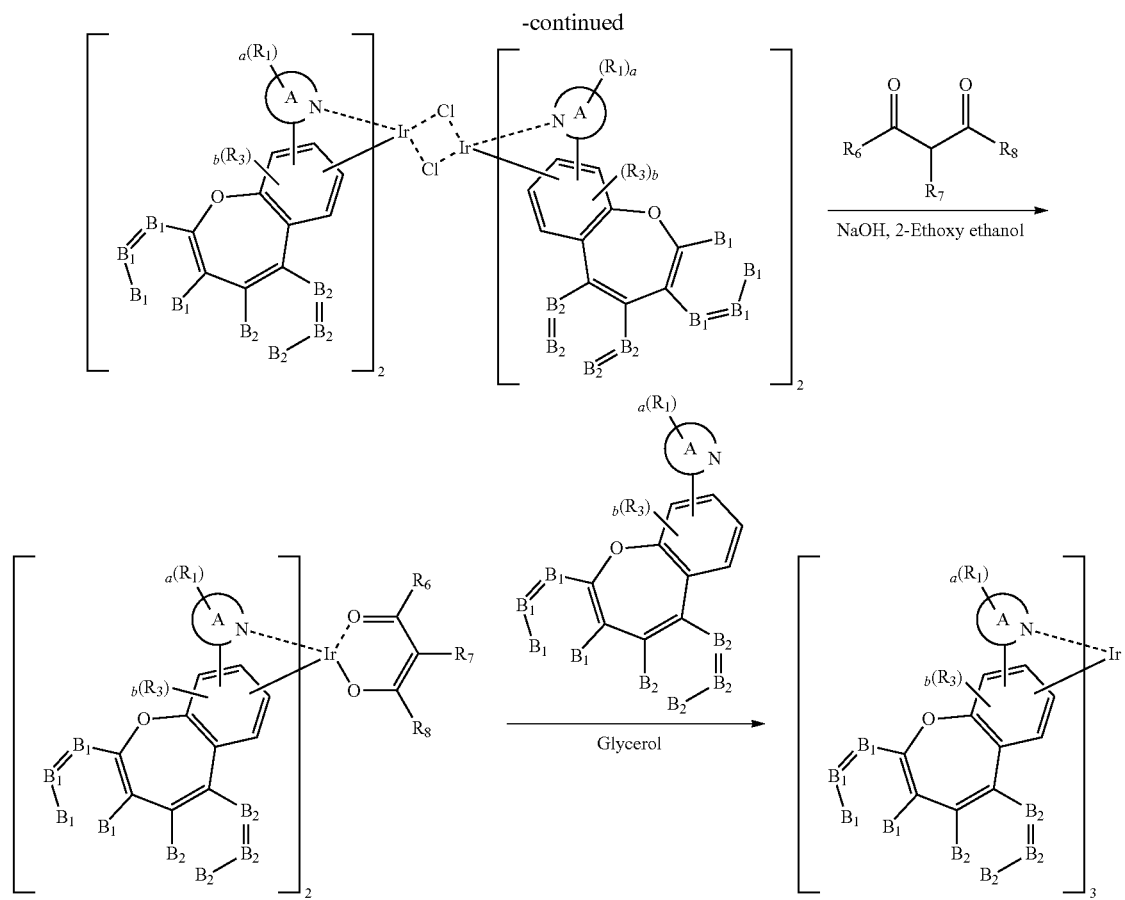
[Reaction Scheme 2]
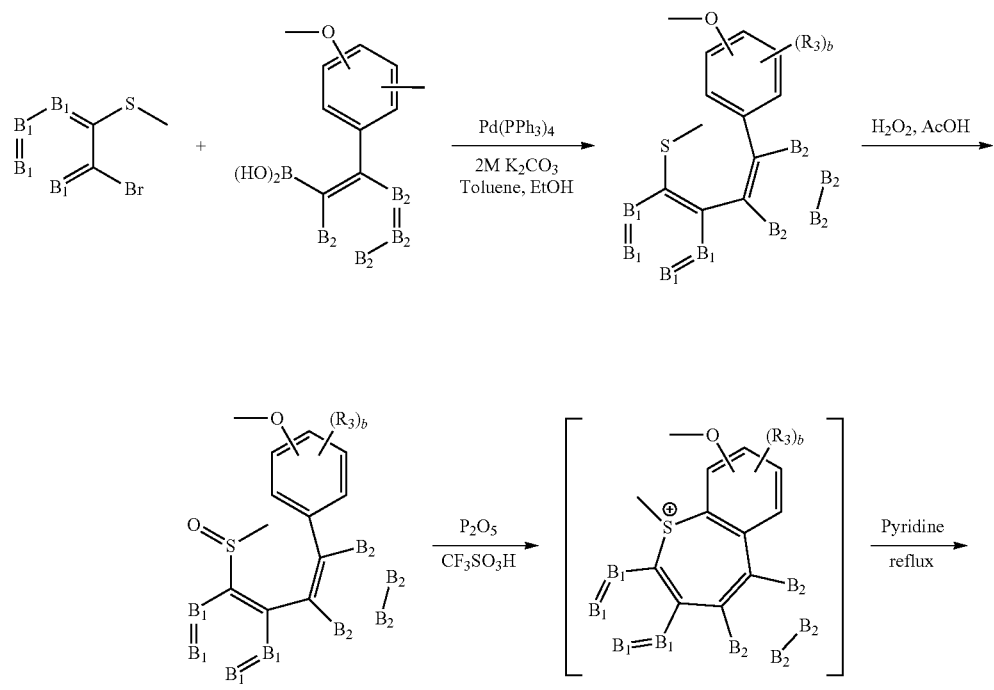

-continued
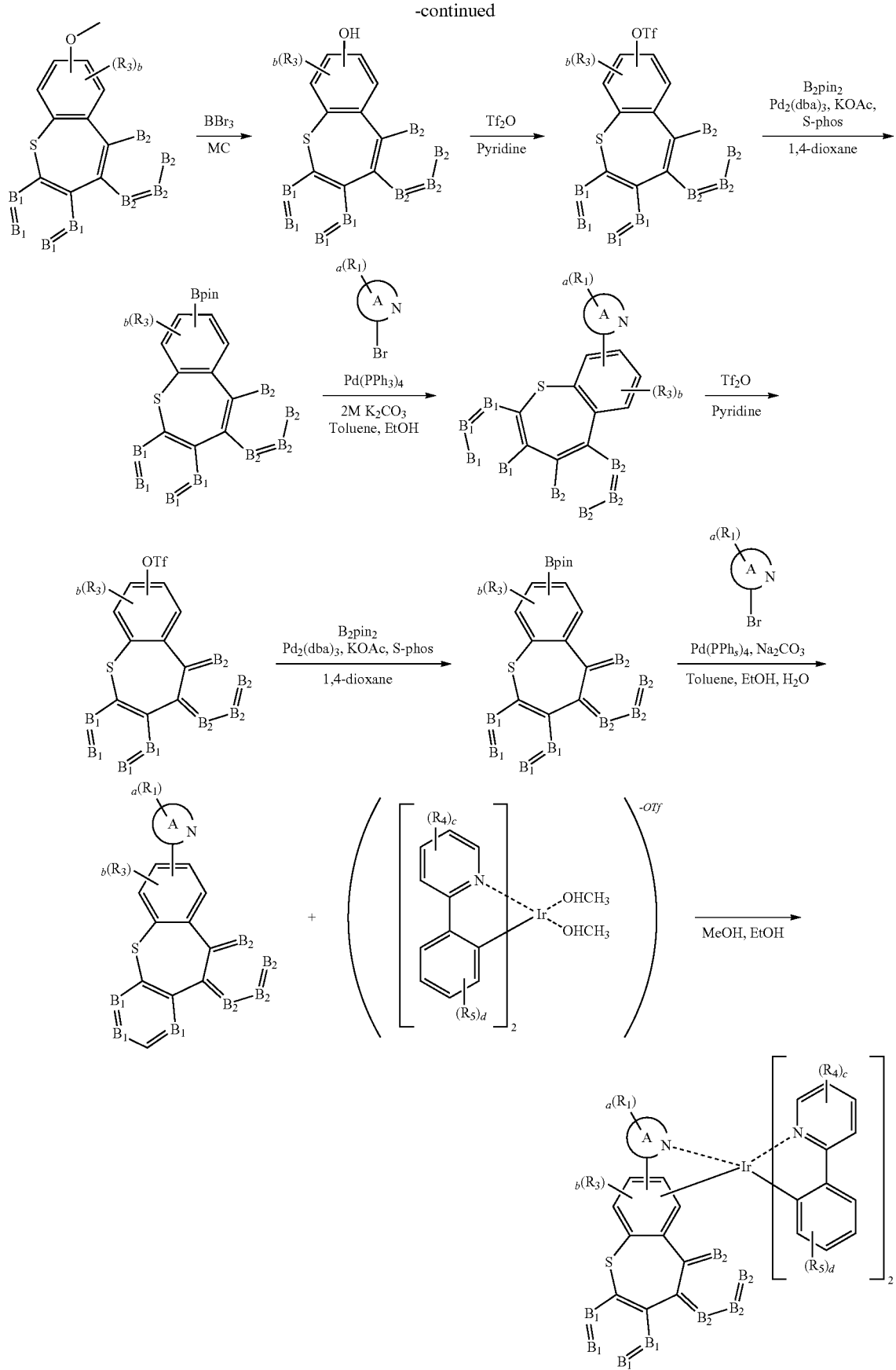

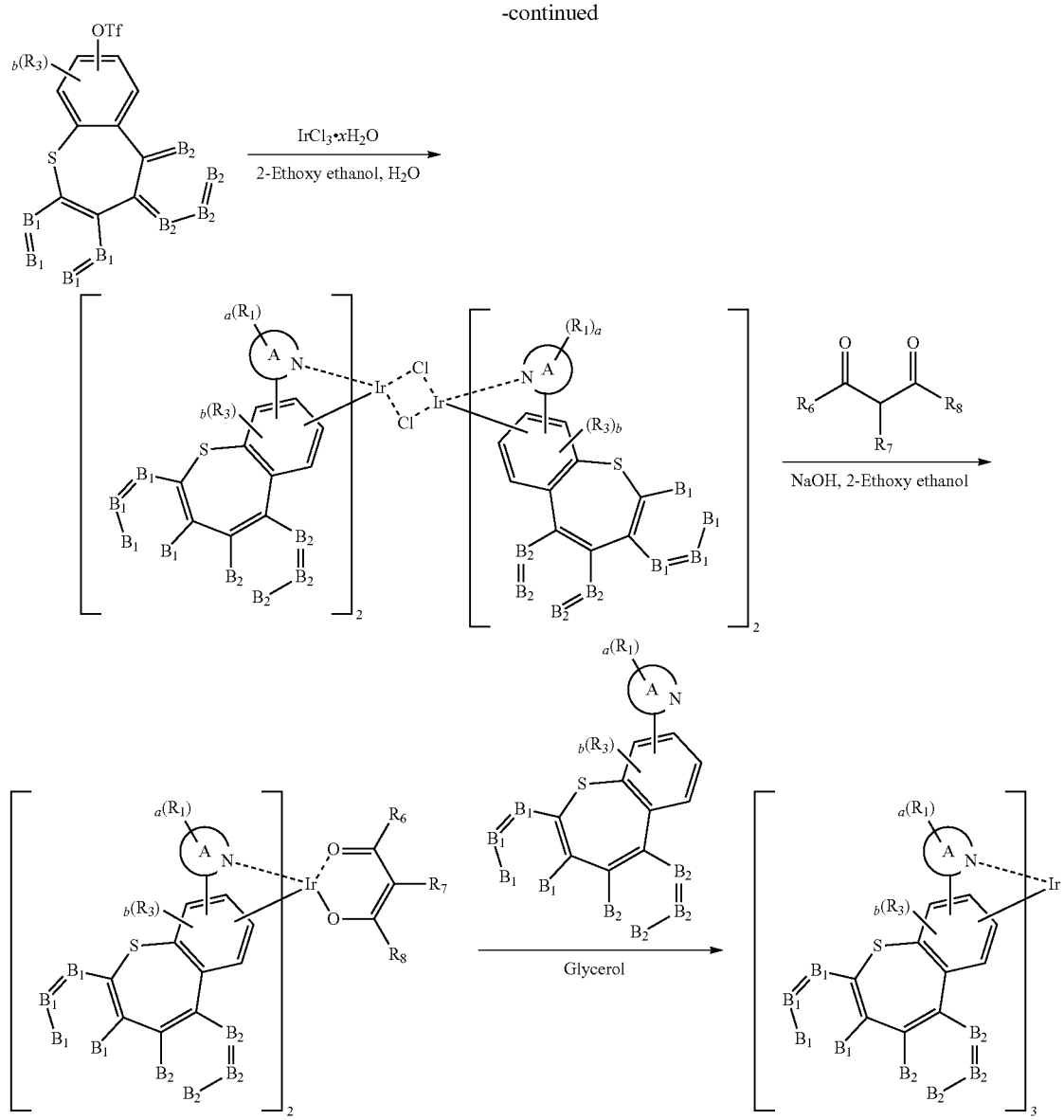

In reaction schemes 1 and 2, $B_1$, $B_2$, $R_1$, $R_3$ to $R_8$, and a to d are each as defined in formula 1, formula 2-1, or formula 2-2.

The compound represented by formula 1 of the present disclosure may be comprised in at least one layer constituting an organic electroluminescent device, and for example, at least one layer selected from a hole injection layer, a hole transport layer, a hole auxiliary layer, a light-emitting auxiliary layer, a light-emitting layer, an electron transport layer, an electron buffer layer, an electron injection layer, an interlayer, a hole blocking layer, and an electron blocking layer. The compound represented by formula 1 of the present disclosure is not limited thereto, but may be included in the light-emitting layer, and may be included in the light-emitting layer as a dopant.

The organic electroluminescent materials of the present disclosure, for example, at least one of a hole injection material, a hole transport material, a hole auxiliary material, a light-emitting auxiliary material, an electron blocking material, a light-emitting material, an electron buffer material, a hole blocking material, an electron transport material, and an electron injection layer, may comprise the compound represented by formula 1. The material may be a light-emitting material, for example, a dopant material. The organic electroluminescent materials of the present disclosure may consist of only the compound represented by formula 1, and may further comprise conventional material(s) included in the organic electroluminescent material.

The organic electroluminescent device according to the present disclosure comprises a first electrode, a second electrode, and at least one organic layer between the first and second electrodes. One of the first and second electrodes may be an anode, and the other may be a cathode. The organic layer may comprise at least one light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer.

The organic electroluminescent device according to the present disclosure may comprise the compound represented by formula 1, and may further comprise conventional compounds included in the organic electroluminescent material. For example, the conventional compound may be at least one metal selected from the group consisting of metals of Group 1, metals of Group 2, transition metals of the 4$^{th}$ period, transition metals of the 5$^{th}$ period, lanthanides and organic metals of d-transition elements of the Periodic Table, or at least one complex compound comprising said metal. Also, the organic electroluminescent device according to the present disclosure may emit white light by further comprising at least one light-emitting layer which comprises a blue electroluminescent compound, a red electroluminescent compound or a green electroluminescent compound known in the field. In addition, it may further include a yellow or orange light-emitting layer, if necessary.

The organic electroluminescent device of the present disclosure may comprise the compound represented by formula 1 in the light-emitting layer. The light-emitting layer is a layer from which light is emitted, and can be a single layer or a mufti-layer in which two or more layers are stacked. In addition, the doping concentration of the dopant compound with respect to the host compound in the light-emitting layer is less than 20 wt %. The organic electroluminescent device comprising the organic electroluminescent compound represented by formula 1 may exhibit low operating voltage, high luminous efficiency and/or long lifespan properties.

In addition, the present disclosure may provide a display system by using the compound represented by formula 1. In addition, it is possible to produce a display system or a lighting system by using the compound of the present disclosure. Specifically, it is possible to produce a display system, e.g., a display system for smartphones, tablets, notebooks, PCs, TVs, or cars, or a lighting system, e.g., an outdoor or indoor lighting system, by using the compound of the present disclosure.

Hereinafter, the preparation method of the compound according to the present disclosure will be explained in detail. However, the present disclosure is not limited to the following examples.

Example 1: Preparation of Compound D-17

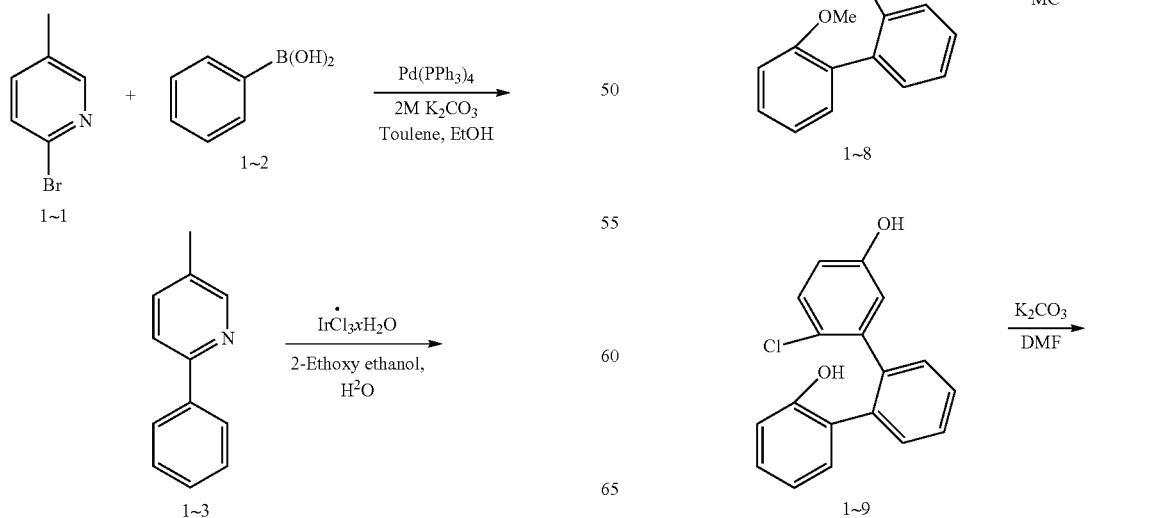

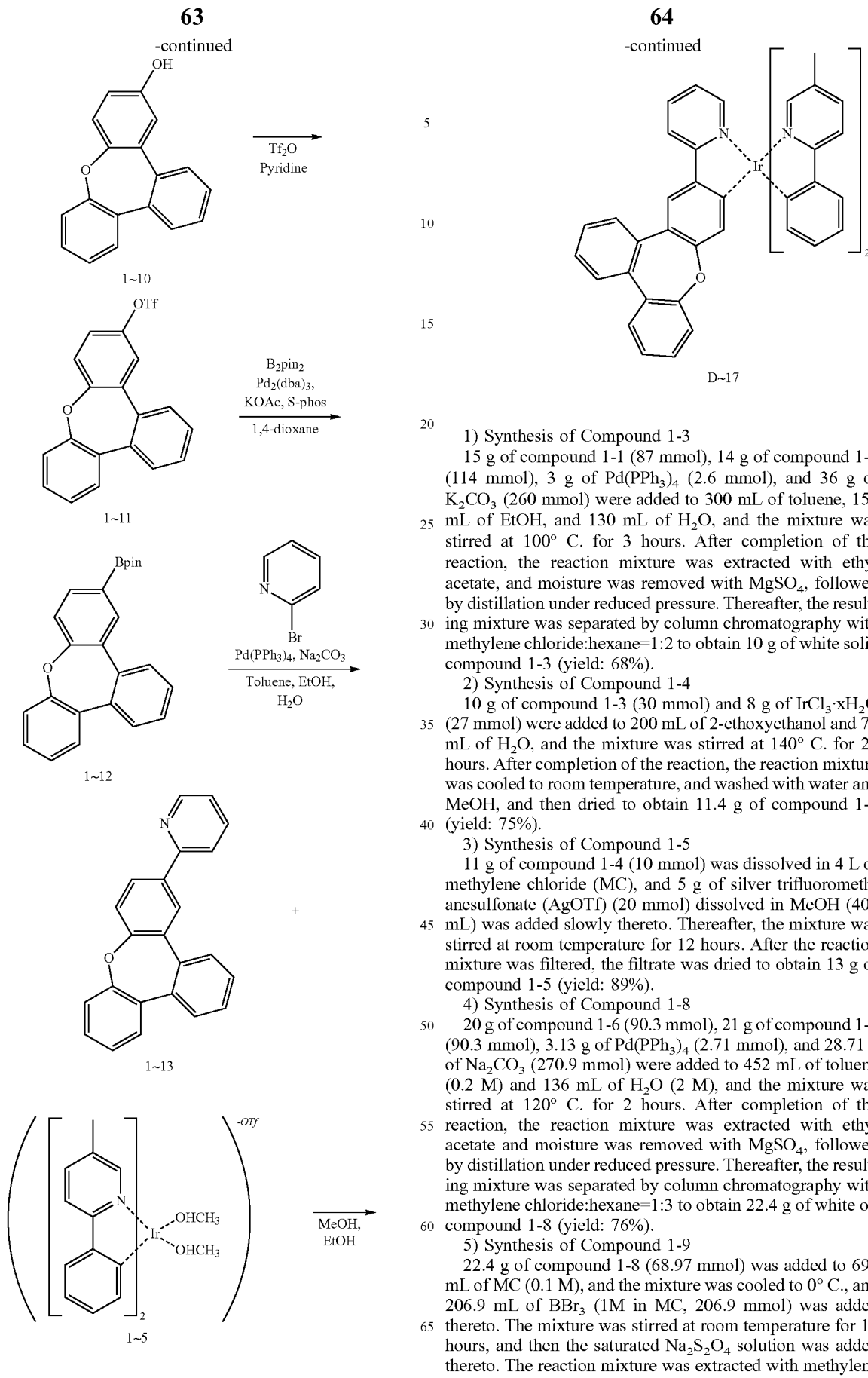

1) Synthesis of Compound 1-3

15 g of compound 1-1 (87 mmol), 14 g of compound 1-2 (114 mmol), 3 g of Pd(PPh$_3$)$_4$ (2.6 mmol), and 36 g of K$_2$CO$_3$ (260 mmol) were added to 300 mL of toluene, 150 mL of EtOH, and 130 mL of H$_2$O, and the mixture was stirred at 100° C. for 3 hours. After completion of the reaction, the reaction mixture was extracted with ethyl acetate, and moisture was removed with MgSO$_4$, followed by distillation under reduced pressure. Thereafter, the resulting mixture was separated by column chromatography with methylene chloride:hexane=1:2 to obtain 10 g of white solid compound 1-3 (yield: 68%).

2) Synthesis of Compound 1-4

10 g of compound 1-3 (30 mmol) and 8 g of IrCl$_3$·xH$_2$O (27 mmol) were added to 200 mL of 2-ethoxyethanol and 70 mL of H$_2$O, and the mixture was stirred at 140° C. for 24 hours. After completion of the reaction, the reaction mixture was cooled to room temperature, and washed with water and MeOH, and then dried to obtain 11.4 g of compound 1-4 (yield: 75%).

3) Synthesis of Compound 1-5

11 g of compound 1-4 (10 mmol) was dissolved in 4 L of methylene chloride (MC), and 5 g of silver trifluoromethanesulfonate (AgOTf) (20 mmol) dissolved in MeOH (400 mL) was added slowly thereto. Thereafter, the mixture was stirred at room temperature for 12 hours. After the reaction mixture was filtered, the filtrate was dried to obtain 13 g of compound 1-5 (yield: 89%).

4) Synthesis of Compound 1-8

20 g of compound 1-6 (90.3 mmol), 21 g of compound 1-7 (90.3 mmol), 3.13 g of Pd(PPh$_3$)$_4$ (2.71 mmol), and 28.71 g of Na$_2$CO$_3$ (270.9 mmol) were added to 452 mL of toluene (0.2 M) and 136 mL of H$_2$O (2 M), and the mixture was stirred at 120° C. for 2 hours. After completion of the reaction, the reaction mixture was extracted with ethyl acetate and moisture was removed with MgSO$_4$, followed by distillation under reduced pressure. Thereafter, the resulting mixture was separated by column chromatography with methylene chloride:hexane=1:3 to obtain 22.4 g of white oil compound 1-8 (yield: 76%).

5) Synthesis of Compound 1-9

22.4 g of compound 1-8 (68.97 mmol) was added to 690 mL of MC (0.1 M), and the mixture was cooled to 0° C., and 206.9 mL of BBr$_3$ (1M in MC, 206.9 mmol) was added thereto. The mixture was stirred at room temperature for 12 hours, and then the saturated Na$_2$S$_2$O$_4$ solution was added thereto. The reaction mixture was extracted with methylene chloride and moisture was removed with MgSO$_4$. Thereafter, the residue was distilled under reduced pressure and separated by column chromatography with methylene chloride:hexane=1:1 to obtain 18.6 g of yellow oil compound 1-9 (yield: 91%).

6) Synthesis of Compound 1-10

17.6 g of compound 1-9 (59.31 mmol) and 8.2 g of K$_2$CO$_3$ (59.31 mmol) were added to 297 mL of DMF (0.2M), and the mixture was stirred under reflux at 185° C. for 12 hours. The reaction mixture was extracted with ethyl acetate and moisture was removed with MgSO$_4$, followed by distillation under reduced pressure. Thereafter, the resulting mixture was separated by column chromatography with methylene chloride:hexane=2:1 to obtain 10.1 g of white oil compound 1-10 (yield: 65%).

7) Synthesis of Compound 1-11

10.1 g of compound 1-10 (38.8 mmol) was added to 78 mL of pyridine (0.5M), and the mixture was cooled to 0° C., and 13.68 g of Tf$_2$O (48.5 mmol) was added slowly thereto. The reaction mixture was stirred for 12 hours and 300 mL of water was added thereto. The resulting solid was dissolved with CHCl$_3$ and was extracted, and then moisture was removed. Thereafter, the resulting mixture was separated by column chromatography with methylene chloride hexane=1:1 to obtain 13.9 g of white oil compound 1-11 (yield: 91%).

8) Synthesis of Compound 1-12

13.9 g of compound 1-11 (35.43 mmol), 10.8 g of bis(pinacolato)diboron (B$_2$pin$_2$) (42.51 mmol), 8.69 g of KOAc (88.58 mmol), 1.45 g of s-phos (3.543 mmol), and 1.62 g of Pd$_2$(dba)$_3$ (1.77 mmol) were added to 177 mL of 1,4-dioxane (0.2 M), and the mixture was stirred under reflux at 130° C. for 3 hours. After completion of the reaction, the reaction mixture was cooled to room temperature and was filtered through celite. The filtrate was separated by column chromatography with methylene chloride:hexane=2:1 to obtain 7.0 g of compound 1-12 (yield: 54%).

9) Synthesis of Compound 1-13

13.9 g of compound 1-12 (35.43 mmol), 2.89 g of 2-bromopyridine (18.26 mmol), 633 mg of Pd(PPh$_3$)$_4$ (0.55 mmol), and 5.8 g of Na$_2$CO$_3$ (54.78 mmol) were added to 90 mL of toluene (0.2 M), 45 mL of EtOH, and 27 mL of H$_2$O (2 M), and the mixture was stirred at 110° C. for 4 hours. After completion of the reaction, the reaction mixture was extracted with ethyl acetate, and moisture was removed with MgSO$_4$, followed by distillation under reduced pressure. Thereafter, the resulting mixture was separated by column chromatography with methylene chloride:hexane=3:1 to obtain 4.2 g of yellow solid compound 1-13 (yield: 45%).

10) Synthesis of Compound D-17

4.2 g of compound 1-13 (13.07 mmol) and 4.85 g of compound 1-5 (6.53 mmol) were added to 100 mL of MeOH and 50 mL of EtOH, and the mixture was stirred under reflux at 90° C. for 12 hours. After cooling to room temperature, the mixture was filtered and then separated by column chromatography with chloroform to obtain 1.5 g of compound D-17 (yield: 27%).

The physical properties of compound D-17 prepared as described above are as follows.

| Compound | MW | UV | PL | M.P. |
| --- | --- | --- | --- | --- |
| D-17 | 849.03 g/mol | 290 nm | 507 nm | Higher than 400° C. |

Figure 2:
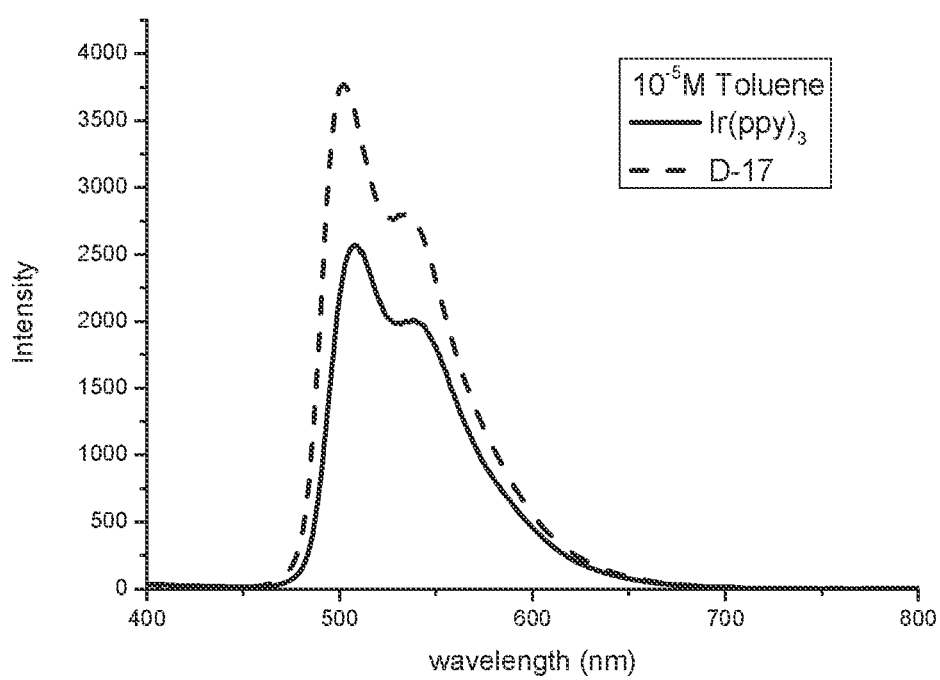
FIG. 2 illustrates a graph comparing compound D-17, which corresponds to one embodiment of the present disclosure, with Ir(ppy)$_3$, which corresponds to the comparative compound, in terms of PL intensity with respect to wavelength.

FIG. 2 illustrates a graph comparing compound D-17, which corresponds to one embodiment of the present disclosure, with Ir(ppy)$_3$, which corresponds to the comparative compound, in terms of PL intensity with respect to wavelength. Compound D-17 of the present disclosure shows a PL intensity higher than the comparative compound, Ir(ppy)$_3$, at the same wavelength. Since the quantum efficiency of the target material is proportional to the product of the ratio of the target material to a standard emission spectrum, and a standard quantum efficiency, a material having a high PL intensity has a large integrated value of the emission spectrum, and thus has high quantum efficiency. Accordingly, it can be confirmed that the organic electroluminescent compound of the present disclosure has luminescence characteristics superior to conventional materials.

The invention claimed is:

1. An organic electroluminescent compound represented by the following formula 1:

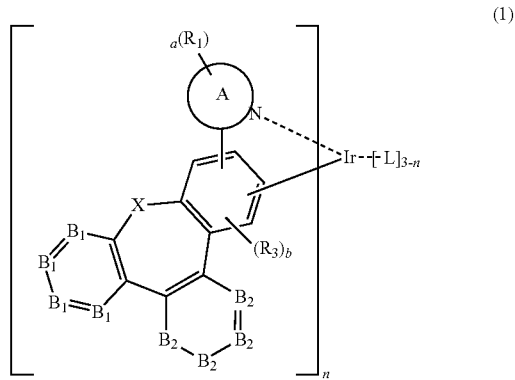

(1)

wherein ring A represents a N-containing (3- to 10-membered) heteroaryl;

B$_1$ and B$_2$, each independently, represent CR$_2$ or N, where each of B$_1$ and each of B$_2$ may be the same or different;

X represents O or S;

L represents any one selected from the following formulas 2-1 and 2-2;

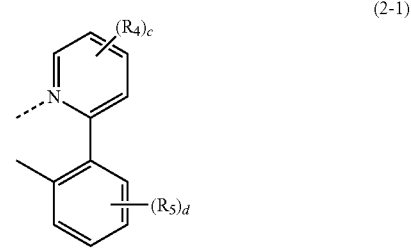

(2-1)

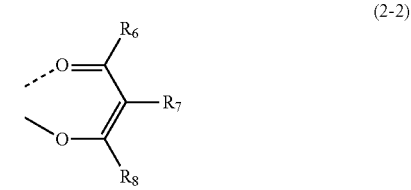

(2-2)

R$_1$ to R$_8$, each independently, represent hydrogen, deuterium, a substituted or unsubstituted (C1-C30)alkyl, a substituted or unsubstituted (C1-C30)alkoxy, a substituted or unsubstituted (C2-C30)alkenyl, a substituted or unsubstituted (C2-C30)alkynyl, a substituted or unsubstituted (C6-C30)aryl(C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino;

n represents an integer of 1 to 3;

a represents an integer of 1 to 6; b represents an integer of 1 or 2; and c and d, each independently, represent an integer of 1 to 4; where if a to d, each independently, are an integer of 2 or more, each of $R_1$, each of $R_3$, each of $R_4$, and each of $R_5$ may be the same or different.

2. The organic electroluminescent compound according to claim 1, wherein the substituents of the substituted (C1-C30)alkyl, the substituted (C1-C30)alkoxy, the substituted (C2-C30)alkenyl, the substituted (C2-C30)alkynyl, the substituted (C6-C30)aryl(C1-C30)alkyl, the substituted (C6-C30)aryl, the substituted (3- to 30-membered)heteroaryl, the substituted (C3-C30)cycloalkyl, the substituted tri(C1-C30)alkylsilyl, the substituted di(C1-C30)alkyl(C6-C30)arylsilyl, the substituted (C1-C30)alkyldi(C6-C30)arylsilyl, the substituted tri(C6-C30)arylsilyl, the substituted mono- or di-(C1-C30)alkylamino, the substituted mono- or di-(C6-C30)arylamino, and the substituted (C1-C30)alkyl(C6-C30)arylamino in $R_1$ to $R_8$, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino unsubstituted or substituted with a (C1-C30)alkyl(s); a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl.

3. The organic electroluminescent compound according to claim 1, wherein ring A represents an imidazolyl, a thiadiazolyl, a triazolyl, a pyrazolyl, a pyridyl, a quinolyl, or an isoquinolyl; and $R_1$ to $R_8$, each independently, represent hydrogen, deuterium, or a (C1-C30)alkyl unsubstituted or substituted with at least one deuterium.

4. The organic electroluminescent compound according to claim 1, wherein the formula 1 is represented by any one of the following formulas 3 and 4:

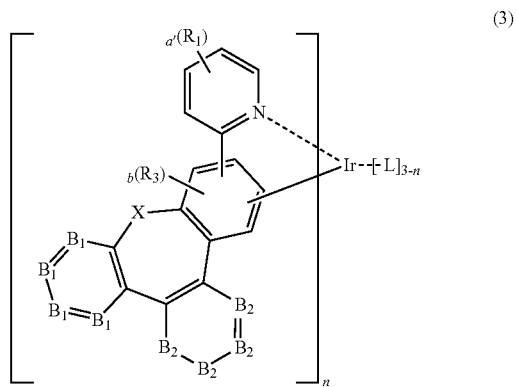

(3)

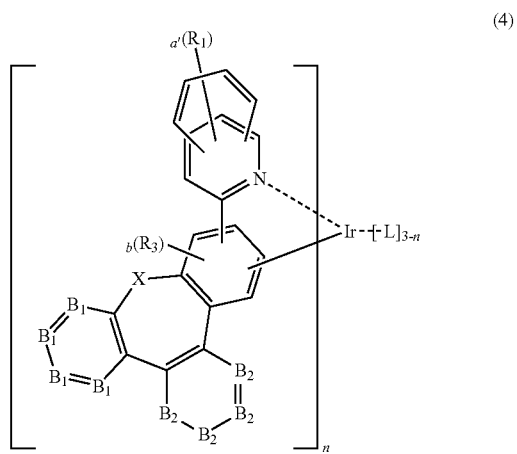

(4)

wherein, $B_1$, $B_2$, X, L, $R_1$, $R_3$, n, a and b are as defined in claim 1; and a' represents an integer of 1 to 4; where if a' is an integer of 2 or more, each of $R_1$ may be the same or different.

5. The organic electroluminescent compound according to claim 1, wherein the formula 1 is represented by any one of the following formulas 5 to 8:

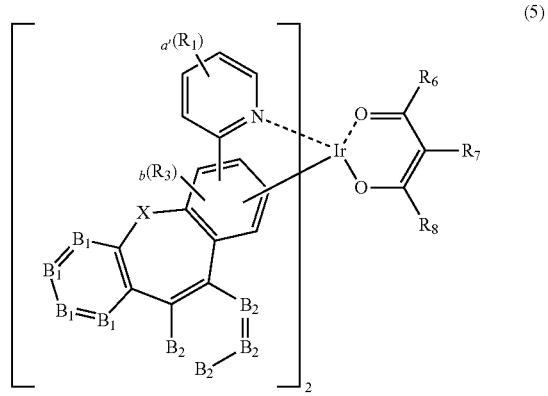

(5)

-continued (6)

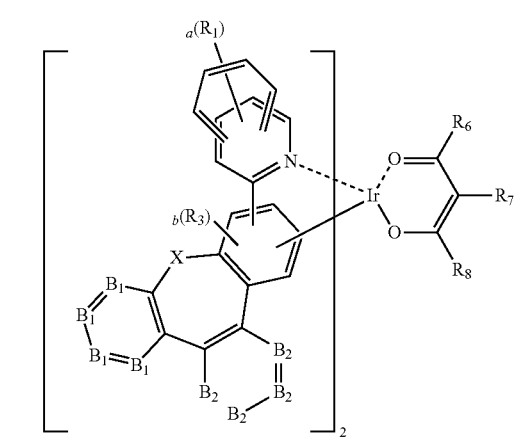

(7)

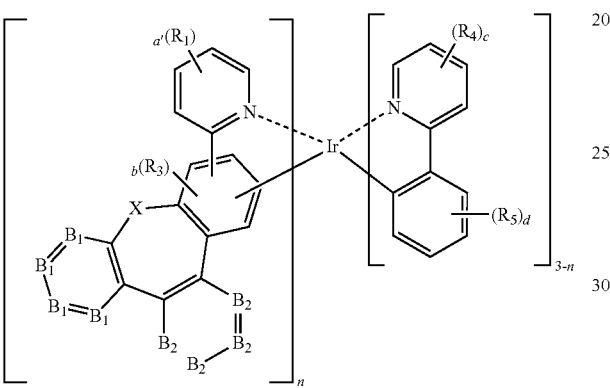

(8)

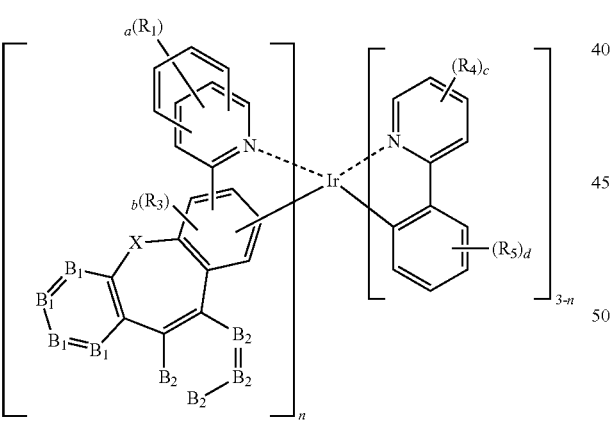

wherein, n represents an integer of 1 or 3;

$B_1$, $B_2$, X, $R_1$, $R_3$ to $R_8$, and a to d are as defined in claim 1; and a' represents an integer of 1 to 4; where if a' is an integer of 2 or more, each of $R_1$ may be the same or different.

6. The organic electroluminescent compound according to claim 1, wherein the compound represented by the formula 1 is any one selected from the group consisting of the following compounds:

D-1

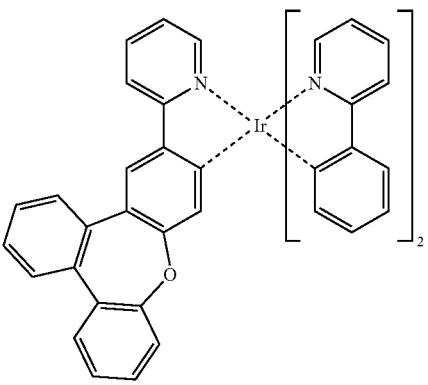

D-2

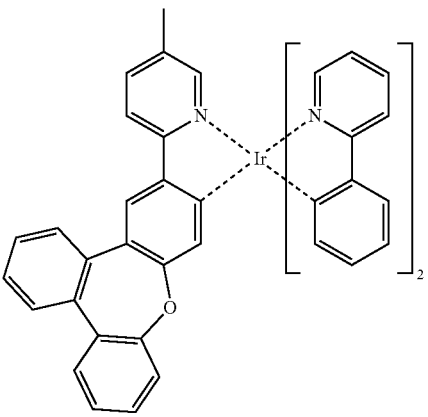

D-3

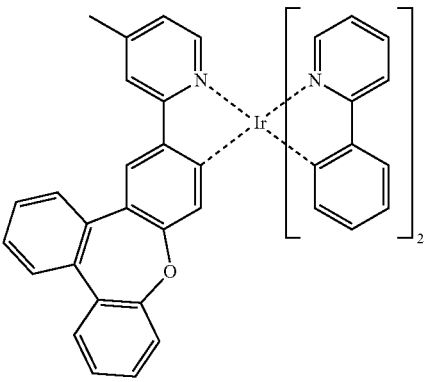

D-4

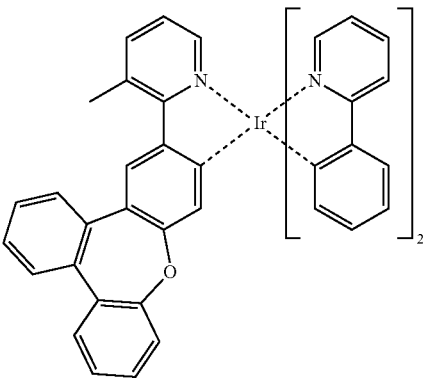

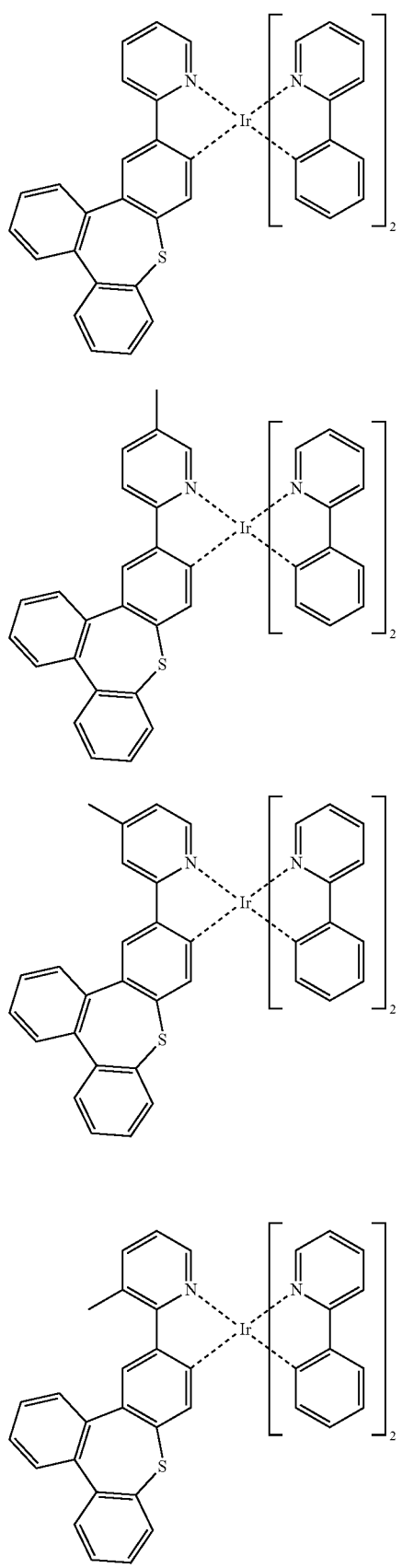
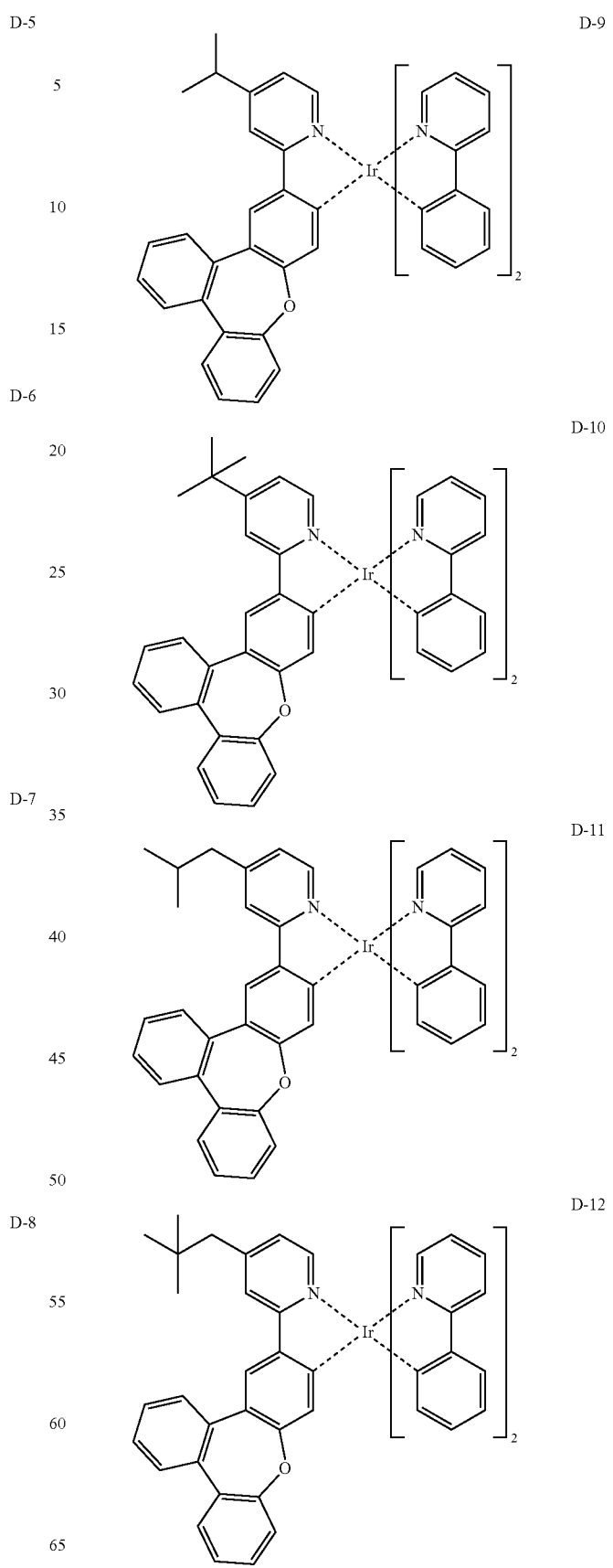

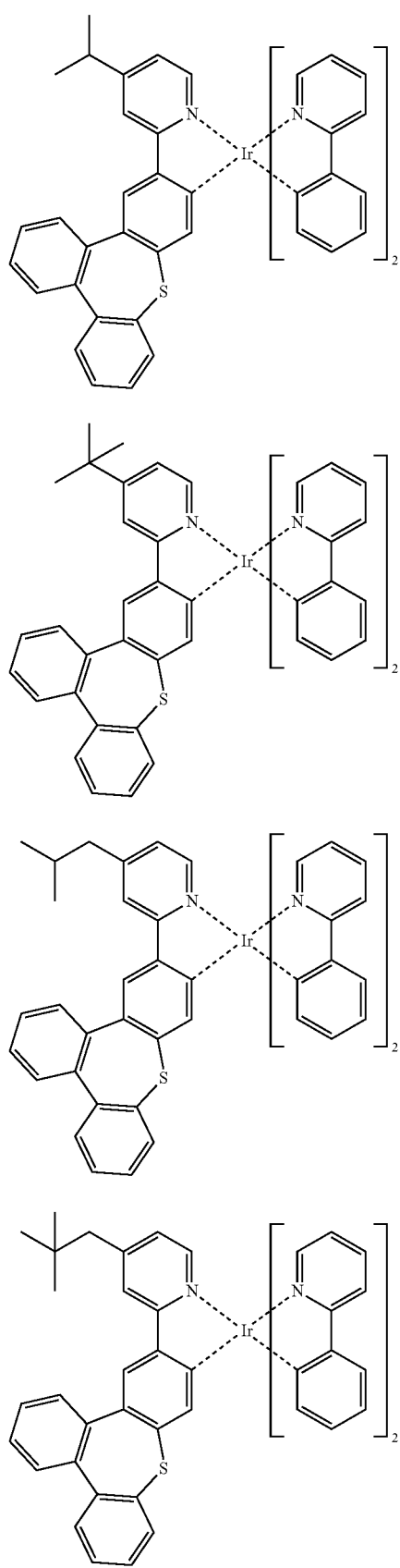
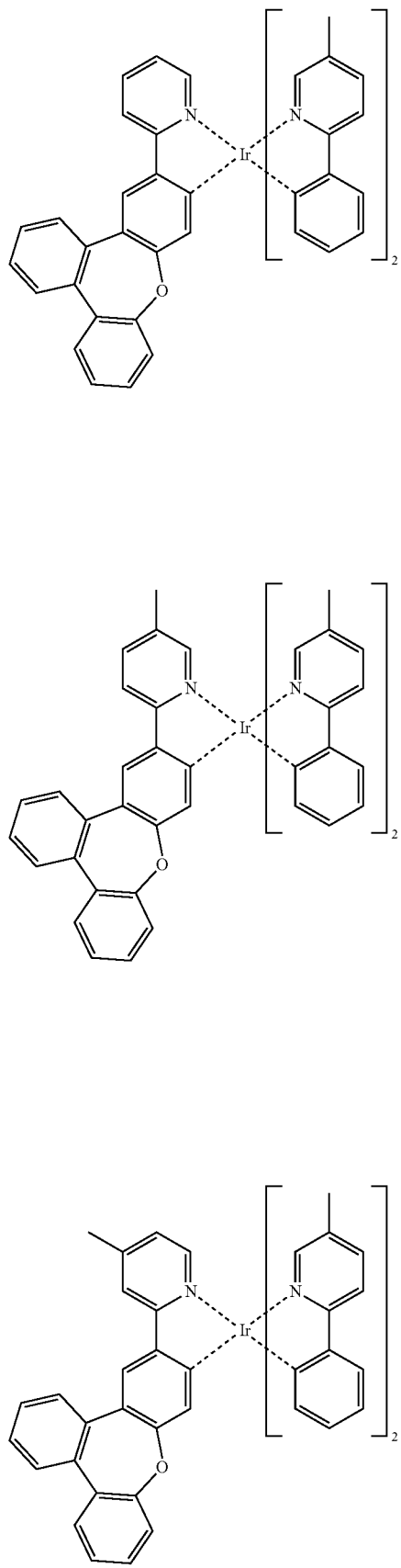

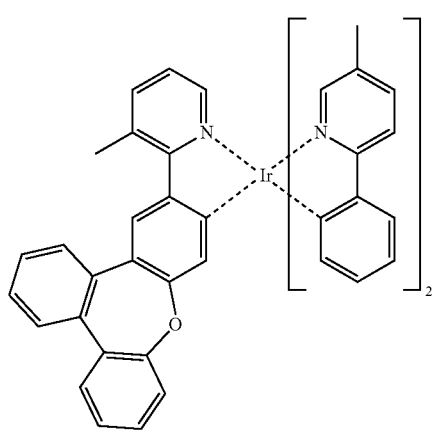
D-20
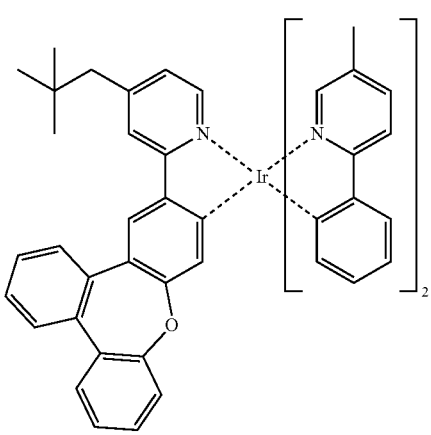
D-23
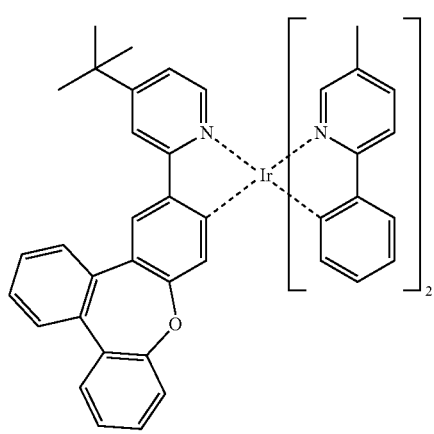
D-21
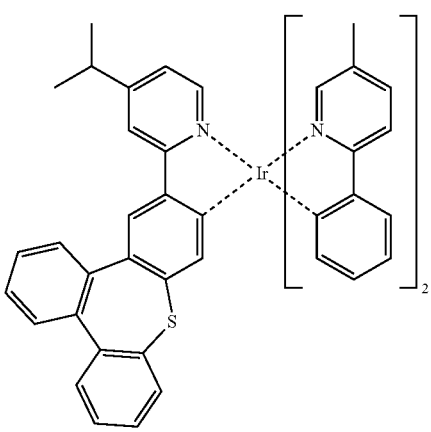
D-24
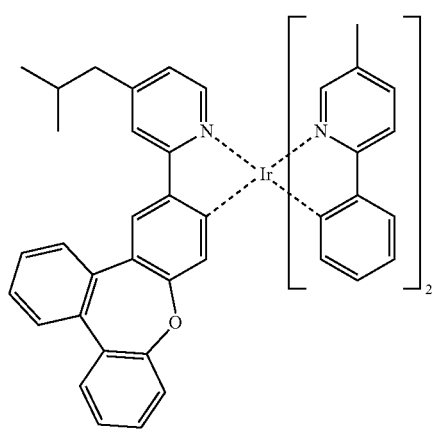
D-22
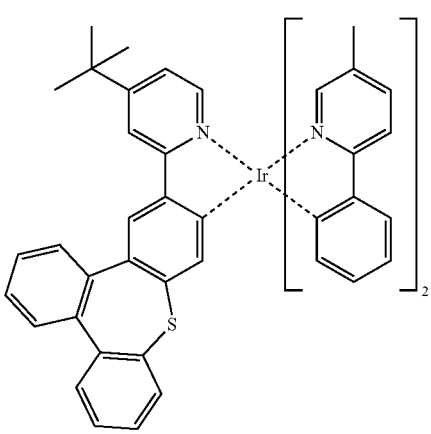
D-25

D-26
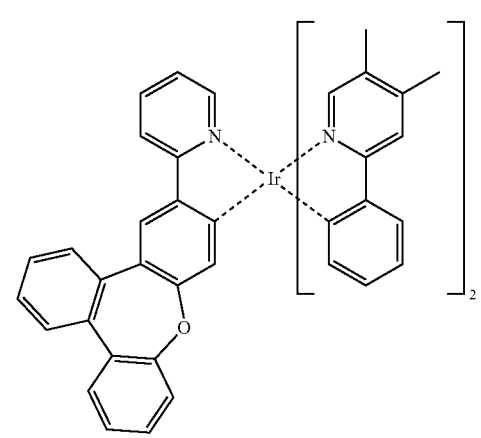
D-27
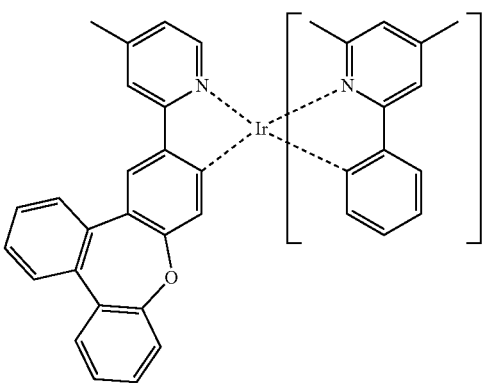
D-28
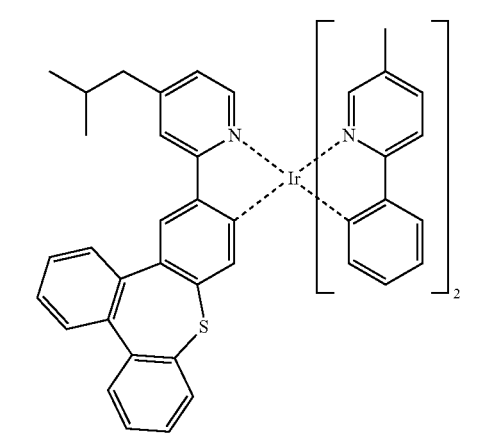
D-29
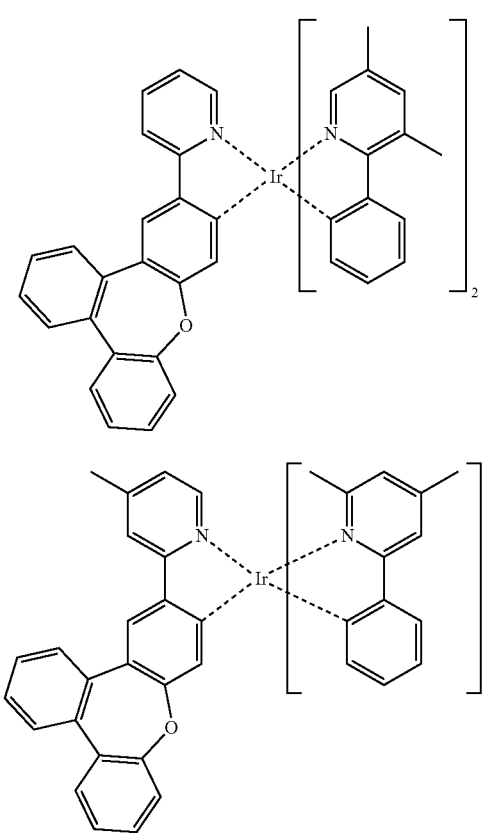
D-30
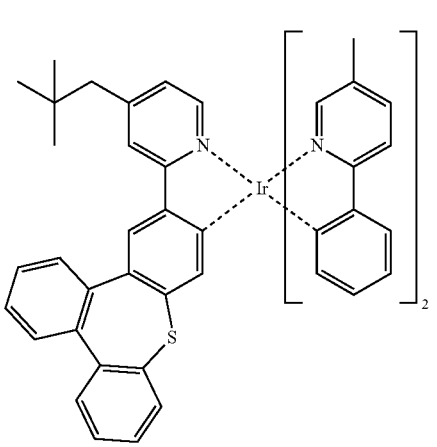
D-31
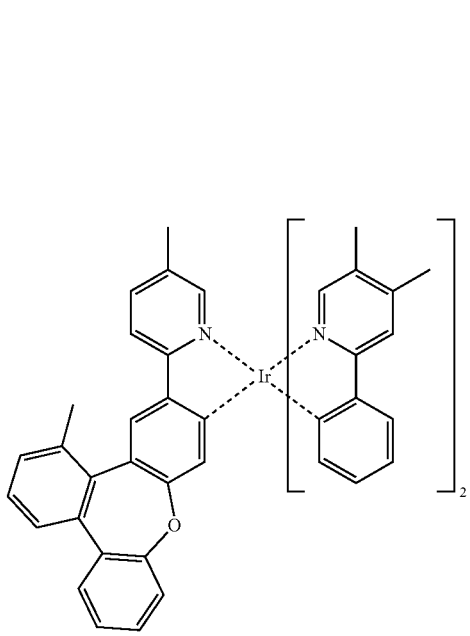
D-32
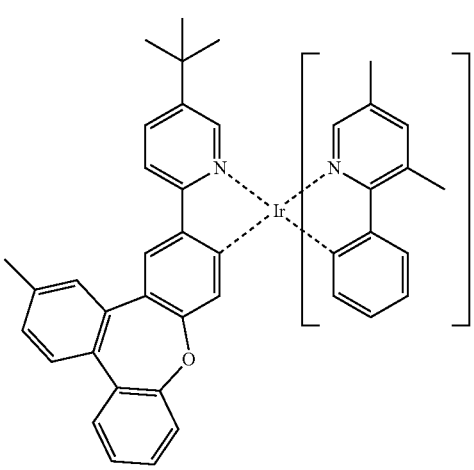

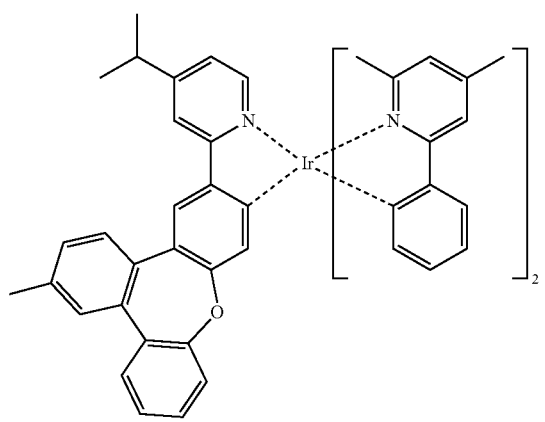
D-33
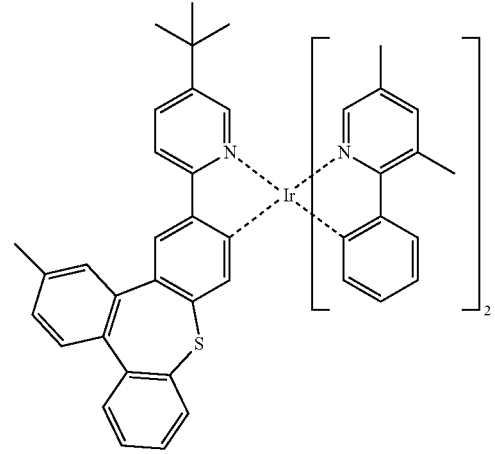
D-36
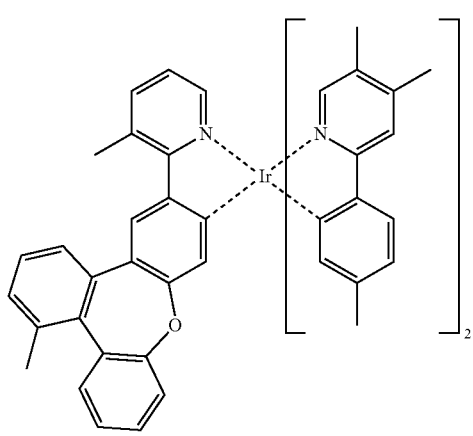
D-34
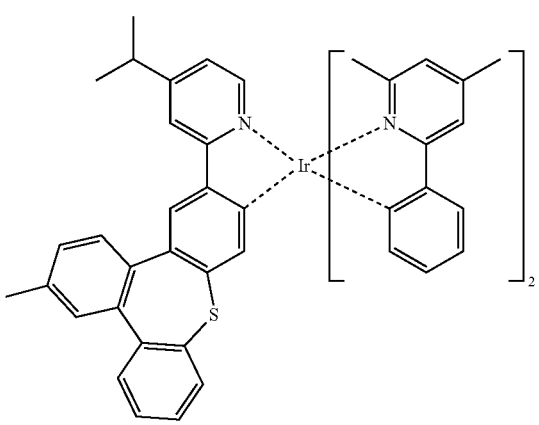
D-37
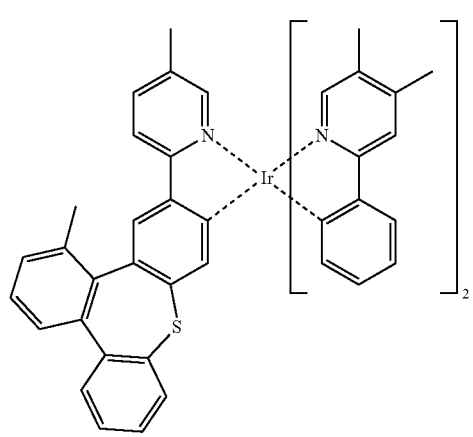
D-35
D-38

D-39
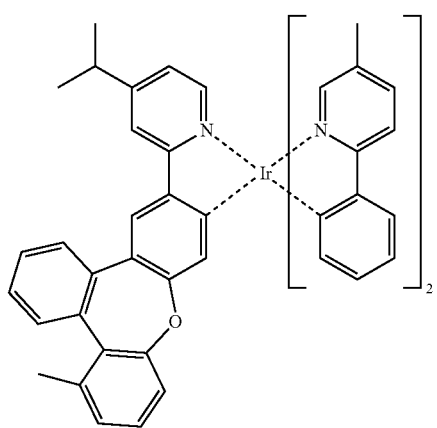
D-40
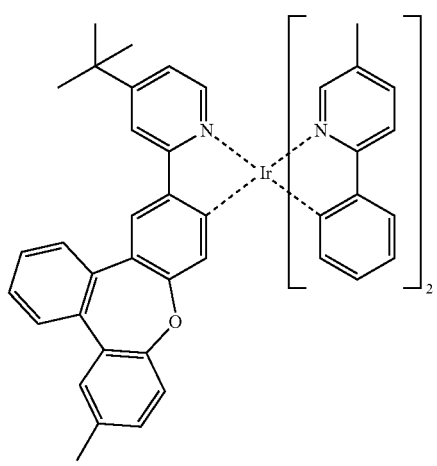
D-41
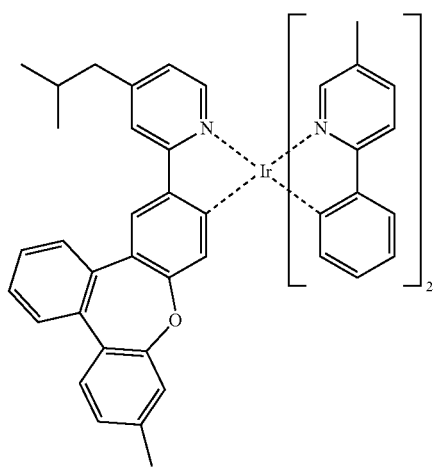
D-42
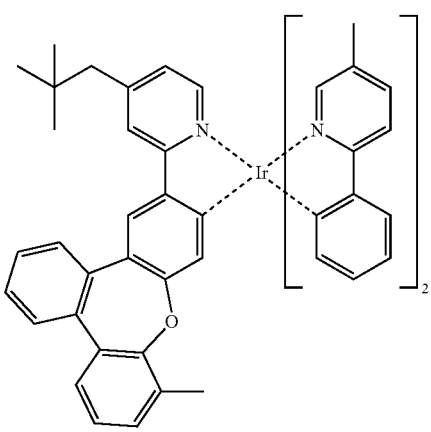
D-43
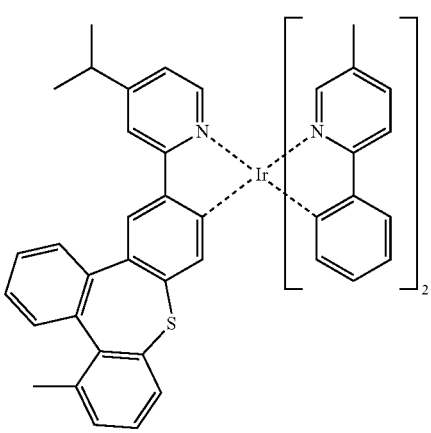
D-44
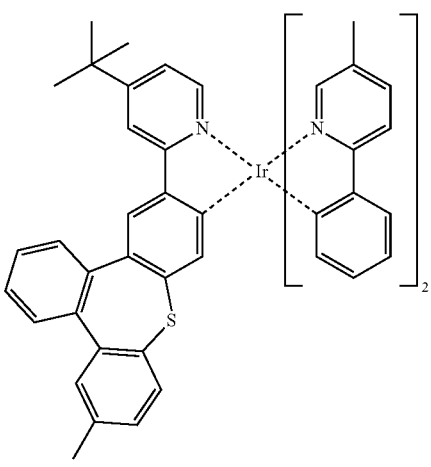

D-45
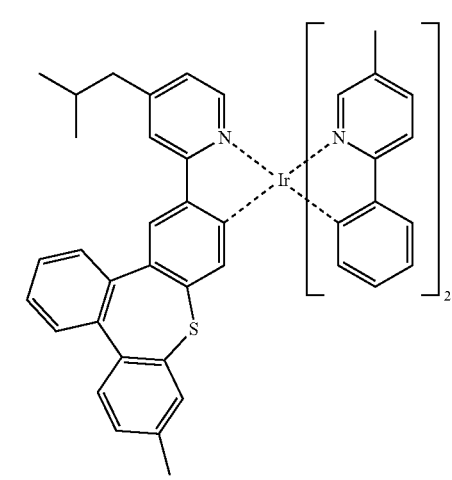
D-46
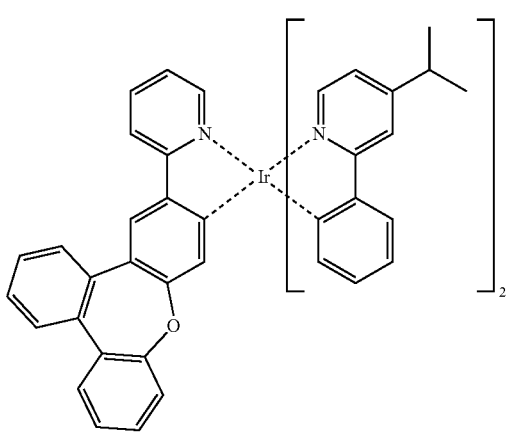
D-47
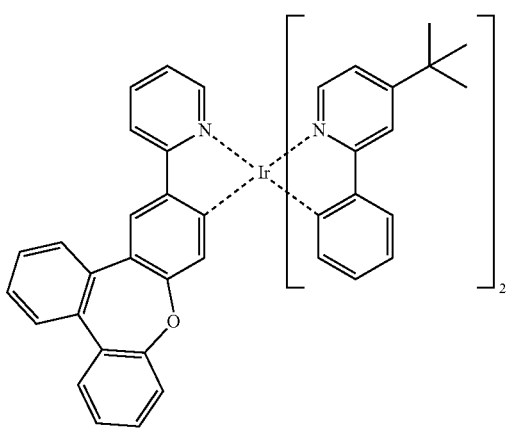
D-48
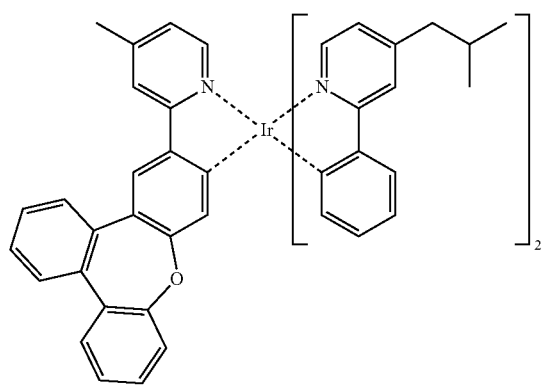
D-49
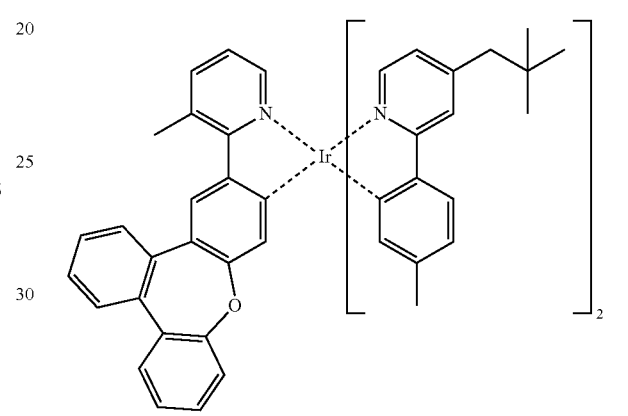
D-50
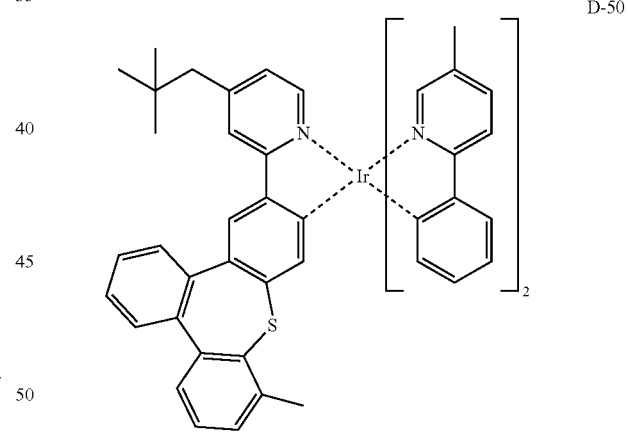
D-51
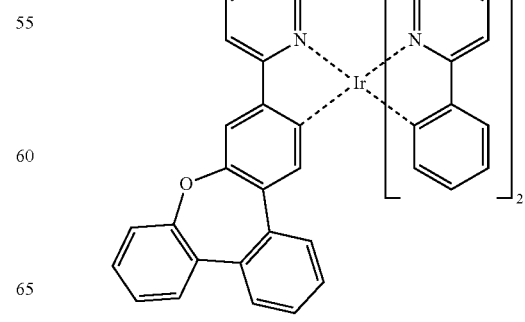

-continued
D-52
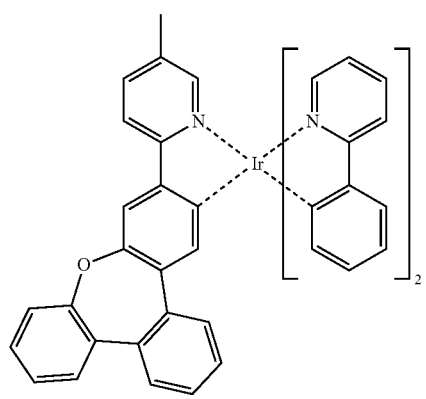
D-53
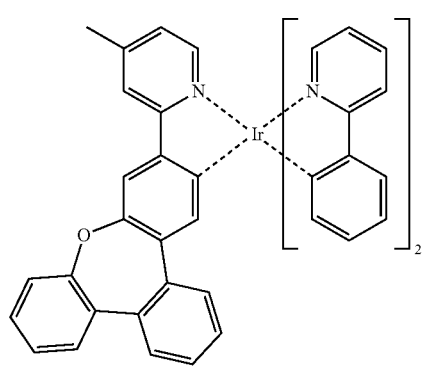
D-54
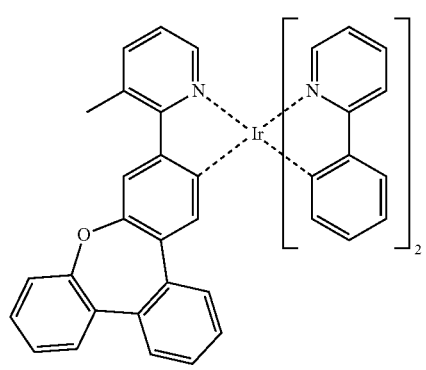
D-55
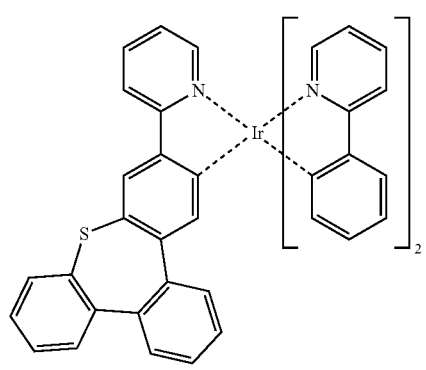
-continued
D-56
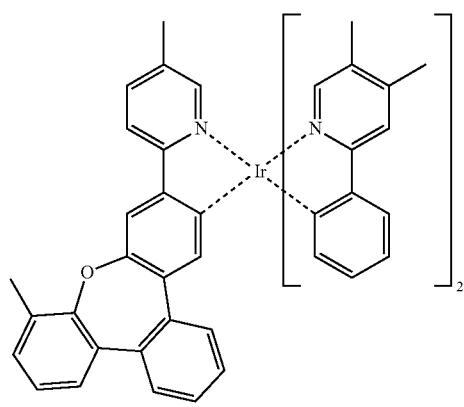
D-57
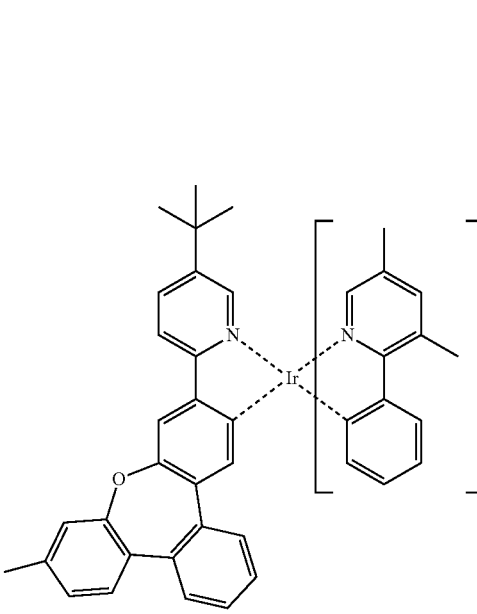
D-58
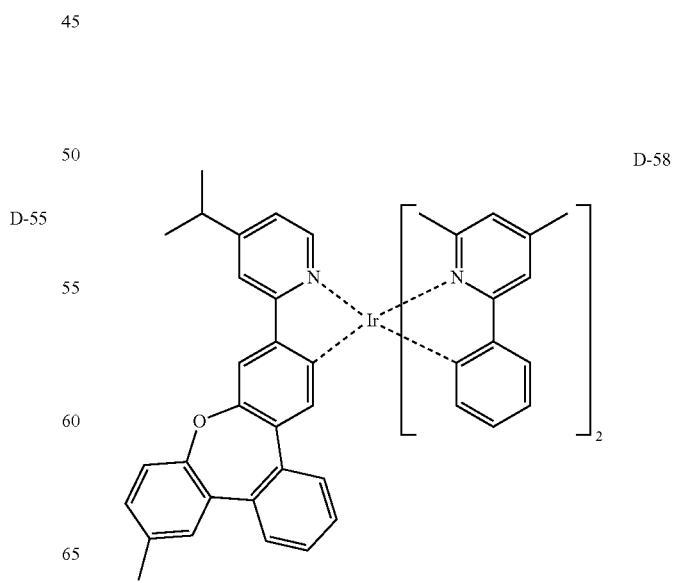

D-59
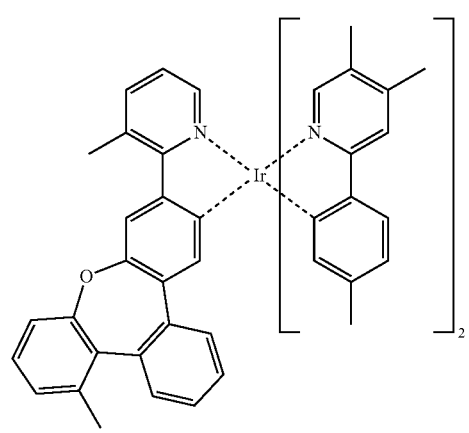
D-60
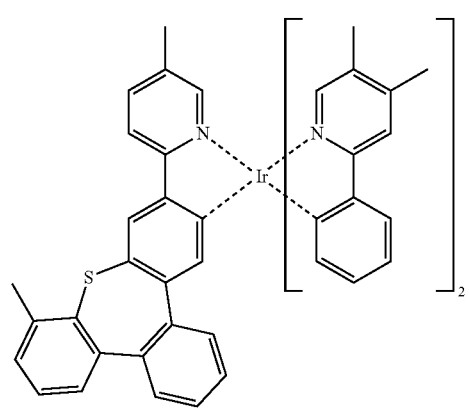
D-61
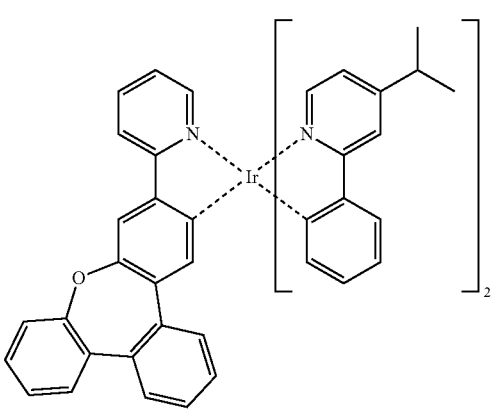
D-62
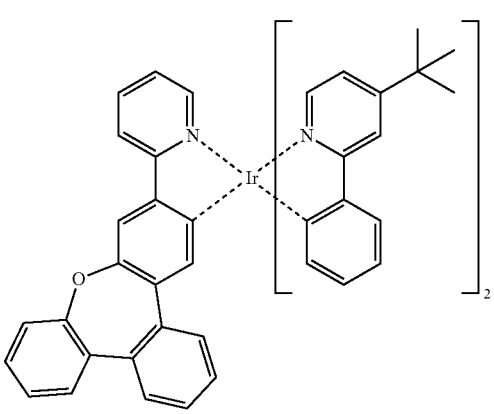
D-63
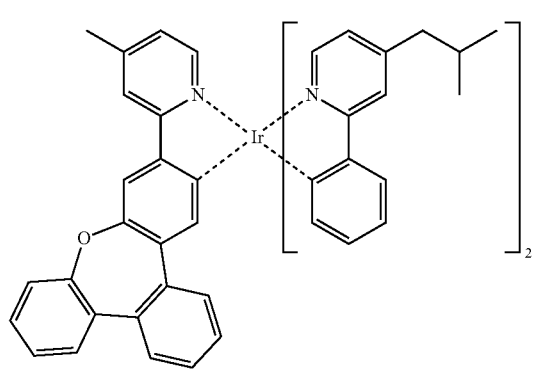
D-64
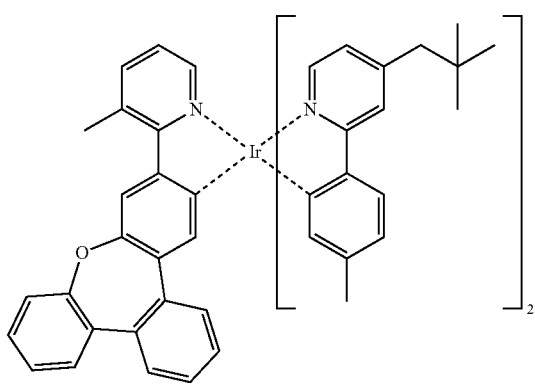
D-65
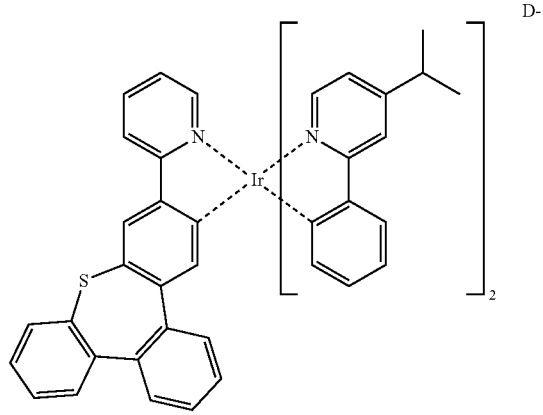
D-66
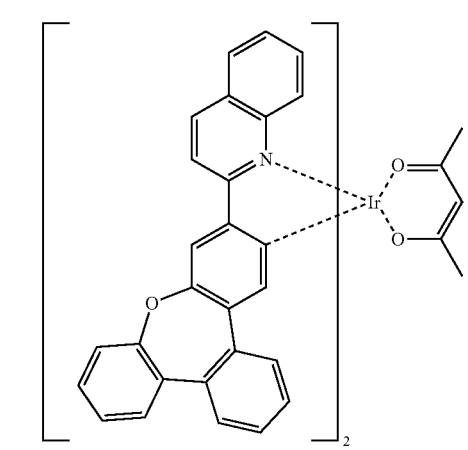

D-67
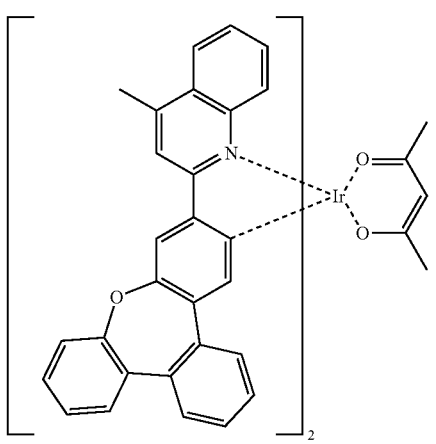
D-68
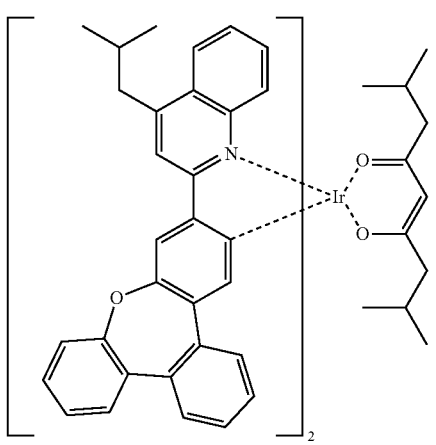
D-69
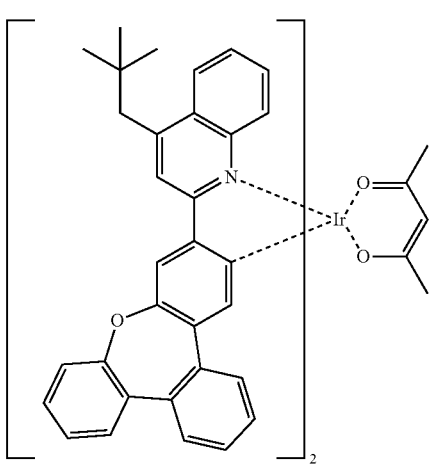
D-70
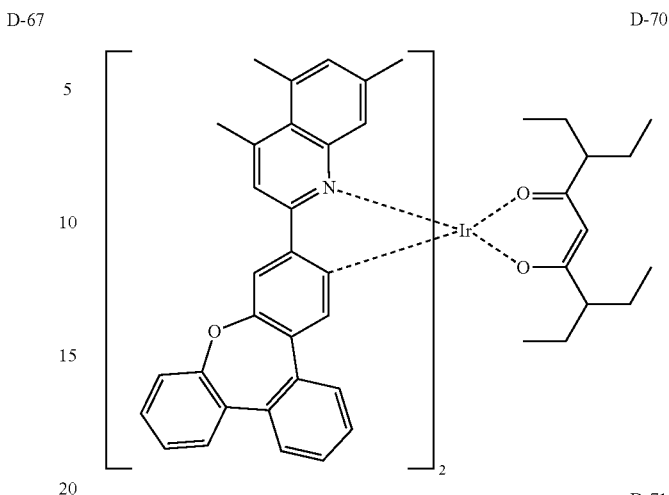
D-71
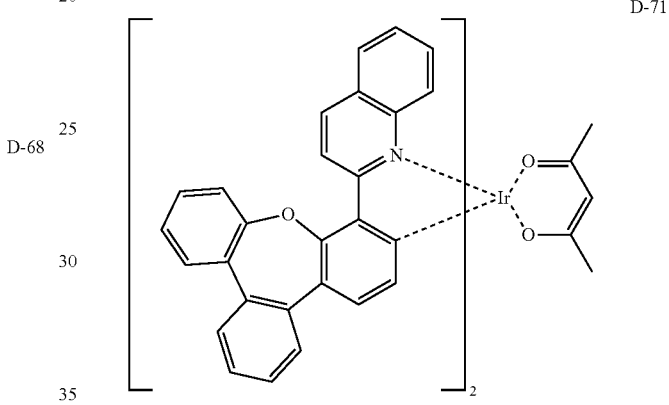
D-72
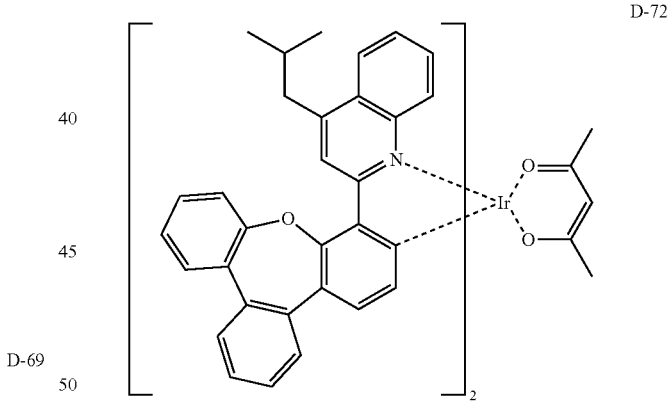
D-73
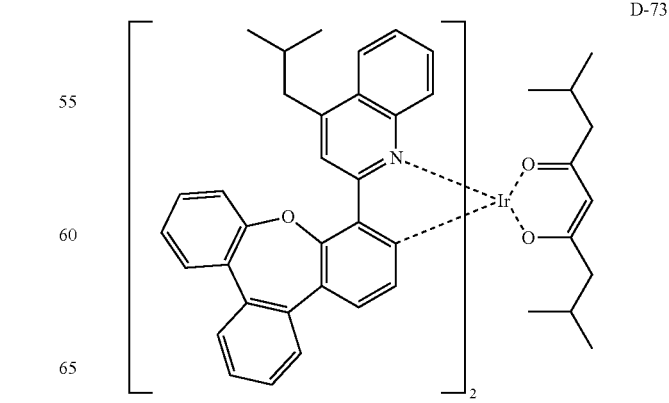

D-74
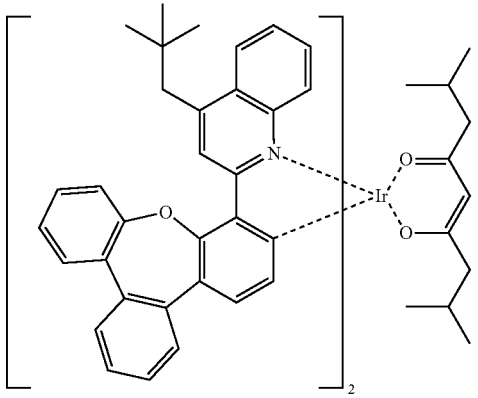
D-78
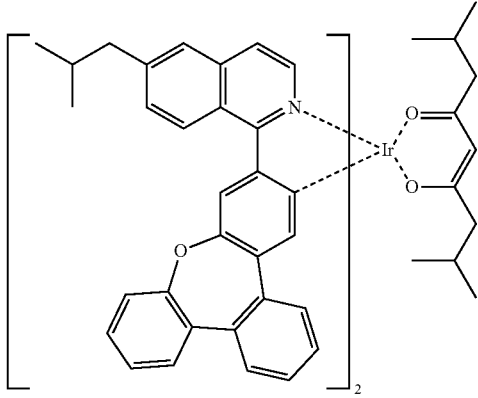
D-75
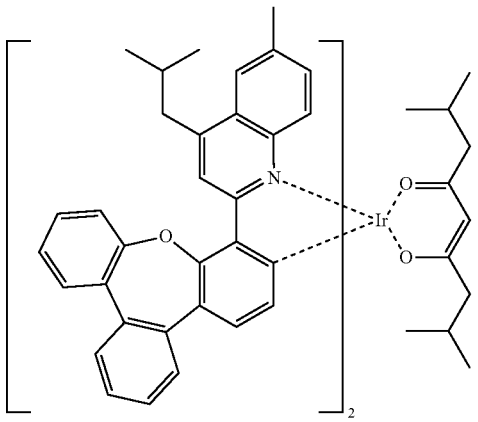
D-79
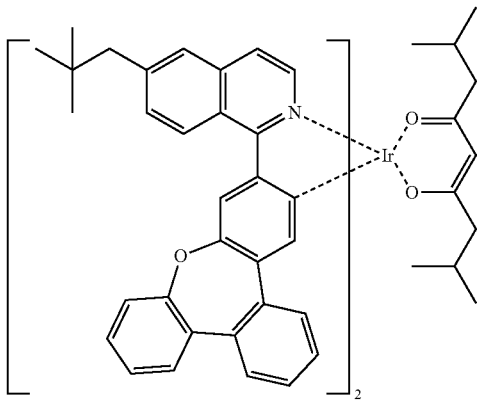
D-76
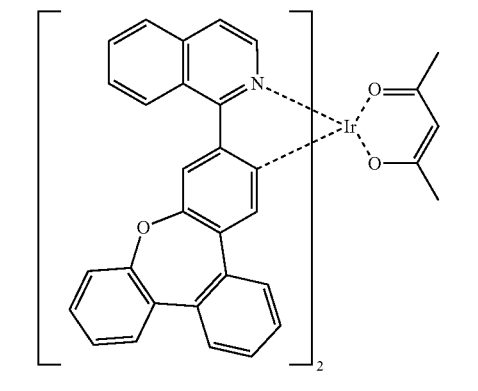
D-80
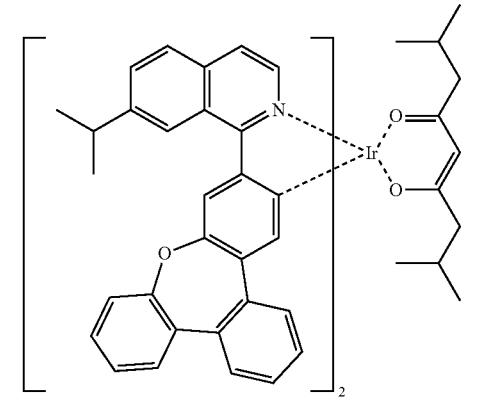
D-77
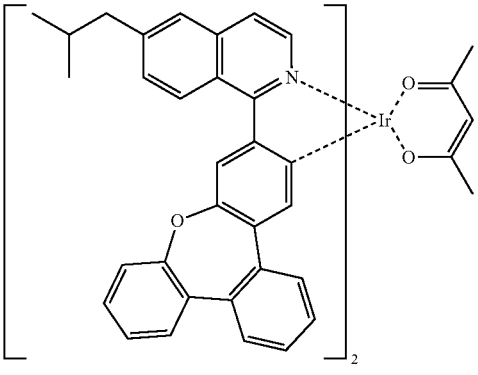
D-81
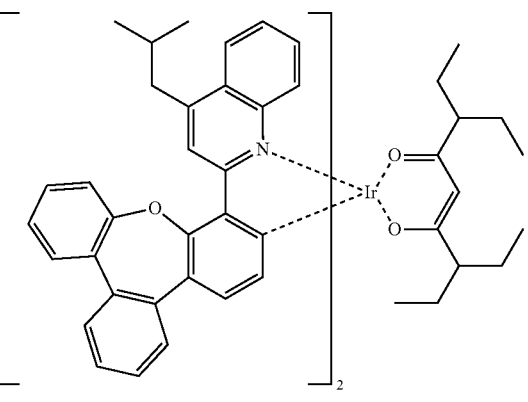

D-82
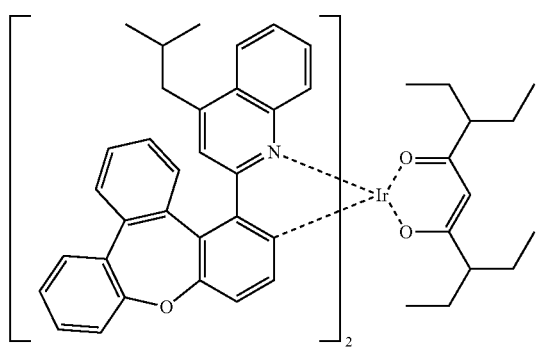
D-83
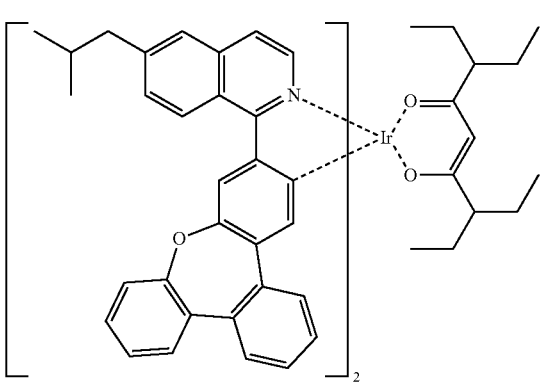
D-84
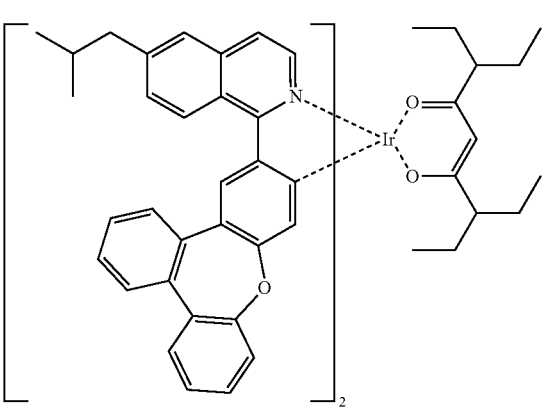
D-85
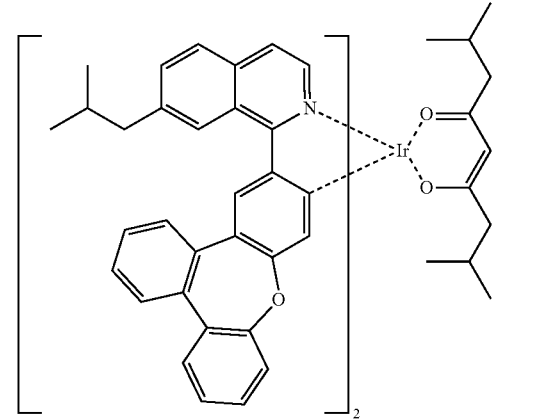
D-86
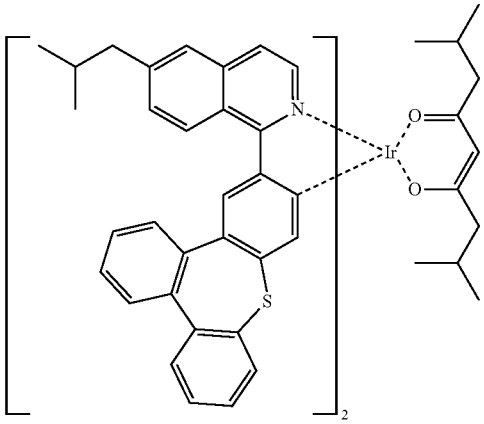
D-87
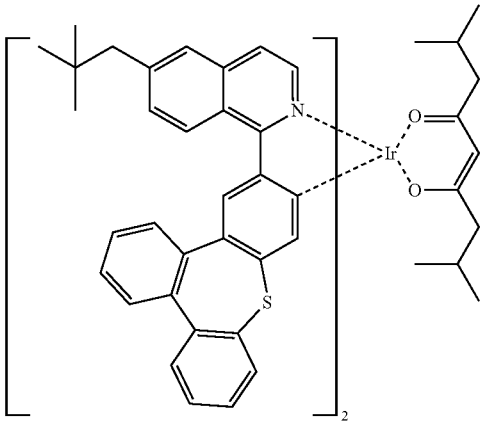
D-88
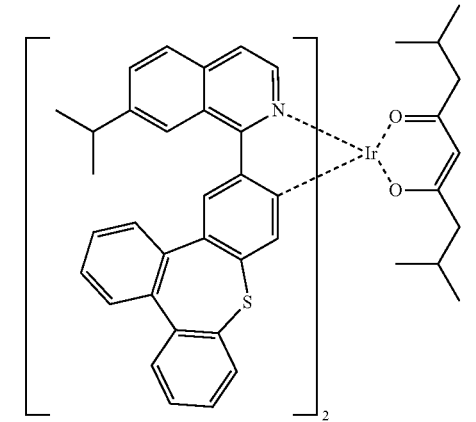

D-89
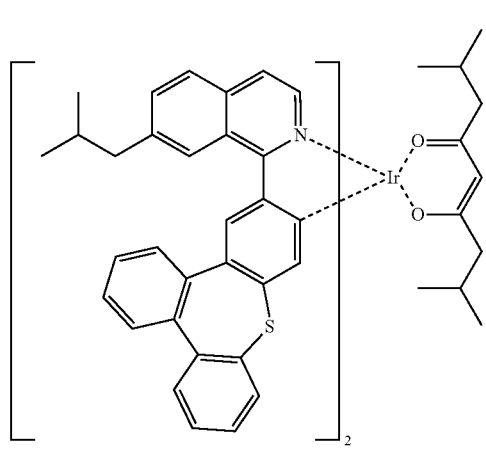
D-90
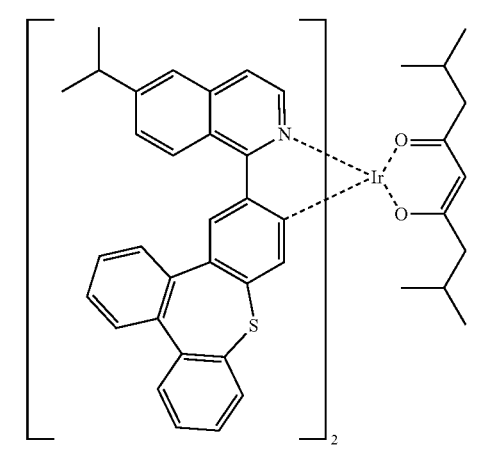
D-91
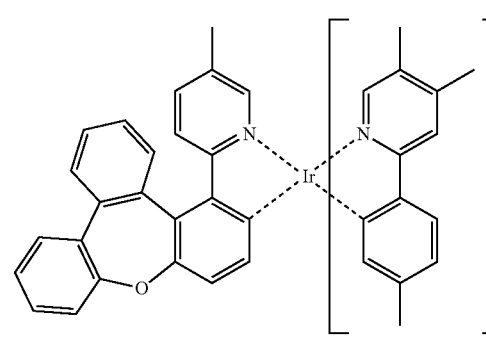
D-92
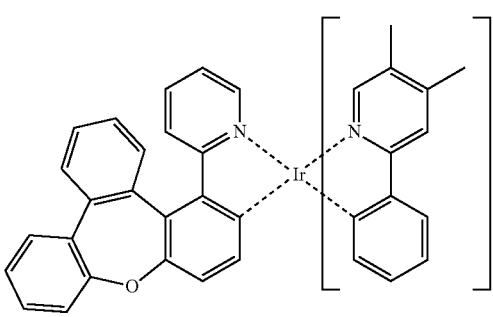
D-93
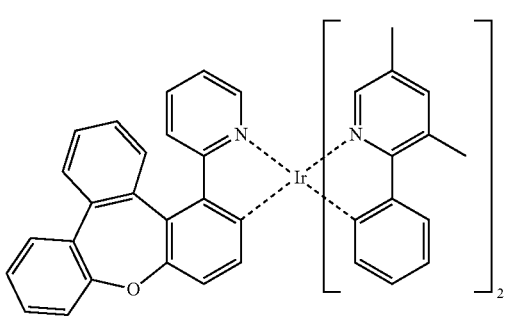
D-94, D-95
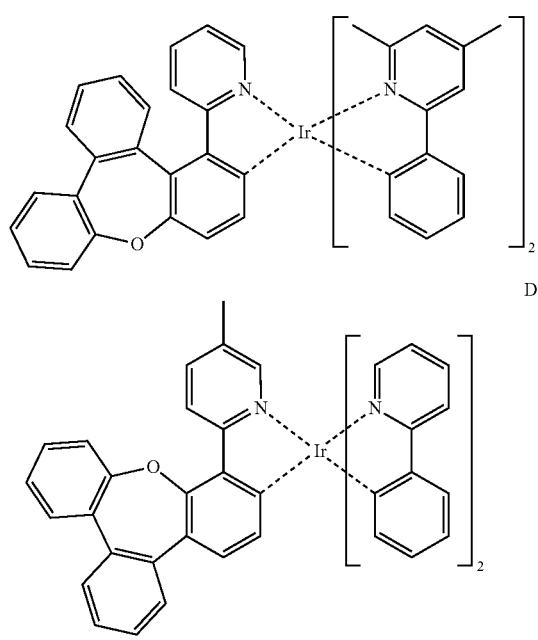
D-96
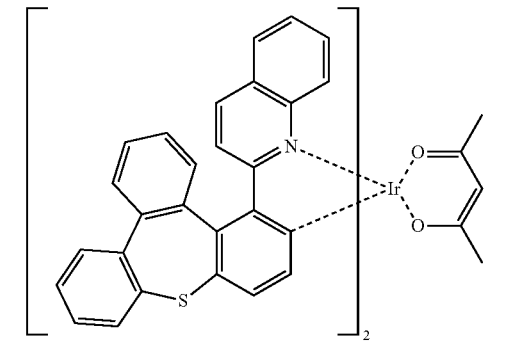
D-97
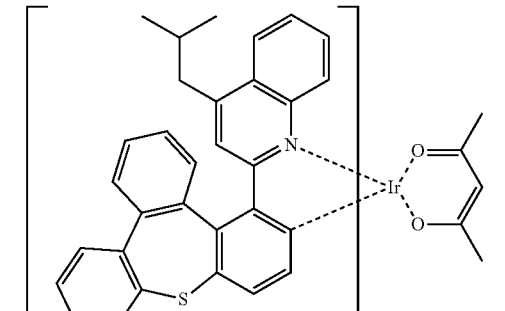

D-98
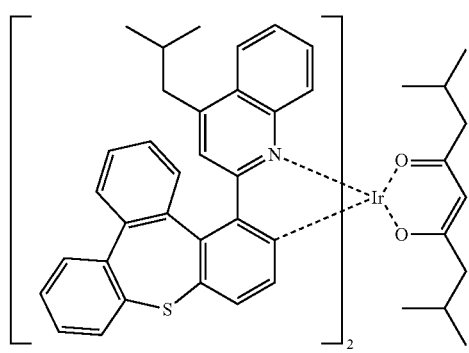
D-99
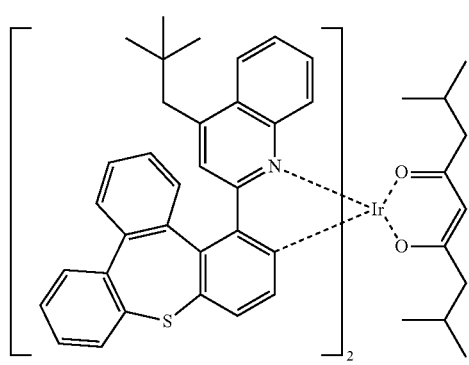
D-100
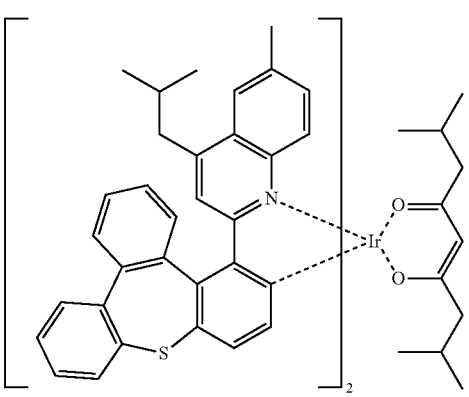
D-101
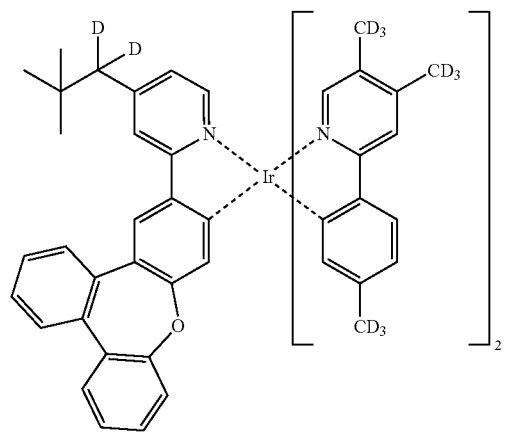
D-102
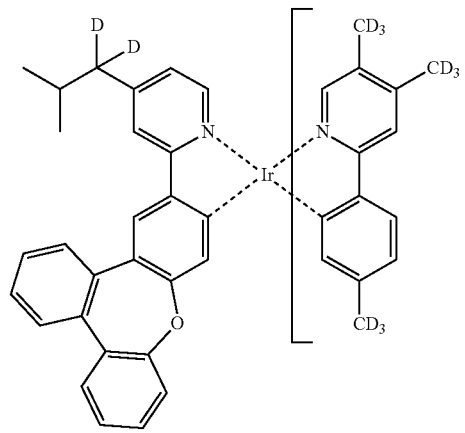
D-103
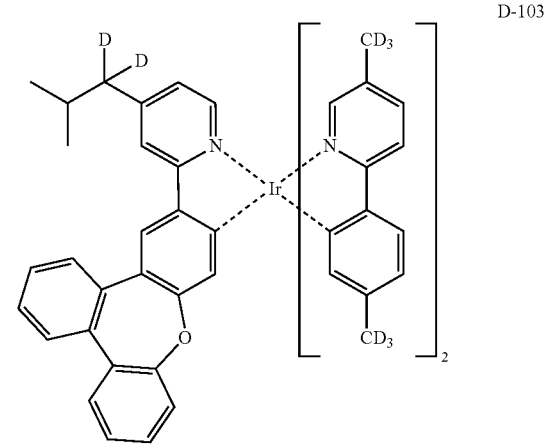
D-104
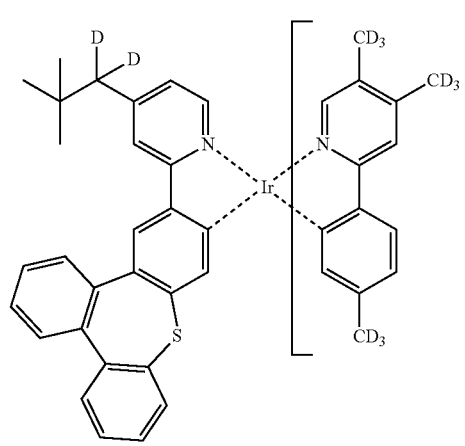

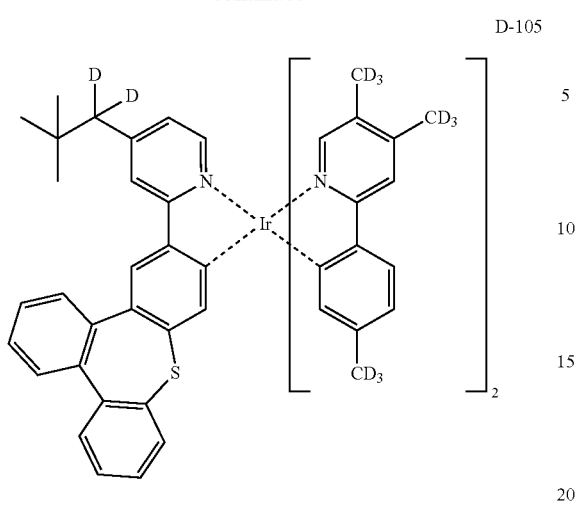
D-105
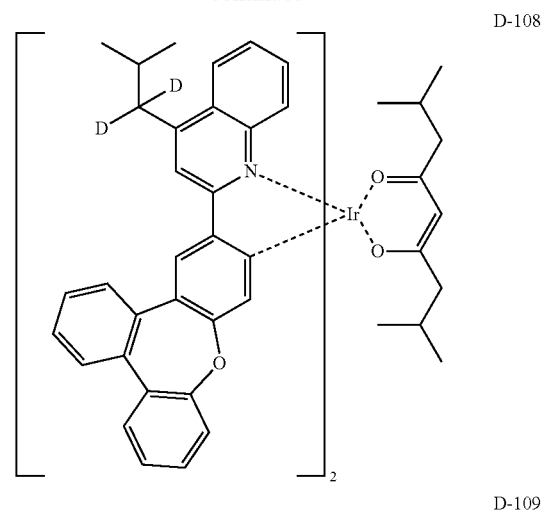
D-108
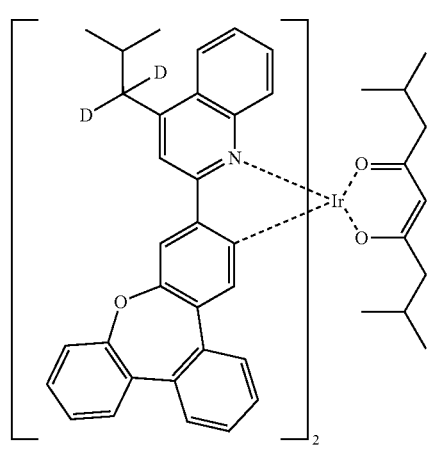
D-106
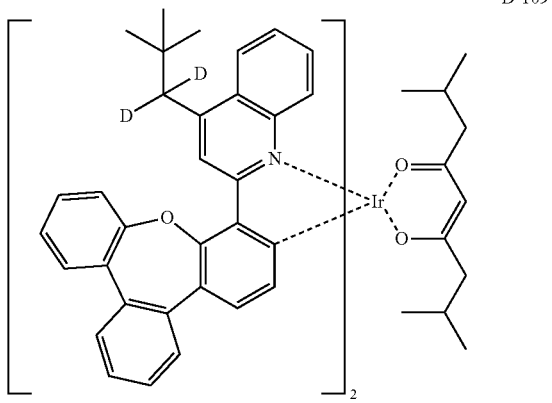
D-109
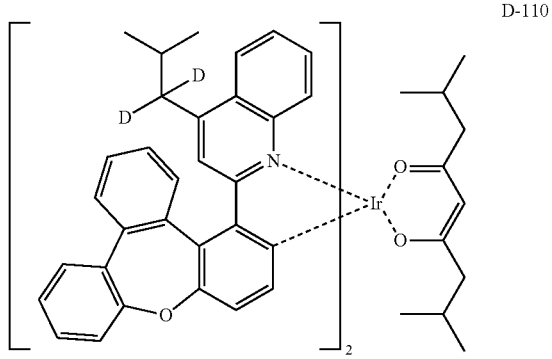
D-110
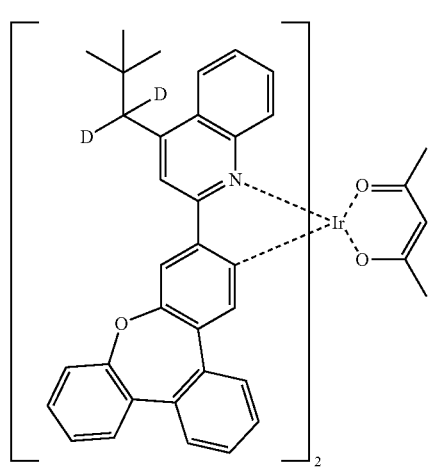
D-107
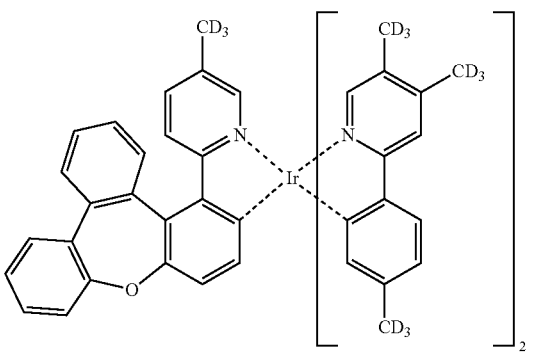
D-111

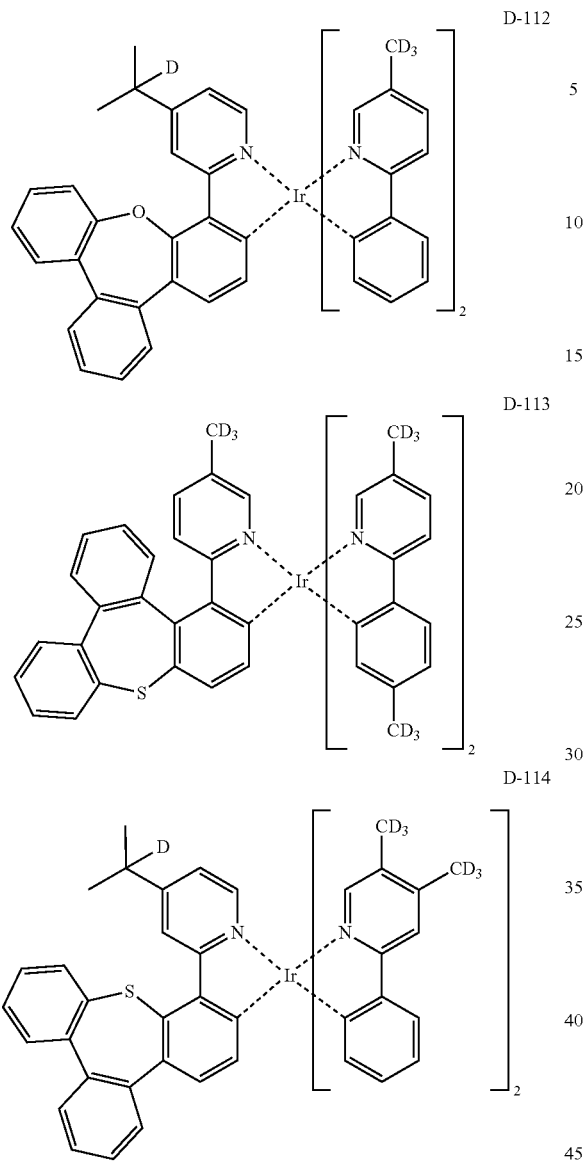
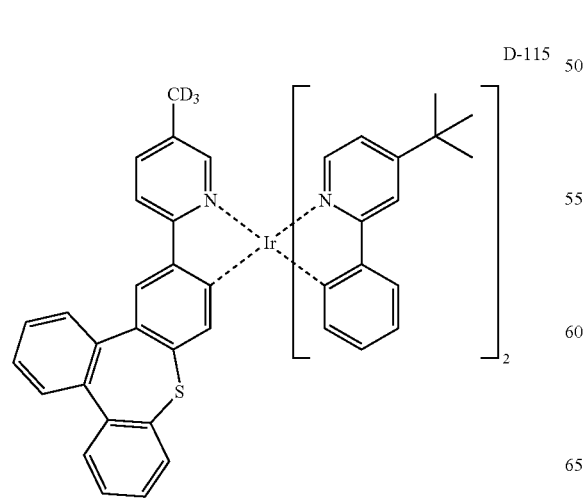
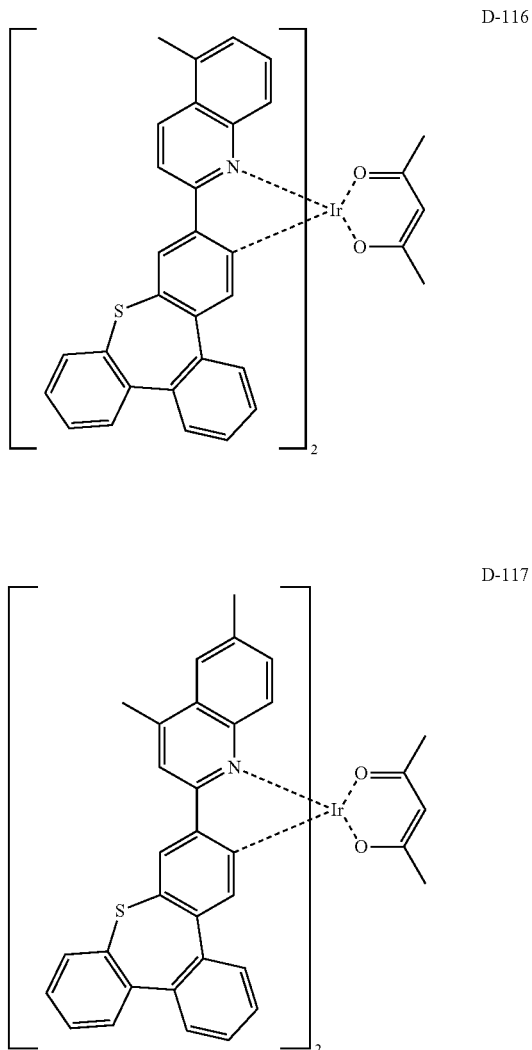
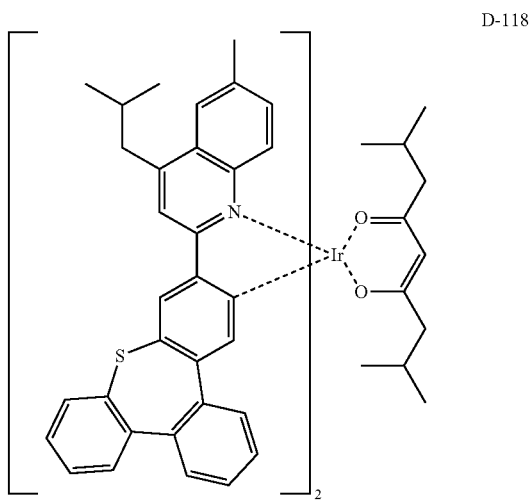

D-119
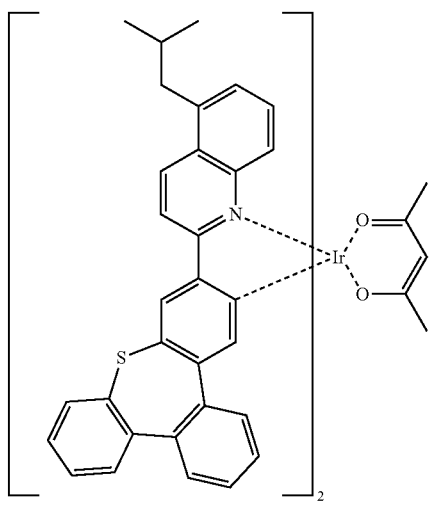
D-120
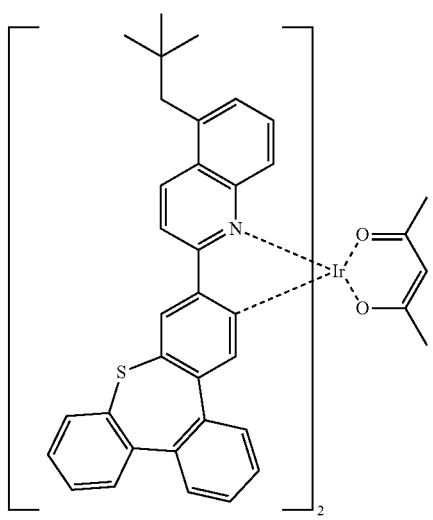
D-121
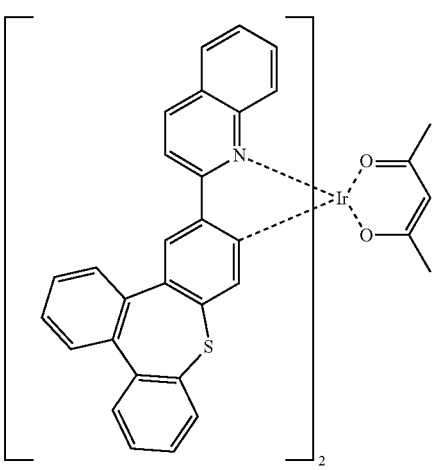
D-122
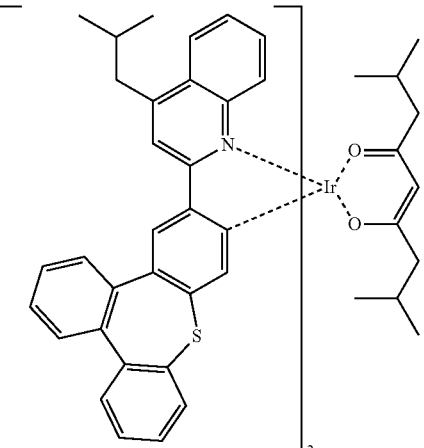
D-123
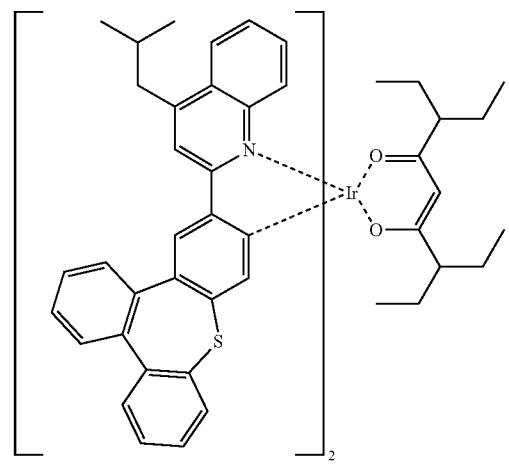
D-124
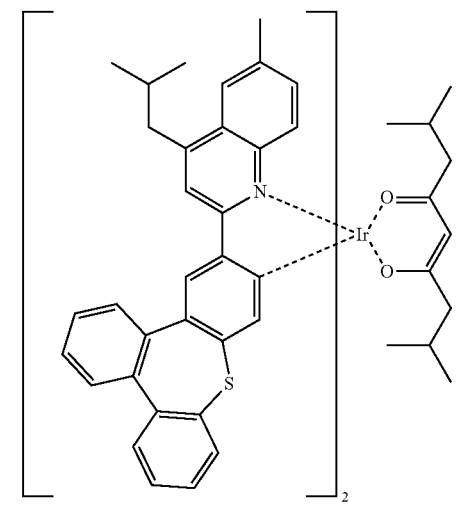

D-125
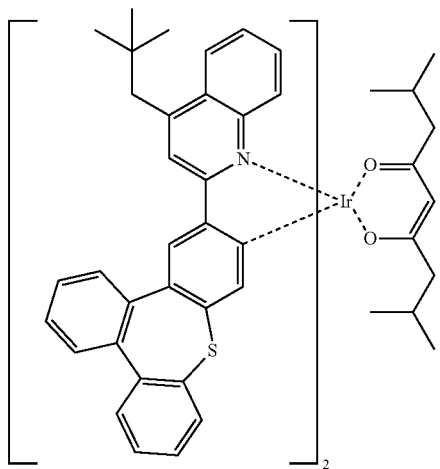
D-126
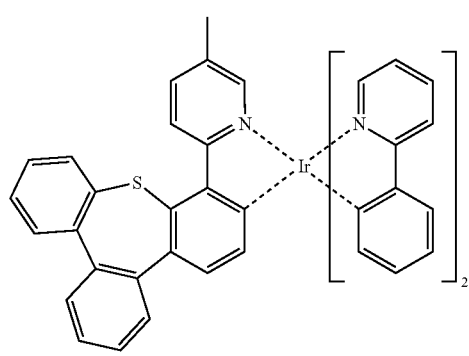
D-127
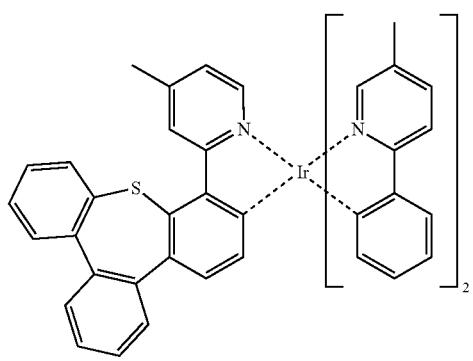
D-128
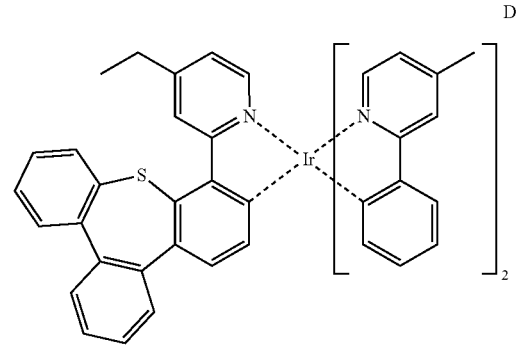
D-129
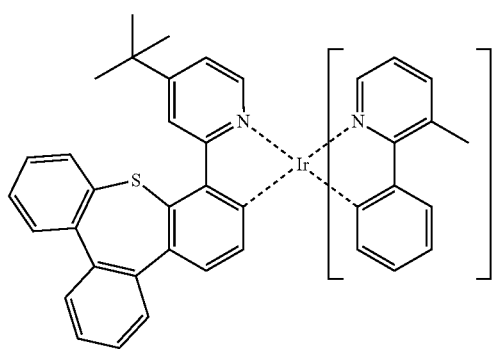
D-130
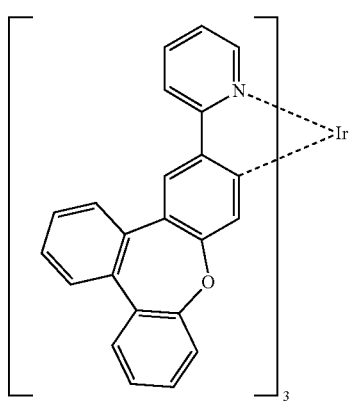
D-131
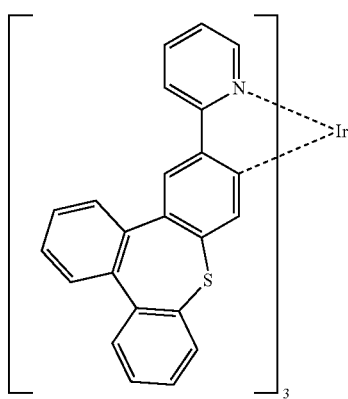
D-132
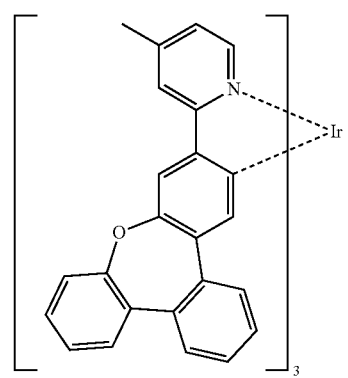

D-133

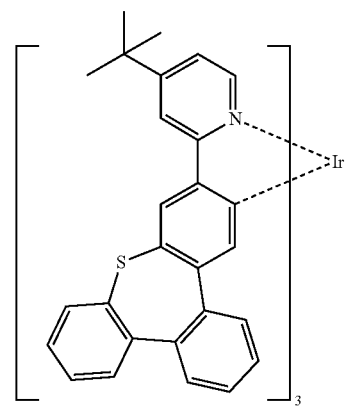

D-134

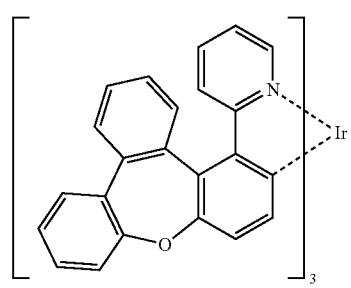

D-135

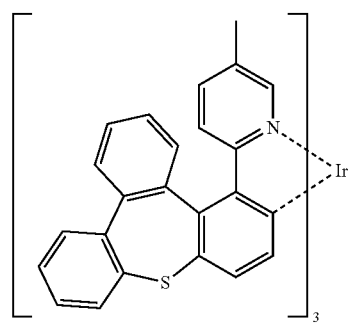

D-136

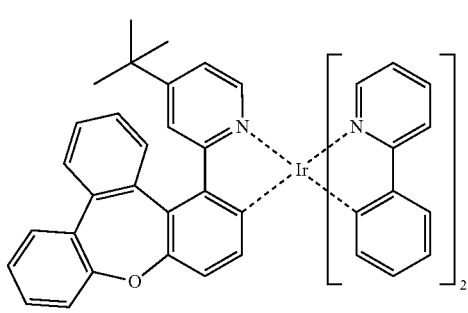

D-137

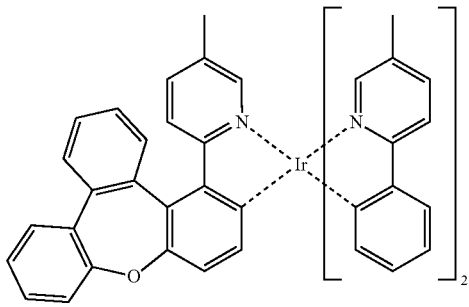

D-138

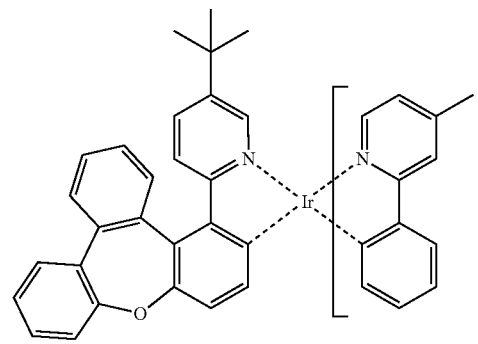

D-139

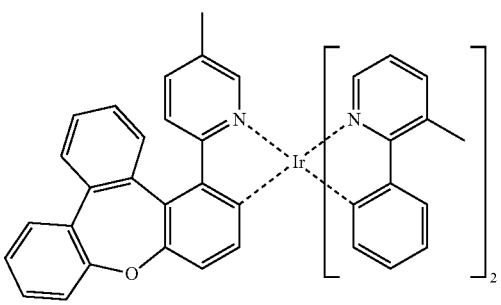

and

D-140

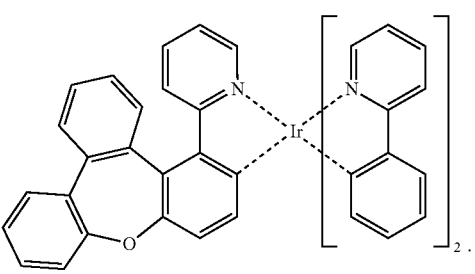

7. An organic electroluminescent material comprising the organic electroluminescent compound according to claim 1.

8. An organic electroluminescent device comprising the organic electroluminescent compound according to claim 1.

9. The organic electroluminescent device according to claim 8, wherein the organic electroluminescent compound is comprised as a dopant.

* * * * *